United States Patent
Yang et al.

(10) Patent No.: US 12,310,218 B2
(45) Date of Patent: May 20, 2025

(54) FLEXIBLE DISPLAY DEVICE

(71) Applicant: Samsung Display Co., Ltd., Yongin-si (KR)

(72) Inventors: Taehoon Yang, Yongin-si (KR); Yongsu Lee, Seoul (KR); Sungchul Kim, Seongnam-si (KR); Sunghoon Kim, Seoul (KR); Sungsik Yun, Suwon-si (KR); Kyoungah Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/381,160

(22) Filed: Oct. 17, 2023

(65) Prior Publication Data

US 2024/0049556 A1 Feb. 8, 2024

Related U.S. Application Data

(60) Continuation of application No. 17/676,730, filed on Feb. 21, 2022, now Pat. No. 11,832,497, which is a
(Continued)

(30) Foreign Application Priority Data

Mar. 25, 2016 (KR) .................. 10-2016-0036369

(51) Int. Cl.
*H10K 59/40* (2023.01)
*G06F 1/16* (2006.01)
(Continued)

(52) U.S. Cl.
CPC ........... *H10K 59/40* (2023.02); *G06F 1/1652* (2013.01); *G06F 3/0412* (2013.01);
(Continued)

(58) Field of Classification Search
CPC ...... H10K 59/40; H10K 50/86; H10K 50/865; H10K 59/126; H10K 59/38; H10K 77/111;
(Continued)

(56) References Cited

U.S. PATENT DOCUMENTS 8,698,179 B2   4/2014  Cho et al.
9,029,846 B2   5/2015  Song et al.
(Continued)

FOREIGN PATENT DOCUMENTS

CN   104779266    7/2015
EP   3 109 742    12/2016
(Continued)

OTHER PUBLICATIONS

Notice of Allowance dated Aug. 7, 2019, in U.S. Appl. No. 15/285,270.
(Continued)

*Primary Examiner* — Kwin Xie
*Assistant Examiner* — Sosina Abebe
(74) *Attorney, Agent, or Firm* — CANTOR COLBURN LLP

(57) ABSTRACT

A flexible display device including a display panel layer, a touch sensing layer, a reflection prevention layer, and a window layer. The touch sensing layer is disposed directly on a first display panel surface, a second display panel surface facing the first display panel surface in a thickness direction, or a second base surface of the reflection prevention layer. The reflection prevention layer is disposed directly on the second display panel surface or a first base surface of the touch sensing layer. The window layer is disposed directly on the first base surface or the second base surface.

25 Claims, 52 Drawing Sheets

Related U.S. Application Data continuation of application No. 16/698,634, filed on Nov. 27, 2019, now Pat. No. 11,257,875, which is a division of application No. 15/285,270, filed on Oct. 4, 2016, now Pat. No. 10,504,971.

(51) Int. Cl.

| | | |
|---|---|---|
| *G06F 3/041* | (2006.01) | |
| *G06F 3/044* | (2006.01) | |
| *H10K 50/86* | (2023.01) | |
| *H10K 59/126* | (2023.01) | |
| *H10K 59/38* | (2023.01) | |
| *H10K 77/10* | (2023.01) | |
| *H10K 59/12* | (2023.01) | |
| *H10K 102/00* | (2023.01) | |

(52) U.S. Cl.
CPC .......... *G06F 3/0445* (2019.05); *G06F 3/0446* (2019.05); *H10K 50/86* (2023.02); *H10K 50/865* (2023.02); *H10K 59/126* (2023.02); *H10K 59/38* (2023.02); *H10K 77/111* (2023.02); *G06F 2203/04102* (2013.01); *G06F 2203/04103* (2013.01); *G06F 2203/04112* (2013.01); *H10K 59/1201* (2023.02); *H10K 2102/311* (2023.02); *H10K 2102/351* (2023.02)

(58) Field of Classification Search
CPC ......... H10K 59/1201; H10K 2102/311; H10K 2102/351; H10K 59/8731; H10K 59/8792; H10K 59/12; H10K 59/873; H10K 59/87; G06F 1/1652; G06F 3/0412; G06F 3/0445; G06F 3/0446; G06F 2203/04102; G06F 2203/04103; G06F 2203/04112; G06F 2203/04111; Y02E 10/549; Y02P 70/50; G09G 3/035; G09G 3/3208

See application file for complete search history.

(56) References Cited

U.S. PATENT DOCUMENTS

| | | |
|---|---|---|
| 9,066,380 B2 | 6/2015 | Cho et al. |
| 9,189,027 B2 | 11/2015 | Lee et al. |
| 9,287,329 B1 | 3/2016 | Lee et al. |
| 9,293,731 B2 | 3/2016 | Kim et al. |
| 10,466,819 B2 | 11/2019 | Nam et al. |
| 2005/0093437 A1 | 5/2005 | Ouyang |
| 2008/0278070 A1 | 11/2008 | Kim |
| 2010/0123672 A1 | 5/2010 | Kim |
| 2010/0148157 A1* | 6/2010 | Song ................ H10K 59/871 257/E33.059 |
| 2012/0188151 A1* | 7/2012 | Oh ........................ G02F 1/1337 345/87 |
| 2012/0319151 A1 | 12/2012 | Cho et al. |
| 2013/0113734 A1 | 5/2013 | Cho et al. |
| 2013/0241855 A1 | 9/2013 | Kim |
| 2013/0285981 A1 | 10/2013 | Xu et al. |
| 2014/0078104 A1 | 3/2014 | Lee et al. |
| 2014/0183478 A1 | 7/2014 | Lee et al. |
| 2014/0198267 A1 | 7/2014 | Jeong et al. |
| 2014/0361264 A1* | 12/2014 | Choi ................... H10K 50/858 257/40 |
| 2014/0374704 A1 | 12/2014 | Jang et al. |
| 2015/0049428 A1 | 2/2015 | Lee et al. |
| 2015/0069338 A1 | 3/2015 | Cho et al. |
| 2015/0179722 A1 | 6/2015 | Koo et al. |
| 2015/0185942 A1 | 7/2015 | Kim et al. |
| 2015/0200375 A1 | 7/2015 | Kim et al. |
| 2015/0206926 A1 | 7/2015 | Hong et al. |
| 2015/0325815 A1 | 11/2015 | Kang et al. |
| 2016/0079567 A1 | 3/2016 | Cho et al. |
| 2016/0098140 A1* | 4/2016 | Lee ....................... G06F 3/0443 345/173 |
| 2017/0060309 A1 | 3/2017 | Chen et al. |

FOREIGN PATENT DOCUMENTS

| | | |
|---|---|---|
| KR | 10-2012-0139988 | 12/2012 |
| KR | 10-2014-0093092 | 7/2014 |
| KR | 20140085306 A | 7/2014 |
| KR | 20140135493 A | 11/2014 |
| KR | 10-2014-0143863 | 12/2014 |
| KR | 10-2014-0145463 | 12/2014 |
| KR | 10-2015-0021167 | 3/2015 |
| KR | 10-2015-0053530 | 5/2015 |
| KR | 10-2015-0072214 | 6/2015 |
| KR | 10-2015-0087940 | 7/2015 |
| KR | 20150086763 A | 7/2015 |
| KR | 20150144913 A | 12/2015 |
| TW | 201448314 | 12/2014 |

OTHER PUBLICATIONS

Final Office Action dated Apr. 1, 2019, in U.S. Appl. No. 15/285,270.
Non-Final Office Action dated Jul. 19, 2018, in U.S. Appl. No. 15/285,270.
Non-Final Office Action dated Aug. 3, 2020, in U.S. Appl. No. 16/698,634.
Final Office Action dated Mar. 1, 2021, in U.S. Appl. No. 16/698,634.
Notice of Allowance dated Oct. 13, 2021, in U.S. Appl. No. 16/698,634.
Non-Final Office Action dated Apr. 13, 2023, in U.S. Appl. No. 17/676,730.
Notice of Allowance dated Jul. 27, 2023, in U.S. Appl. No. 17/676,730.

* cited by examiner

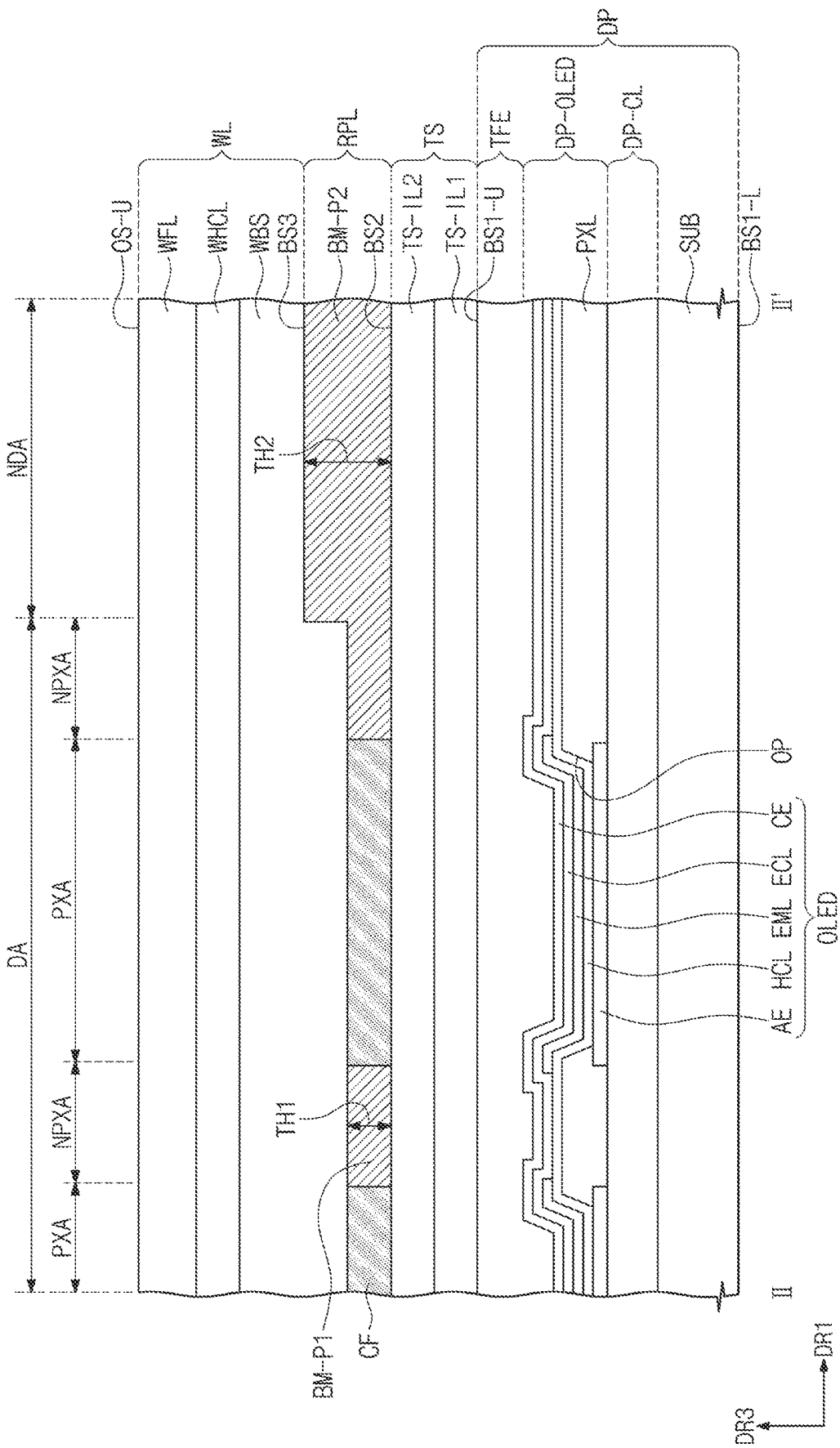

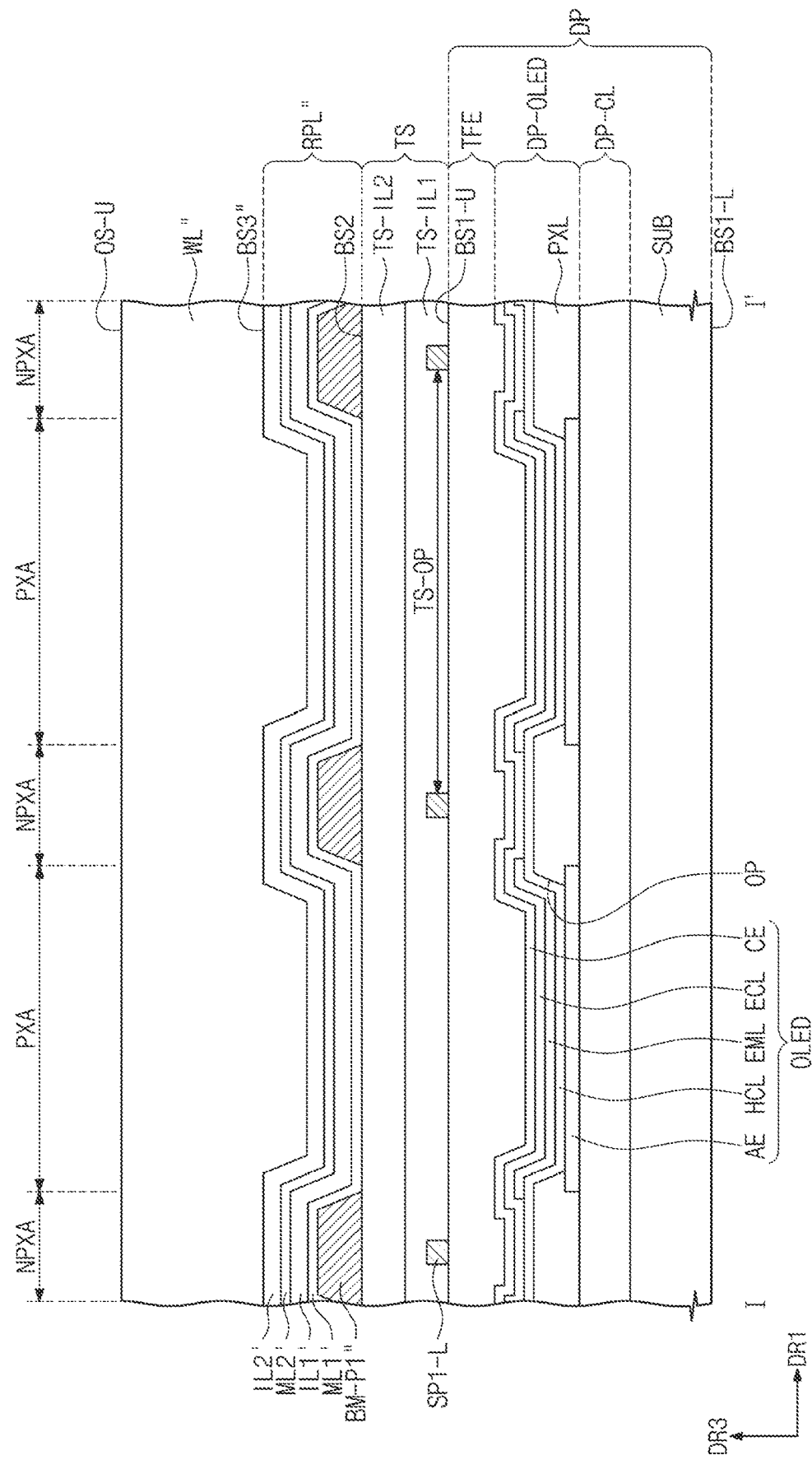

FLEXIBLE DISPLAY DEVICE

CROSS-REFERENCE TO RELATED APPLICATIONS

This application is a Continuation of U.S. patent application Ser. No. 17/676,730, filed Feb. 21, 2022, which is a Continuation of U.S. patent application Ser. No. 16/698,634, filed Nov. 27, 2019, which issued as U.S. Pat. No. 11,257,875, which is a Division of U.S. patent application Ser. No. 15/285,270, filed Oct. 4, 2016, which issued as U.S. Pat. No. 10,504,971, and claims priority to and the benefit of Korean Patent Application No. 10-2016-0036369, filed Mar. 25, 2016, each of which is hereby incorporated by reference for all purposes as if fully set forth herein.

BACKGROUND

Field

Exemplary embodiments relate to a flexible display device, and, more particularly, to a flexible display device including integrated functional members.

Discussion of the Background

Electronic devices, such as smartphones, digital cameras, laptop computers, tablets, navigational aids, televisions, and the like, may permit users to intentionally deform the device in various manners and shapes. In this manner, a display device (e.g., a flat panel display device) of an electronic device may also be deformed in correspondence with the deformation of the electronic device. As such, flexible display devices, such as curved display devices, bent display devices, rolled display devices, and the like, are of interest.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a flexible display device having improved flexibility.

Additional aspects will be set forth in the detailed description which follows, and, in part, will be apparent from the disclosure, or may be learned by practice of the inventive concept.

According to one or more exemplary embodiments, a flexible display device includes a display panel layer, a touch sensing layer, a reflection prevention layer, and a window layer. The display panel layer includes a display area and a non-display area. The display area includes a plurality of light emitting areas and a non-light emitting area adjacent to the plurality of light emitting areas. The non-display area is disposed adjacent to the display area. The display panel layer forms a first display panel surface and a second display panel surface facing the first display panel surface in a thickness direction. The touch sensing layer forms a first base surface. The reflection prevention layer forms a second base surface. The window layer forms an outer surface. The touch sensing layer is disposed directly on one of the first display panel surface, the second display panel surface, and the second base surface. The reflection prevention layer is disposed directly on the second display panel surface or the first base surface. The window layer is disposed directly on the first base surface or the second base surface.

According to one or more exemplary embodiments, a flexible display device includes a display panel layer, a touch sensing layer, and a window layer. The display panel layer includes a display area and a non-display area. The display area includes a plurality of light emitting areas and a non-light emitting area adjacent to the plurality of light emitting areas. The non-display area is disposed adjacent to the display area. The display panel layer forms a first display panel surface and a second display panel surface facing the first display panel surface in a thickness direction. The touch sensing layer forms a first base surface. The window layer forms an outer surface. The touch sensing layer is disposed directly on the second display panel surface. The window layer is disposed directly on the first base surface. The touch sensing layer includes: a plurality of first conductive patterns overlapping with the non-light emitting area, the plurality of first conductive patterns being disposed directly on the second display panel surface; a plurality of second conductive patterns overlapping with the non-light emitting area; and a touch insulation layer configured to insulate the first conductive patterns from the second conductive patterns. The touch insulation layer includes: a black matrix overlapping with the non-light emitting area and the non-display area, and a plurality of color filters respectively overlapping with the plurality of light emitting areas.

According to one or more exemplary embodiments, a flexible display device includes a display panel layer, a touch sensing layer, and a window layer. The display panel layer includes a display area and a non-display area. The display area includes a plurality of light emitting areas and a non-light emitting area adjacent to the plurality of light emitting areas. The non-display area is adjacent to the display area, the display panel layer forming a first display panel surface and a second display panel surface facing the first display panel surface in a thickness direction. The touch sensing layer forms a first base surface. The window layer forms an outer surface. The touch sensing layer is disposed directly on the second display panel surface. The window layer is disposed directly on the first base surface. The display panel layer further includes: a first metal layer; a transparent conductive layer disposed directly on the first metal layer; and a second metal layer disposed directly on the transparent conductive layer.

According to one or more exemplary embodiments, a flexible display device includes a display panel layer, a touch sensing layer, a black matrix, and a window layer. The display panel layer includes a display area and a non-display area. The display area includes a plurality of light emitting areas and a non-light emitting area adjacent to the plurality of light emitting areas. The non-display area is adjacent to the display area, the display panel layer forming a first display panel surface and a second display panel surface facing the first display panel surface in a thickness direction. The touch sensing layer forms a first base surface. The black matrix overlaps with the non-light emitting area and the non-display area. The window layer forms an outer surface. The touch sensing layer is disposed directly on one of the first display panel surface and the second display panel surface. The black matrix is disposed directly on the second display panel surface or the first base surface. The window layer is disposed directly on and covers the black matrix.

According to one or more exemplary embodiments, a method of manufacturing a flexible display device includes: forming a display panel layer configured to display an image; forming a touch sensing layer directly contacting the display panel layer, the touch sensing layer being configured to sense touch interactions associated with the image; forming a reflection prevention layer directly contacting the display panel layer or the touch sensing layer, the reflection prevention layer being configured to reduce external light reflection from the display panel layer; and forming a window layer directly contacting the reflection prevention layer.

According to one or more exemplary embodiments, a method of manufacturing a flexible display device includes: forming one or more first layers configured to generate an image on a first outermost layer of the one or more first layers; and forming one or more second layers configured to reduce external light reflection off the one or more first layers. The one or more second layers include: a second outermost layer directly contacting the first outermost layer; and a third outermost layer opposing the second outermost layer. The method further includes forming one or more third layers configured to sense touch interactions in association with the image. The one or more third layers include: a fourth outermost layer directly contacting the third outermost layer; and a fifth outermost layer opposing the fourth outermost layer. The method further includes forming one or more fourth layers configured to at least protect the one or more first layers, the one or more fourth layers comprising a sixth outermost layer directly contacting the fifth outermost layer.

According to one or more exemplary embodiments, a method of manufacturing a flexible display device includes forming a display panel layer configured to generate an image in a display area. The display area includes: a plurality of light emitting areas; and a plurality of non-light emitting areas. The method further includes forming, directly on the display panel layer, a touch sensing layer configured to: sense touch interactions associated with the image; and reduce a reflective index of external light. The method further includes forming, directly on the touch sensing layer, a window layer. The touch sensing layer includes: a plurality of conductive patterns configured to sense the touch interactions, the plurality of conductive patterns being formed directly on the display panel layer and overlapping with the plurality of non-light emitting areas; a touch insulation layer covering the plurality of first conductive patterns, the touch insulation layer including a plurality of openings overlapping with the plurality of light emitting areas; and a plurality of color filters formed directly on the display panel layer in the plurality of openings, the plurality of color filters being configured to reduce the reflective index of the external light.

According to one or more exemplary embodiments, a method of manufacturing a flexible display device includes forming a display panel layer including: an encapsulation layer; a light emitting layer configured to emit light onto a surface of the encapsulation layer; and electrodes configured to drive the light emitting layer. The method further includes: forming a touch sensing layer directly on the surface of the encapsulation layer; and forming a window layer directly on a surface of the touch sensing layer. At least one of the electrodes includes: a first metal layer; a transparent conductive layer disposed directly on the first metal layer; and a second metal layer disposed directly on the transparent conductive layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 17A, 17B, 17C, 17D, and 17E are cross-sectional views of display devices, according to one or more exemplary embodiments.

FIGS. 18A, 18B, 18C, and 18D are cross-sectional views of display devices, according to one or more exemplary embodiments.

DETAILED DESCRIPTION OF THE ILLUSTRATED EMBODIMENTS

Figure 1A:
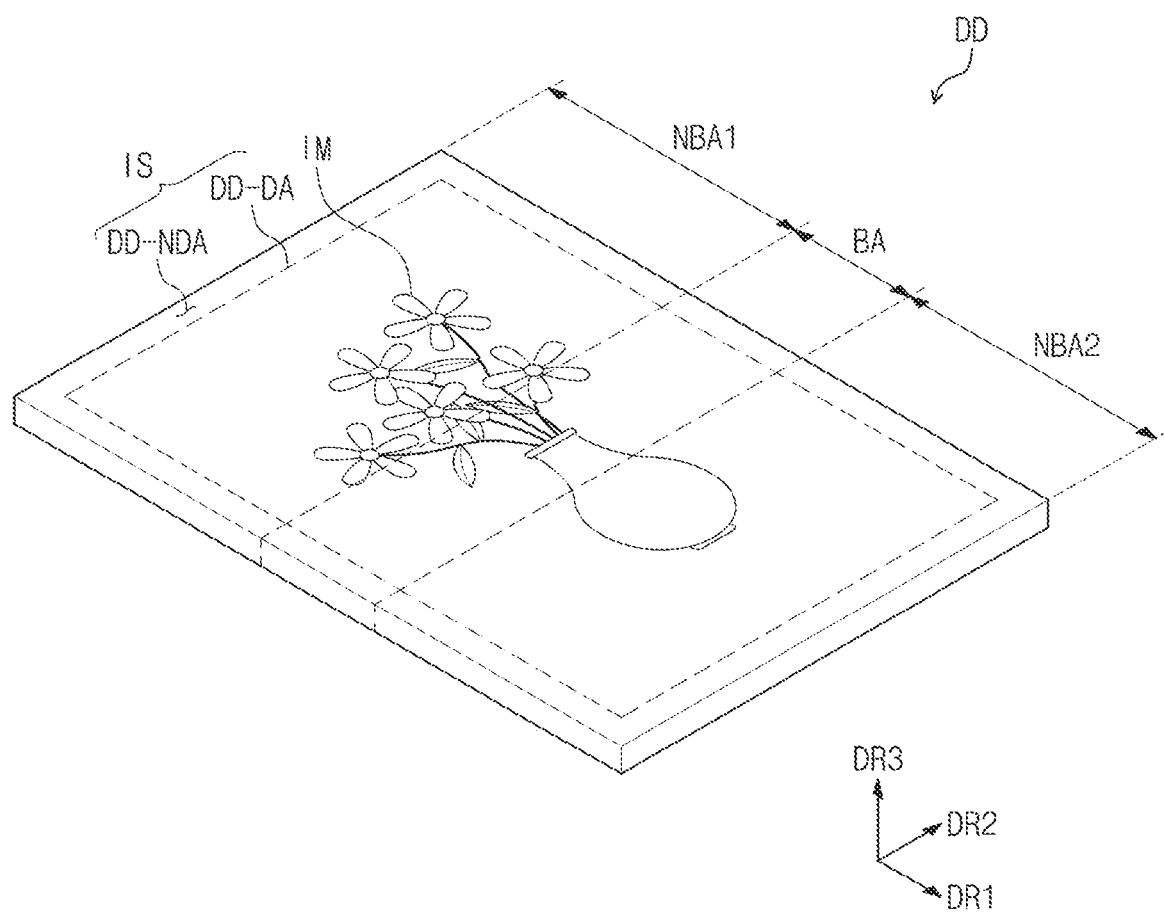
FIG. 1A is a perspective view of illustrating a first operational state of a flexible display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
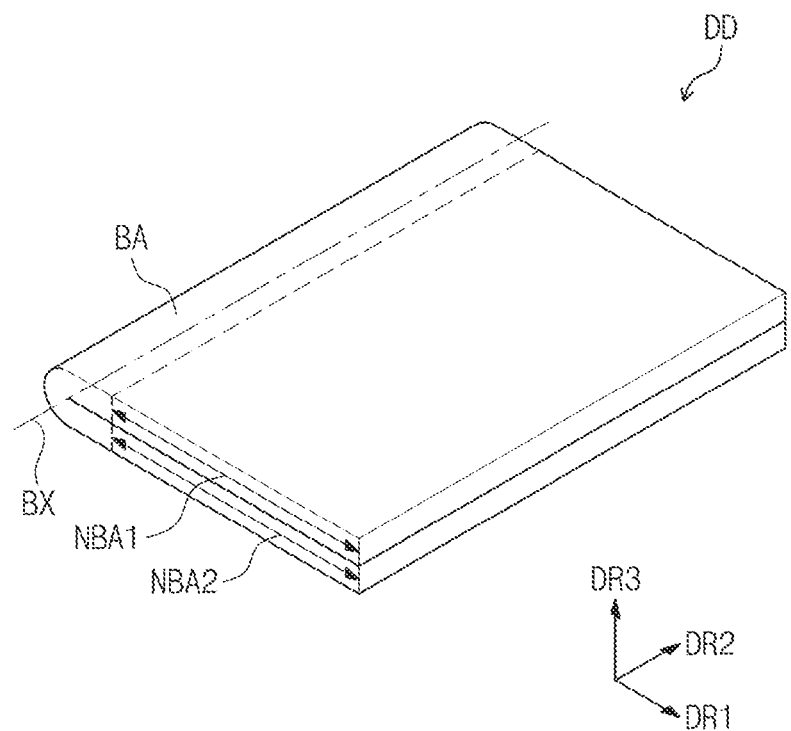
FIG. 1B is a perspective view illustrating a second operational state of the flexible display device of FIG. 1A, according to one or more exemplary embodiments.
Figure 1C:
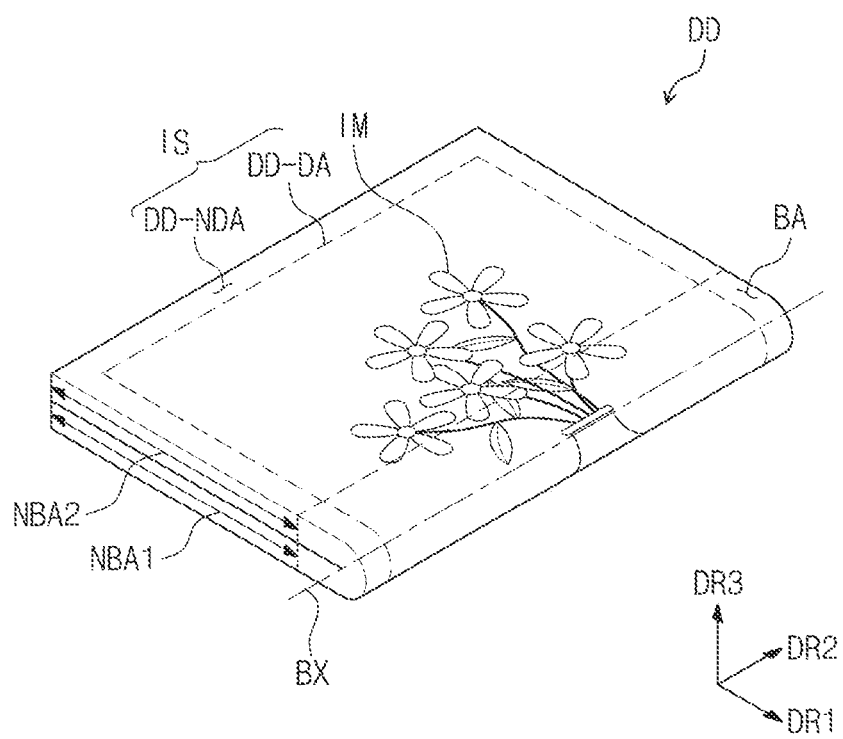
FIG. 1C is a perspective view illustrating a third operational state of the flexible display device of FIG. 1A, according to one or more exemplary embodiments.
Figure 2A:
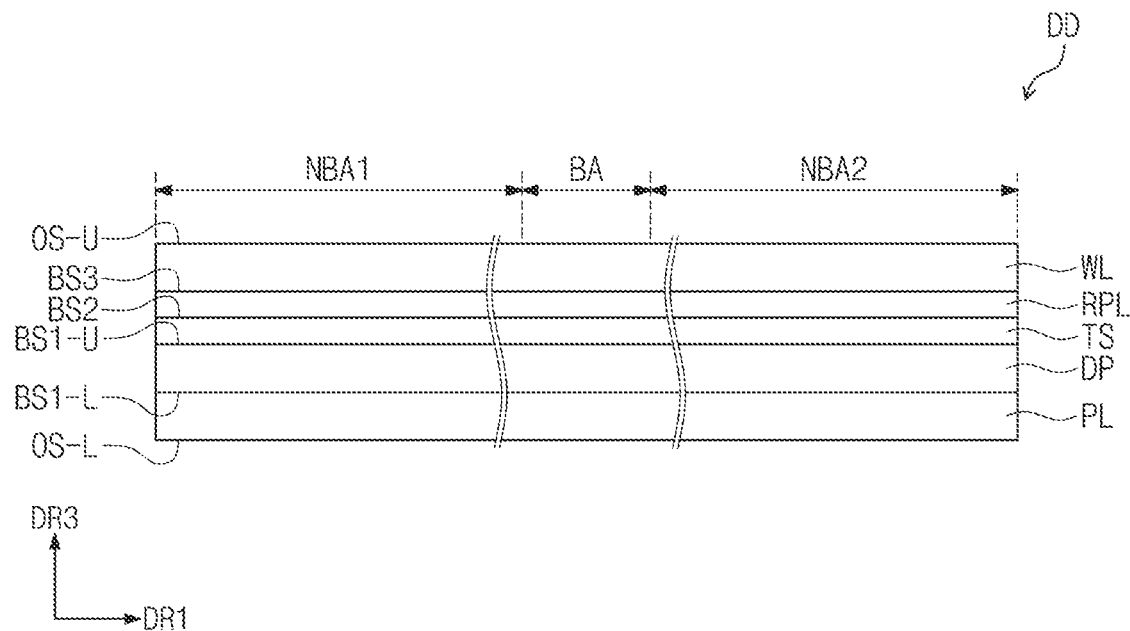
FIG. 2A is a cross-sectional view of the flexible display device of FIG. 1A in the first operational state, according to one or more exemplary embodiments.
Figure 2B:
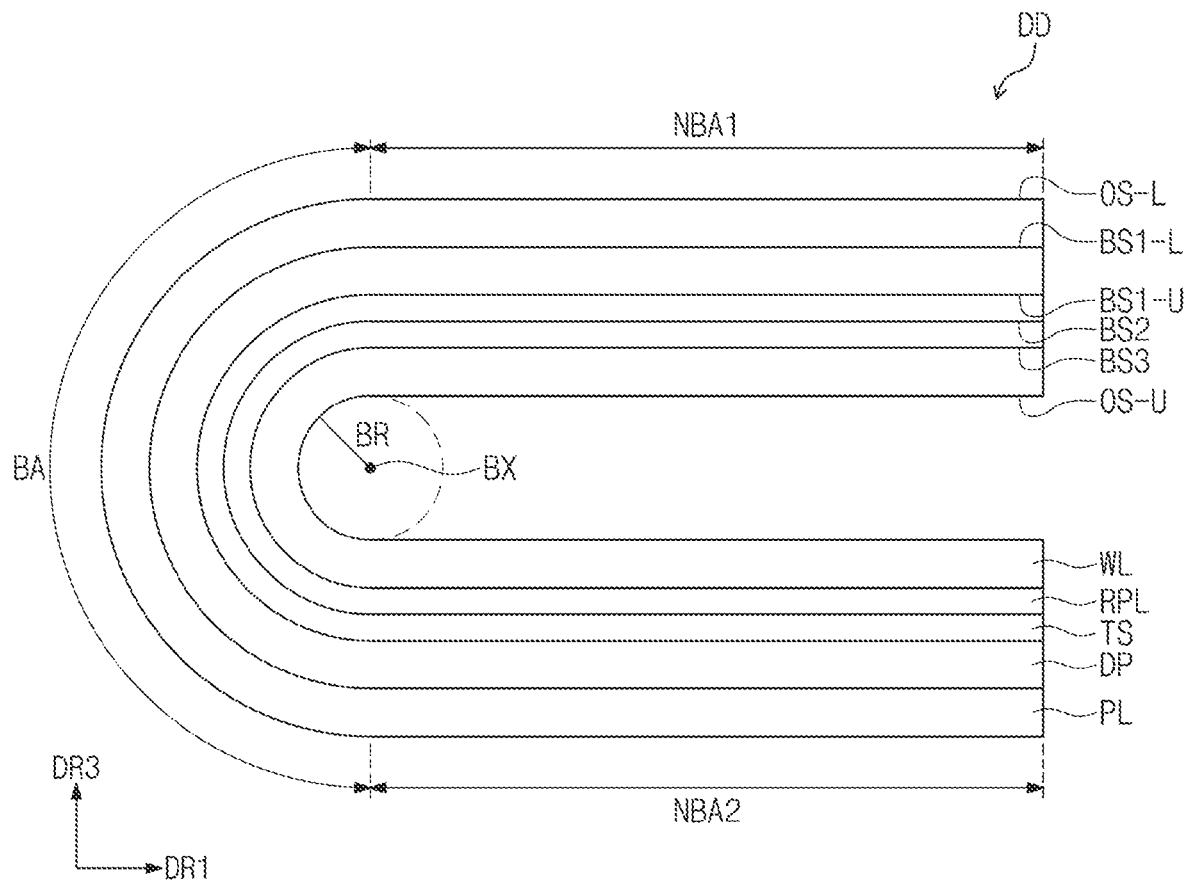
FIG. 2B is a cross-sectional view of the flexible display device of FIG. 1B in the second operational state, according to one or more exemplary embodiments.
Figure 2C:
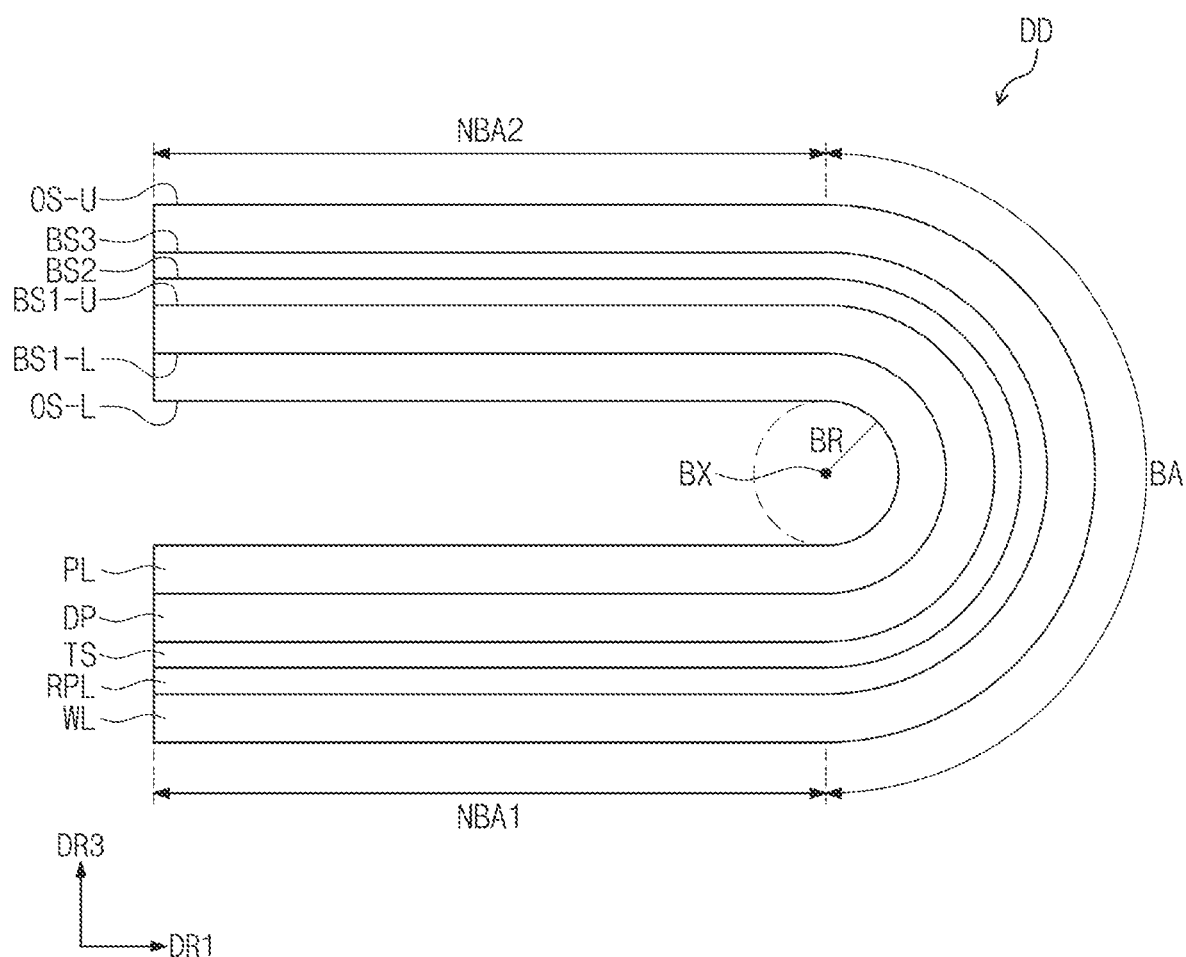
FIG. 2C is a cross-sectional view of the flexible display device of FIG. 1C in the third operational state, according to one or more exemplary embodiments.

FIGS. 1A, 1B, and 1C are perspective views respectively illustrating first, second, and third operational states of a flexible display device DD, according to one or more exemplary embodiments. FIGS. 2A, 2B, and 2C are cross-sectional views respectively illustrating the first, second, and third operational states of the flexible display device DD, according to one or more exemplary embodiments.

A display surface IS on which an image IM is displayed is parallel to a surface defined by a first directional axis DR1 and a second directional axis DR2. A normal direction of the display surface IS, i.e., a thickness direction of the flexible display device DD, is indicated as a third directional axis DR3. A front surface (or a top surface) and a rear surface (or a bottom surface) of each of the members (or components) of the flexible display device DD are distinguished from one another in the third directional axis DR3. Directions indicated in association with the first to third directional axes DR1, DR2, and DR3 are merely relative, and, as such, may be changed to different directions with respect to each other. Hereinafter, the first to third directions may be expressed by the same reference symbols as the directions indicated in association with the first to third directional axis DR1, DR2, and DR3, respectively.

A foldable display device is illustrated as an example of the flexible display device DD of FIGS. 1A to 1C and 2A to 2C. It is contemplated, however, that exemplary embodiments are not limited thereto or thereby. For instance, the flexible display device DD may be provided as a rollable display device that may be wound. It is noted that the flexible display device DD may be used for large-scale electronic apparatuses, such as televisions, monitors, etc., and middle and small-scale electrode apparatuses, such as mobile phones, tablets, notebooks, personal computers, navigation units for vehicles, game consoles, smart watches, etc.

As illustrated in FIG. 1A, the display surface IS of the flexible display device DD may be divided into a plurality of areas. The flexible display device DD may include a display area DD-DA on which the image IM is displayed (or perceived), and a non-display area DD-NDA that is disposed adjacent to (or outside of) the display area DD-DA. The non-display area DD-NDA may be an area on which the image IM is not displayed. A flower vase is illustrated as an example of the image IM in FIG. 1A. For example, the display area DD-DA may have a rectangular shape, and the non-display area DD-NDA may surround the display area DD-DA. It is contemplated, however, that exemplary embodiments are not limited thereto or thereby. For example, the shape of the display area DD-DA and the shape of the non-display area DD-NDA may be relatively designed with respect to each other. To this end, the respective shapes of the display area DD-DA and the non-display area DD-NDA may be the same as one another or different from one another.

As seen in FIGS. 1A to 1C, the flexible display device DD may include a bending area BA that is bendable with respect to a bending axis BX, and first and second non-bending areas NBA1 and NBA2 that are not bendable. As illustrated in FIG. 1B, the flexible display device DD may be bent inward so that the display surface IS of the first non-bending area NDA1 and the display surface IS of the second non-bending area NBA2 face each other. As illustrated in FIG. 1C, the flexible display device DD may be bent outward to expose the display surface IS to the outside.

According to one or more exemplary embodiments, the flexible display device DD may include a plurality of bending areas BA. In addition, the bending areas BA may be defined to correspond to a configuration of the flexible display device DD that is manipulated by a user, e.g., the bending areas may be dynamically configured by the user. For example, the bending area BA may be defined in parallel to the first directional axis DR1 or defined in a diagonal direction, unlike as shown in FIGS. 1B and 1C. In one or more exemplary embodiments, the flexible display device DD may be configured to only repeat the operational modes of FIGS. 1A to 1C.

As illustrated in FIGS. 2A to 2C, the flexible display device DD includes an external protection member PL, a display panel member DP, a touch detection member TS, a reflection prevention member RPL, and a window member WL. The external protection member PL, the display panel member DP, the touch detection member TS, the reflection prevention member RPL, and the window member WL may be integrally formed through a continuous process to form an external protection layer PL, a display panel layer DP, a touch sensing layer TS, a reflection prevention layer RPL, and a window layer WL of the flexible display device DD. Hereinafter, the external protection member PL, the display panel member DP, the touch detection member TS, the reflection prevention member RPL, and the window member WL of the flexible display device DD may be referred to as the external protection layer PL, the display panel layer DP, the touch sensing layer TS, the reflection prevention layer RPL, and the window layer WL, respectively.

Although the flexible display device DD including the functional layers that are successively stacked from the external protection layer PL to the window layer WL is illustrated as an example exemplary embodiments are not limited thereto or thereby. For instance, the stacked order of the functional layers may be changed. In addition, portions of the functional layers may be omitted, or two functional layers may be replaced with one functional layer.

The display panel layer DP generates the image (see reference symbol IM of FIG. 1A) corresponding to input image data. The display panel layer DP provides a first display panel surface BS1-L (or a base bottom surface) and a second display panel surface BS1-U (or a base top surface), which face each other in the thickness direction DR3. The display panel layer DP may be an organic light emitting display panel, an electrophoretic display panel, or an electrowetting display panel. It is contemplated, however, that exemplary embodiments are not limited to a kind (or type) of display panel, and, as such, any suitable display panel may be utilized in association with exemplary embodiments described herein. For descriptive and illustrative convenience, exemplary embodiments will be described in association with an organic light emitting display panel embodiment. The organic light emitting display panel will be described later in more detail.

The external protection layer PL is disposed on (e.g., directly on) the first display panel surface BS1-L to protect the display panel layer DP. The external protection layer PL provides a first outer surface OS-L of the flexible display device DD. The external protection layer PL prevents external moisture, oxygen, debris, etc., from permeating into the display panel layer DP. The external protection layer PL may also function to absorb external impacts. The external protection layer PL may be formed of a plastic resin. The external protection layer PL may be formed of a material selected from the group consisting of polyethersulphone (PES), polyacrylate (PAR), polyetherimide (PEI), polyethylene naphthalate (PEN), polyethylene terepthalate (PET), polyphenylene sulfide (PPS), polyallylate, polyimide (PI), polycarbonate (PC), poly(arylene ether sulfone), and a combination thereof.

According to one or more exemplary embodiments, the material forming the external protection layer PL is not limited to plastic resins. For example, the external protection layer PL may be formed of an organic/inorganic composite material. The external protection layer PL may include a porous organic layer and an inorganic material filled into pores of the organic layer. It is also noted that the external protection layer PL may be formed on the first display panel surface BS1-L in a coating or printing manner. For instance, the external protection layer PL may be formed by using roll coating, silkscreen costing, spray coating, slit coating, and/or the like. The external protection layer PL may be omitted according to a configuration of the display panel layer DP.

The touch sensing layer TS acquires coordinate information of an external input, e.g., user input. The touch sensing layer TS may be disposed on (e.g., directly on) the second display panel surface BS1-U. The touch sensing layer TS provides a first base surface BS2 (or a touch base surface). It is contemplated that the touch sensing layer TS may be manufactured together with the display panel layer DP via a continuous process. For illustrative and descriptive convenience, the touch sensing layer TS will be described in association with a capacitive touch detection member embodiment. Exemplary embodiments, however, are not limited thereto or thereby. For example, the touch sensing layer TS may be replaced with another touch sensing layer including two types of touch electrodes, such as an electromagnetic induction touch detection member. A capacitive touch sensing layer will be described later in more detail.

The reflection prevention layer RPL may absorb light incident from the outside or destructively interfere with the light to reduce external light reflectance of the flexible display device DD. The reflection prevention layer RPL may be disposed on (e.g., directly on) the first base surface BS2. The reflection prevention layer RPL provides a second base surface BS3 (or a reflection prevention base surface). In one or more exemplary embodiments, the reflection prevention layer RPL may be manufactured together with the touch sensing layer TS via a continuous process. In this manner, the reflection prevention layer RPL may constitute a portion of the touch sensing layer TS or a portion of the display panel layer DP. The reflection prevention layer RPL will be described later in more detail.

The window layer WL may be disposed on (e.g., directly on) the second base surface BS3 to protect the display panel layer DP. The window layer WL provides a second outer surface OS-U of the flexible display device DD. The display surface IS of FIGS. 1A to 1C may be the second outer surface OS-U. In one or more exemplary embodiments, the window layer WL may be manufactured together with the reflection prevention layer RPL via a continuous process. The window layer WL will be described later in more detail.

Although not separately shown, the flexible display device DD may further include a frame structure supporting the functional layers to maintain the operational states illustrated in FIGS. 2A to 2C. The frame structure may include a joint structure or a hinge structure.

As illustrated in FIG. 2B, the flexible display device DD may be bent inward at a determined radius of curvature BR by, for instance, user manipulation. Alternatively, as illustrated in FIG. 2C, the flexible display device DD may be bent outward at a determined radius of curvature BR by, for example, user manipulation. It is also contemplated that the flexible display device DD may be bidirectionally bent according to user manipulation. The bidirectional bending may be repeatedly performed. The radius of curvature BR may be constantly maintained. The first non-bending area NBA1 and the second non-bending area NBA2 may face each other and may be extend parallel to one another. The bending area BA may not be fixed in surface area, but be determined according to the radius of curvature BR. The user may perceive an image from the flexible display device DD in the non-bent state of FIG. 2A.

The touch sensing layer TS, the reflection prevention layer RPL, the window layer WL, and the external protection layer PL may be integrated with the display panel DP through a continuous process, and, as such, separate adhesion members conventionally formed between one or more of the touch sensing layer TS, the reflection prevention layer RPL, the window layer WL, the external protection layer PL, and the display panel layer DP may be omitted. Since the various adhesion members may be omitted, the flexible display device DD may be reduced in thickness and improved in flexibility. The flexible display device DD may have the total thickness less than about 100 micrometers. An adhesion member, such as an optically clear adhesive (OCA), may have a thickness greater than about 20 micrometers. By omitting one or more adhesion members the thickness of the flexible display device DD may be reduced.

Figure 3A:
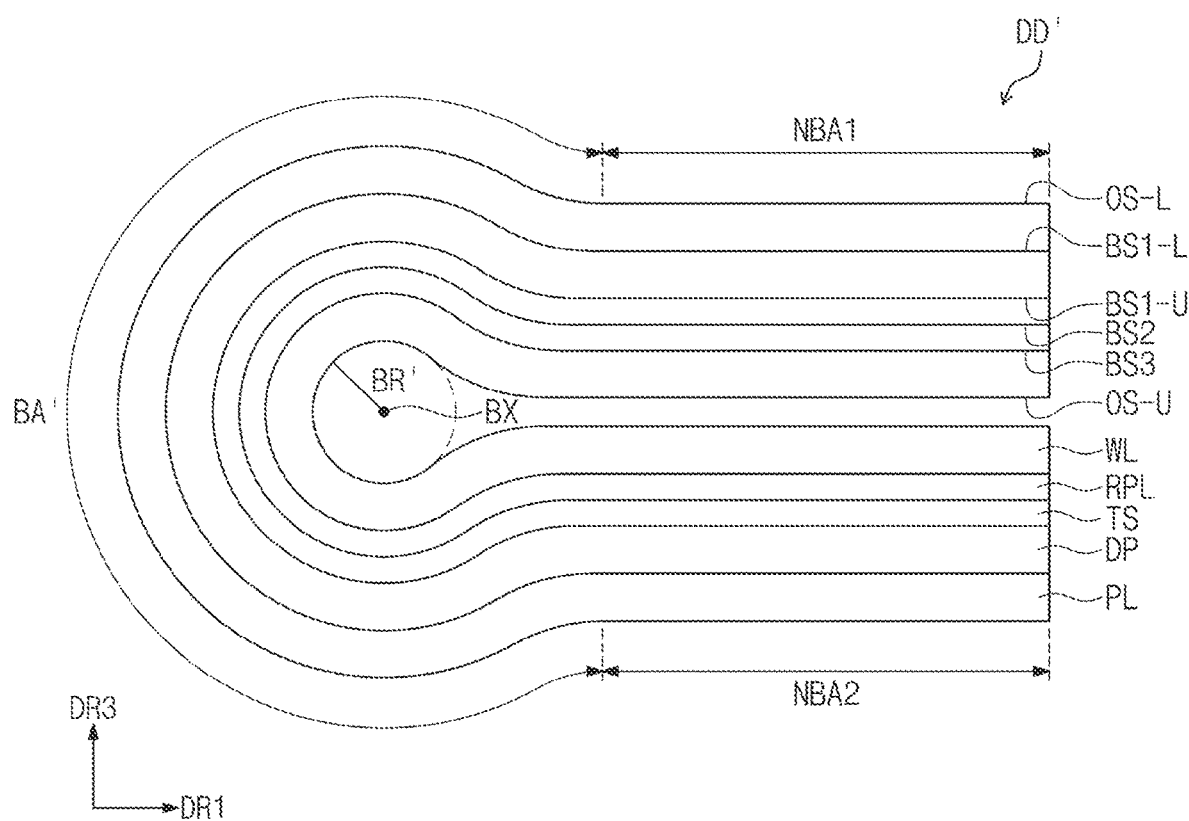
FIG. 3A is a cross-sectional view of a flexible display device in a second operational state, according to one or more exemplary embodiments.
Figure 3B:
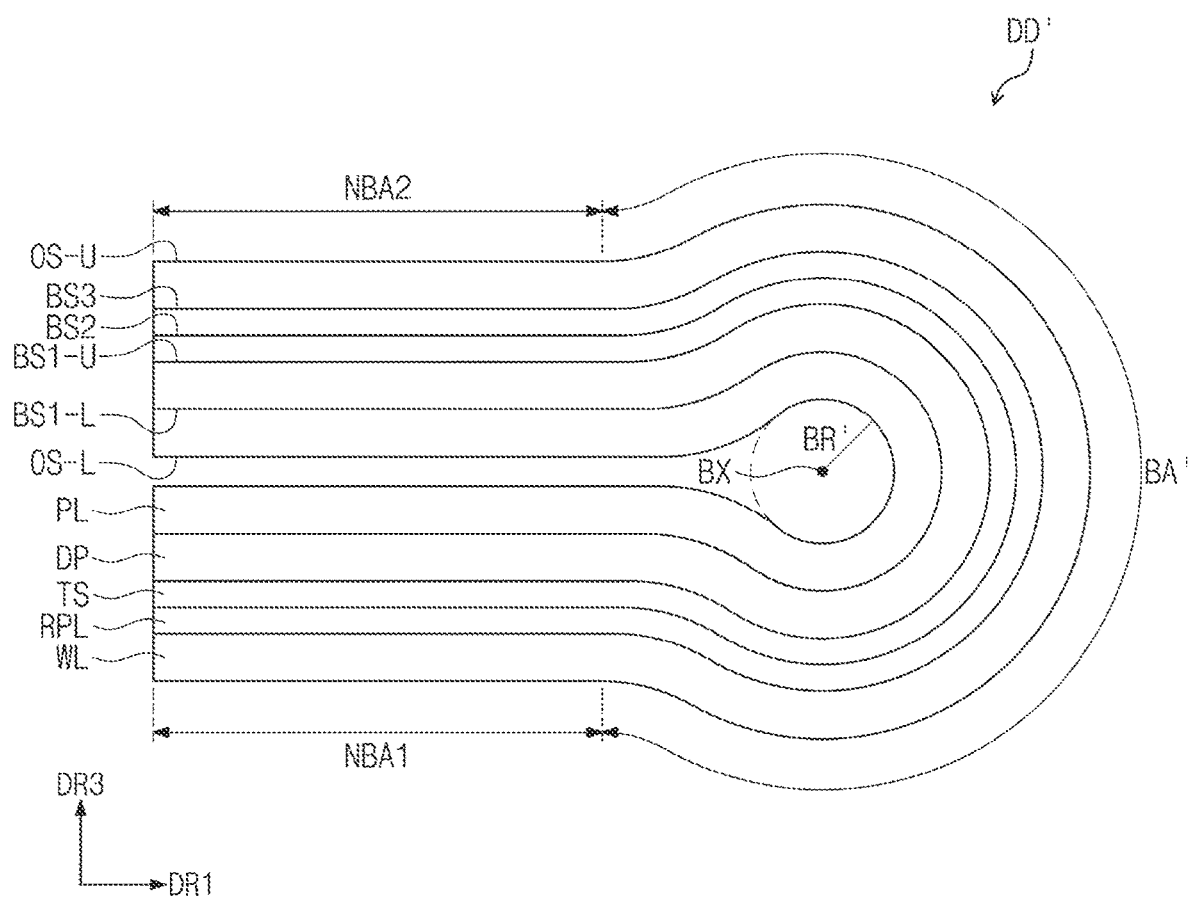
FIG. 3B is a cross-sectional view of the flexible display device of FIG. 3A in a third operational state, according to one or more exemplary embodiments.

FIGS. 3A and 3B are cross-sectional views of a flexible display device in second and third operational states, according to one or more exemplary embodiments. FIGS. 4A to 4D are cross-sectional views flexible display devices in first operational states, according to one or more exemplary embodiments. The flexible display devices of FIGS. 3A, 3B, and 4A to 4D are similar to the flexible display device DD of FIGS. 1A to 1C and 2A to 2C, and, as such, duplicative descriptions have been omitted to avoid obscuring exemplary embodiments described herein. In this manner, differences are primarily described below.

The flexible display device DD' may be bidirectionally bent in the shape illustrated in FIGS. 3A and 3B. The bending area BA' may be bent in a shape that is more similar to a circular shape to increase a surface area of the bending area BA' when compared to that of the being area BA of the flexible display device DD of FIGS. 1A to 1C and 2A to 2C. Also, the bending area BA' may be bent at a radius of curvature BR' greater than the radius of curvature BR illustrated in FIGS. 2B and 2C to reduce stress of the bending area BA.

Figure 4A:
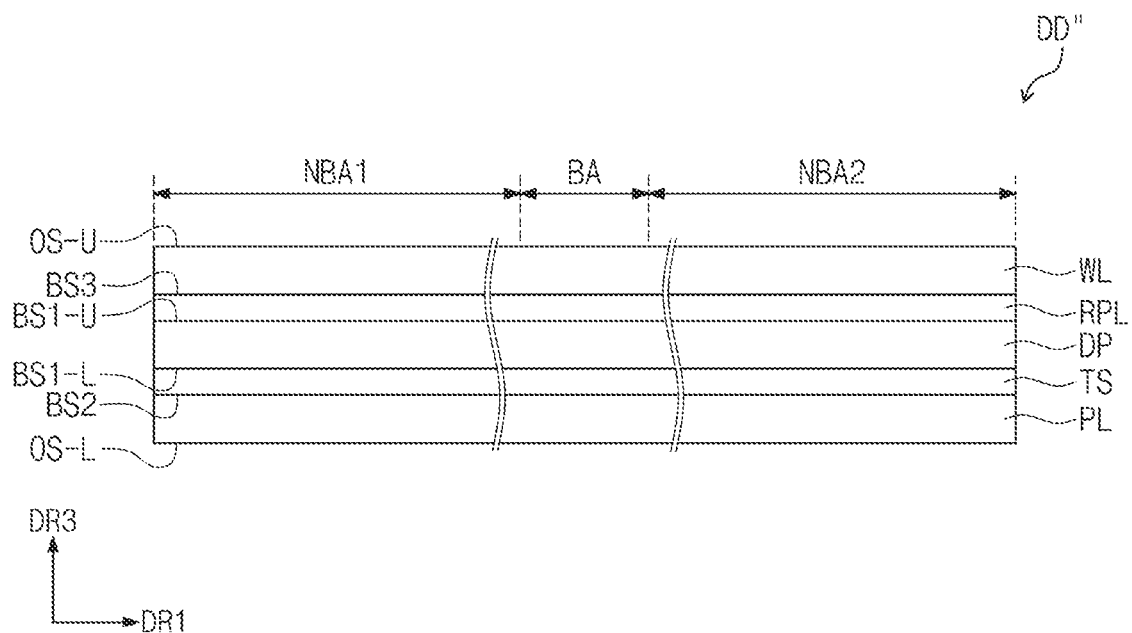
FIGS. 4A, 4B, 4C, and 4D are cross-sectional views of flexible display devices in first operational states, according to to one or more exemplary embodiments.
Figure 4B:
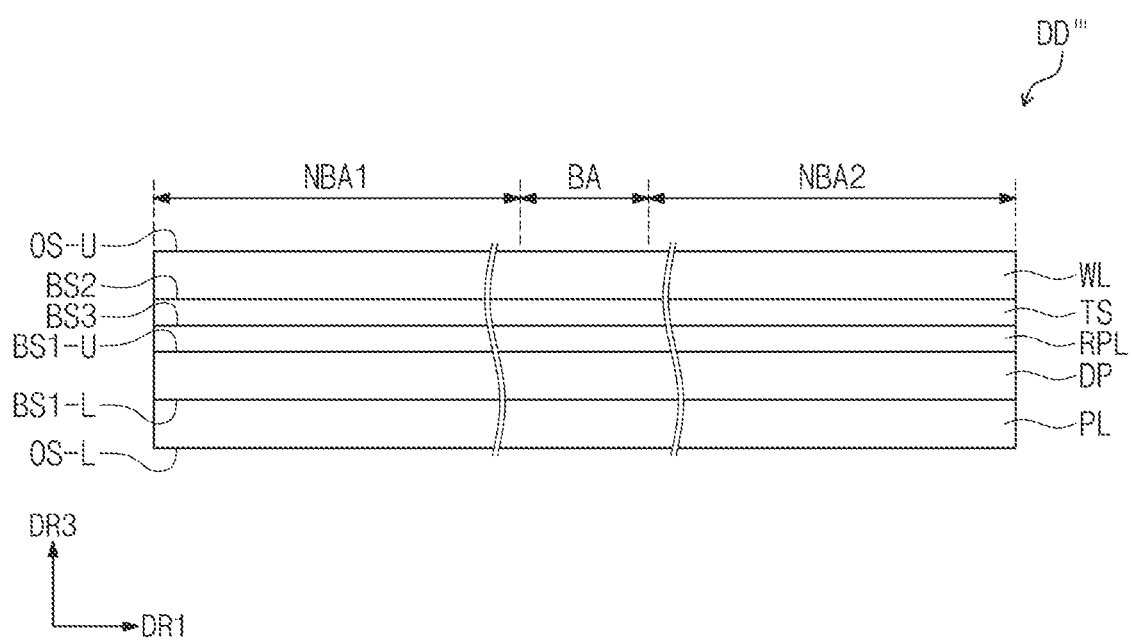

As illustrated in FIGS. 4A and 4B, functional layers may be changed in stacking order. For instance, in FIG. 4A, a touch sensing layer TS may be disposed on a first display panel surface BS1-L. An external protection layer PL may be disposed on a first base surface BS2. A reflection prevention layer RPL may be disposed on a second display panel surface BS1-U. A window layer WL may be disposed on a second base surface BS3. In FIG. 4B, the reflection prevention layer RPL may be disposed on the second display panel surface BS1-U. The touch sensing layer TS may be disposed on the second base surface BS3. The window layer WL may be disposed on the first base surface BS2.

Figure 4C:
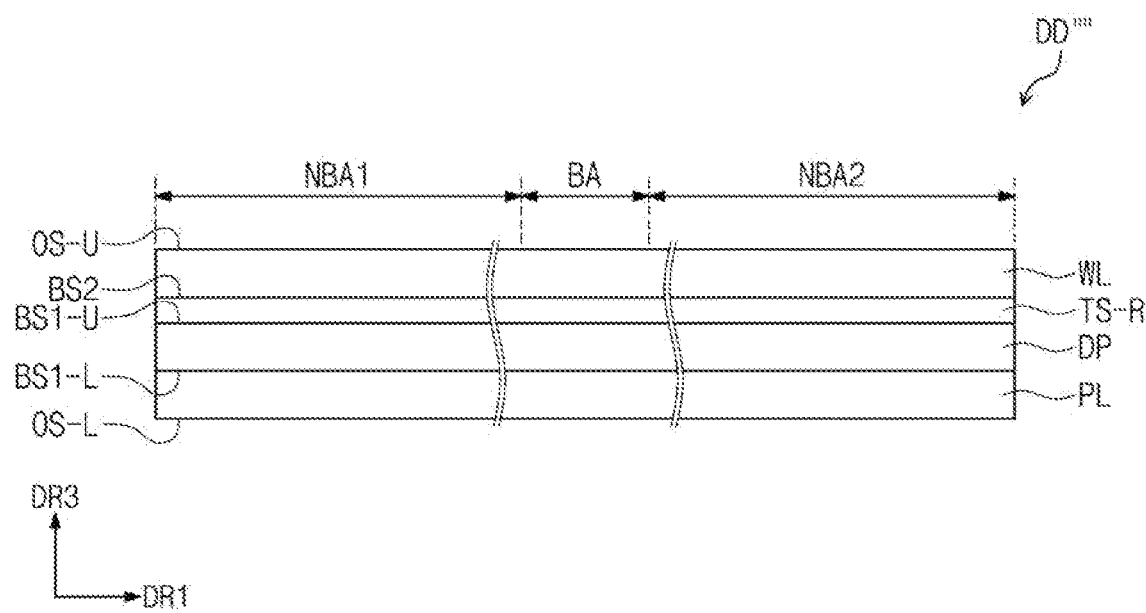
Figure 4D:
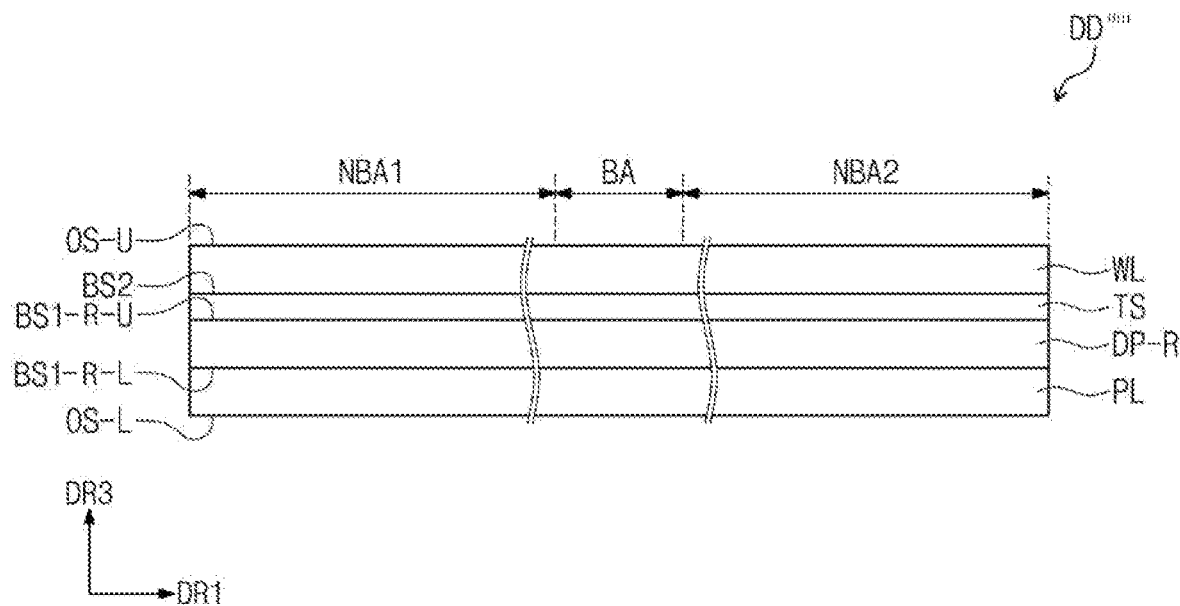

As illustrated in FIGS. 4C and 4D, the reflection prevention layer RPL that is separately formed in the other flexible display devices may be combined with another functional layer. The reflection prevention layer may constitute a portion of the touch sensing layer TS or a portion of a display panel layer DP. For example, in FIG. 4C, a touch sensing layer TS-R may have also have the function of the reflection prevention layer RPL. The touch sensing layer TS-R may be disposed on the second display panel surface BS1-U, and the window layer WL may be disposed on the base surface BS2. In FIG. 4D, a display panel layer DP-R may also have the function of the reflection prevention layer RPL. The touch sensing layer TS may be disposed on the hybrid second display panel surface BS1-R-U, and the window layer WL may be disposed on the first base surface BS2. The external protection layer PL may be disposed on the hybrid first display panel surface BS1-R-L.

Figure 5:
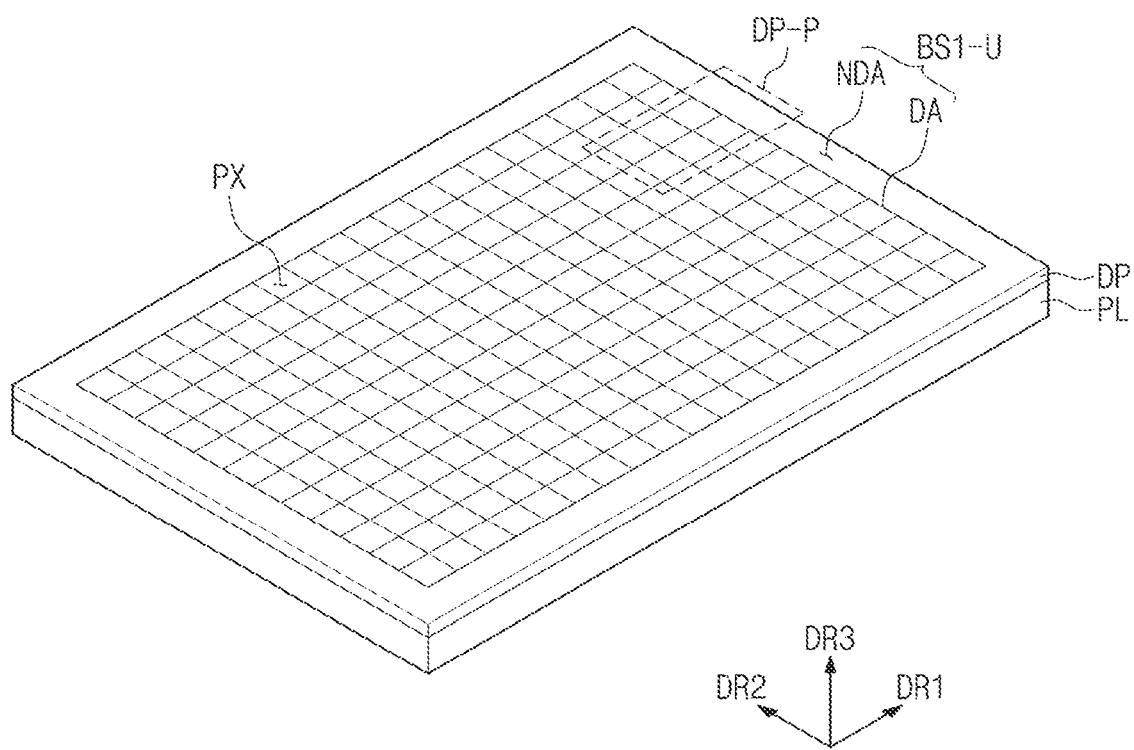
FIG. 5 is a perspective view of a flexible display panel, according to one or more exemplary embodiments.
Figure 6:
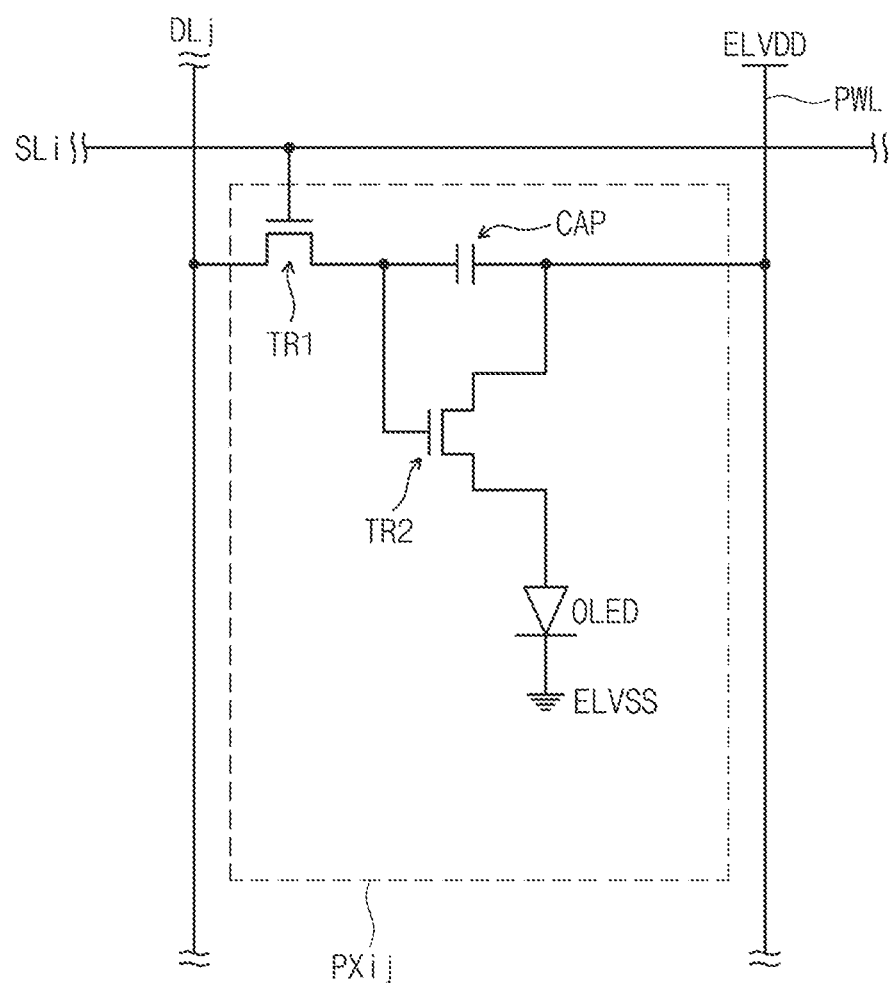
FIG. 6 is an equivalent circuit diagram of a pixel of the flexible display panel of FIG. 5, according to one or more exemplary embodiments.

FIG. 5 is a perspective view of a flexible display panel, according to one or more exemplary embodiments. FIG. 6 is an equivalent circuit diagram of a pixel of the flexible display panel of FIG. 5, according to one or more exemplary embodiments.

Hereinafter, the flexible display panel layer DP will be described as an organic light emitting display panel layer DP. The organic light emitting display panel layer DP includes a display area DA and a non-display area NDA on a plane. The second display panel surface BS1-U may be divided into the display area DA and the non-display area NDA. The display area DA and the non-display area NDA of the second display panel surface BS1-U do not need to match the display area DD-DA and the non-display area DD-NDA of the flexible display device DD. For example, the display area DA and the non-display area NDA of the second display panel surface BS1-U may be configured according a structure and/or design of the organic light emitting display panel layer DP.

As illustrated in FIG. 5, the organic light emitting display panel layer DP includes a plurality of pixels PX disposed on the display area DA. Although the plurality of pixels PX are shown as being arranged in a matrix shape, exemplary embodiments are not limited thereto or thereby. The plurality of pixels PX may be arranged in any suitable shape, such as a non-matrix shape, e.g., a pantile shape.

FIG. 6 illustrates an example of an equivalent circuit of a representative pixel PXij to which an i-th scan line SLi and a j-th source line DLj are connected. Although not separately shown, the plurality of pixels PX may have the same equivalent circuit as representative pixel PXij. The pixel PXij includes at least two transistors TR1 and TR2, at least one capacitor CAP, and an organic light emitting device OLED. Although a pixel driving circuit including two transistors TR1 and TR2 and one capacitor CAP is illustrated as an example, exemplary embodiments are not limited to the configuration of the pixel driving circuit.

An anode of the organic light emitting device OLED receives a first power voltage ELVDD applied to a power line PWL through the second transistor TR2. A cathode of the organic light emitting device OLED receives a second power voltage ELVSS. The first transistor TR1 outputs a data signal applied to a j-th source line DLj in response to a scanning signal applied to the i-th scan line SLi. The capacitor CAP charges a voltage to correspond to the data signal received from the first transistor TR1. The second transistor TR2 controls driving current flowing through the organic light emitting device OLED to correspond to a voltage stored in the capacitor CAP.

Figure 7:
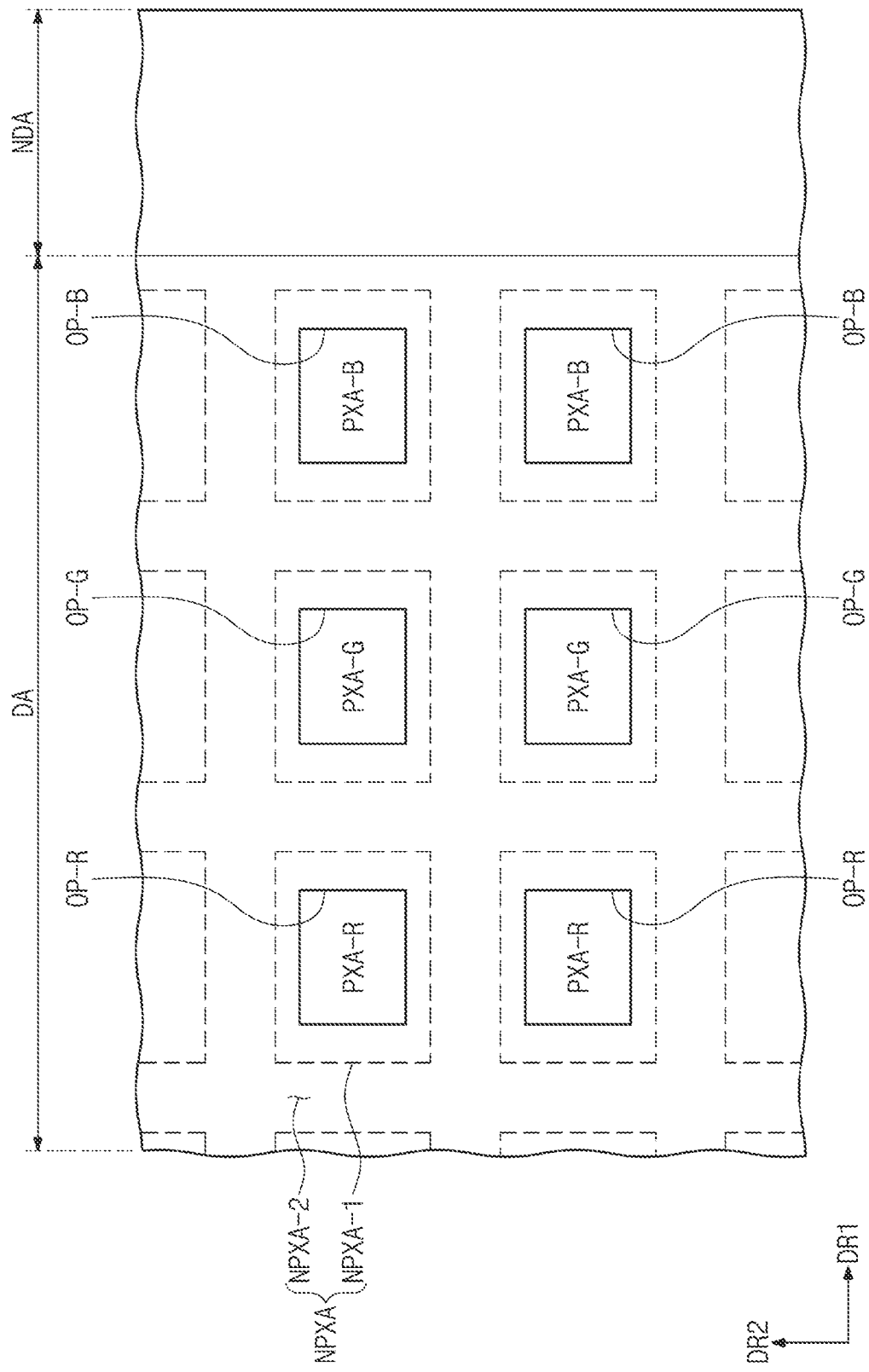
FIG. 7 is a partial plan view of an organic light emitting display panel, according to one or more exemplary embodiments.
Figure 8A:
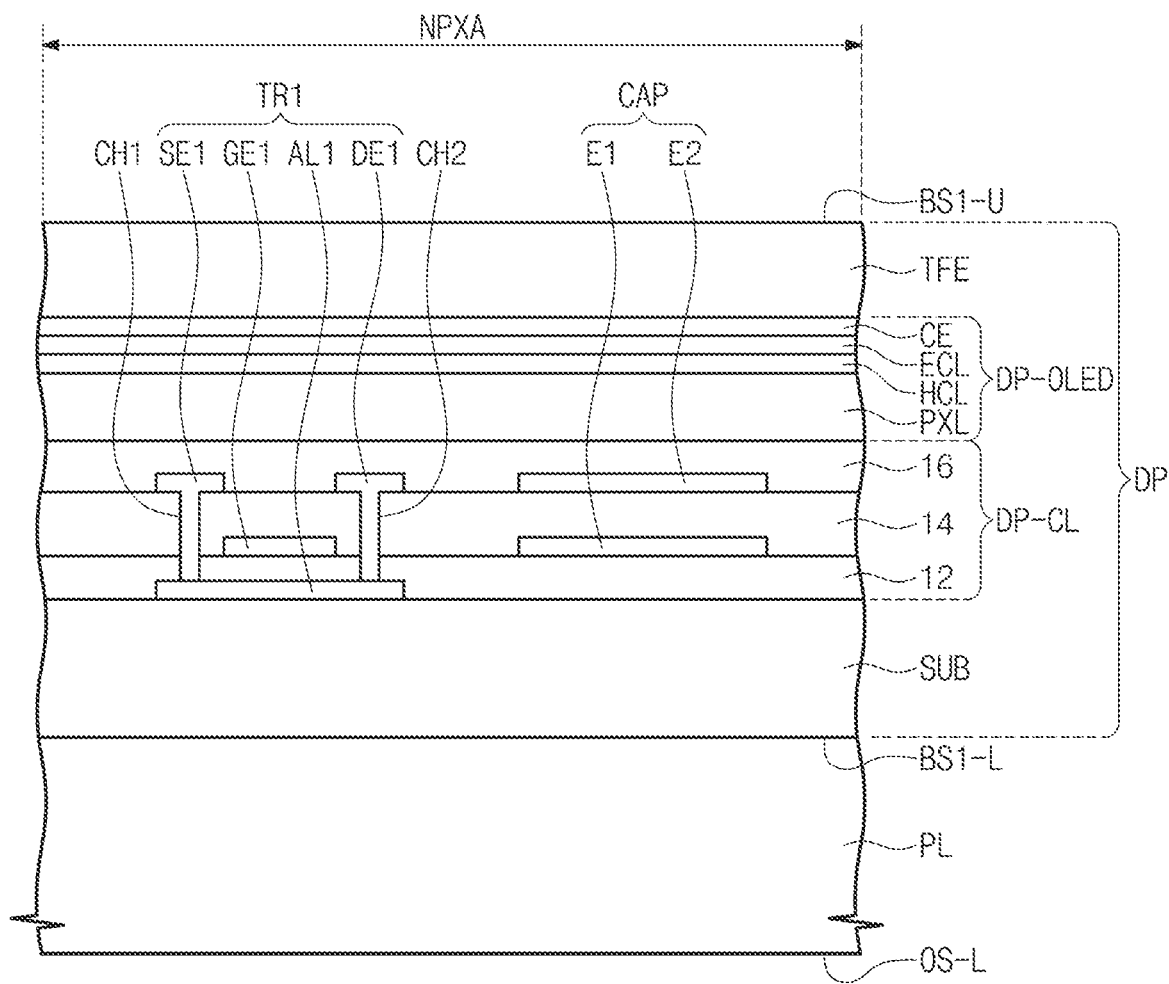
FIGS. 8A and 8B are partial cross-sectional views of the organic light emitting display panel of FIG. 7, according to one or more exemplary embodiments.
Figure 8B:
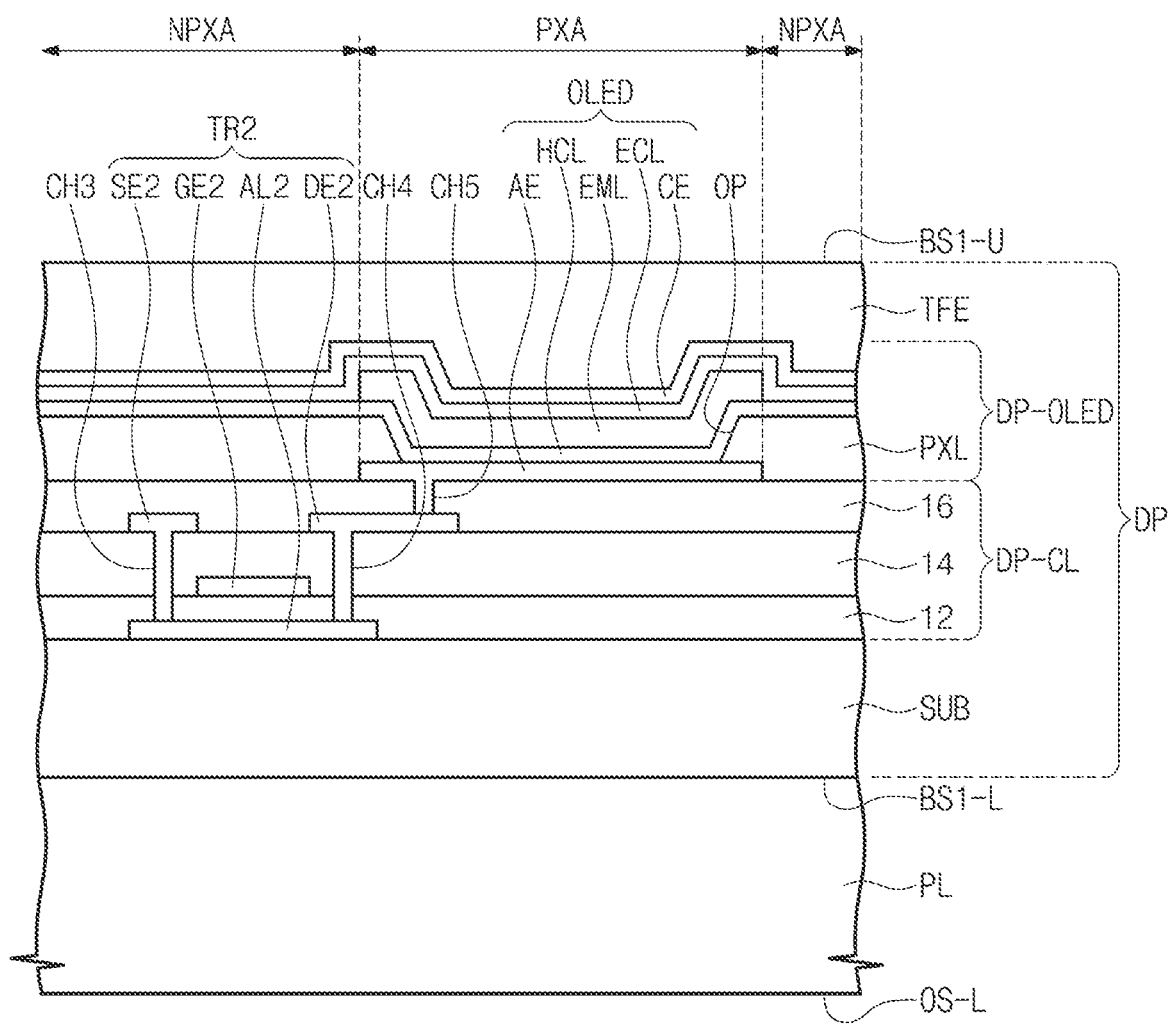

FIG. 7 is a partial plan view of a portion of the organic light emitting display panel of FIG. 5, according to one or more exemplary embodiments. FIGS. 8A and 8B are partial cross-sectional views of the organic light emitting display panel of FIG. 7, according to one or more exemplary embodiments.

FIG. 7 corresponds to a portion DP-P of the organic light emitting display panel of FIG. 5. FIG. 8A is a partial cross-sectional view of a portion corresponding to the first transistor TR1 and the capacitor CAP of the equivalent circuit of FIG. 6, whereas FIG. 8B is a partial cross-sectional view of a portion corresponding to the second transistor TR2 and the organic light emitting device OLED of the equivalent circuit of FIG. 6. In FIGS. 8A and 8B, an external protection layer PL disposed on a first outer surface OS-L is additionally illustrated.

As illustrated in FIG. 7, the display area DA is defined as a plurality of light emitting areas PXA-R, PXA-G, and PXA-B and a non-light emitting area NPXA on a plane defined by the first directional axis DR1 and the second directional axis DR2. FIG. 7 illustrates an example of three types of light emitting areas PXA-R, PXA-G, and PXA-B that are arranged in a matrix shape. Organic light emitting devices that emit light having three colors different from each other may be disposed on the three types of light emitting areas PXA-R, PXA-G, and PXA-B, respectively. It is also contemplated that, in one or more exemplary embodiments, the organic light emitting devices that emit light having white colors may be disposed on the three types of light emitting areas PXA-R, PXA-G, and PXA-B, respectively. In this manner, three types of color filters having colors different from each other may overlap the three types of light emitting areas PXA-R, PXA-G, and PXA-B, respectively.

As used herein, a feature in which "light having a predetermined color is emitted from the light emitting area" may include a case in which light generated in the light emitting device is emitted as it is, as well as a case in which light generated in the corresponding light emitting device is converted in color and then emitted. In one or more exemplary embodiments, the plurality of light emitting areas PXA-R, PXA-G, and PXA-B may include four or more types of light emitting areas.

The non-light emitting area NPXA may be divided into first non-light emitting areas NPXA-1 surrounding the light emitting areas PXA-R, PXA-G, and PXA-B and a second non-light emitting area NPXA-2 defining a boundary of the first non-light emitting areas NPXA-1. A driving circuit of the pixel corresponding to each of the first non-light emitting areas NPXA-1, e.g., the transistors TR1 and TR2 (see FIG. 6) or the capacitor CAP (see FIG. 6) may be disposed on each of the first non-light emitting areas NPXA-1. The signal lines, e.g., the scan line SLi (see FIG. 6), the source line DLj (see FIG. 6), and the power line PWL (see FIG. 6) may be disposed on the second non-light emitting area NPXA-2. It is contemplated, however, that exemplary embodiments are not limited thereto or thereby. For example, the first non-light emitting areas NPXA-1 and the second non-light emitting area NPXA-2 may not be divided with respect to each other.

Although not separately shown, in one or more exemplary embodiments, each of the light emitting areas PXA-R, PXA-G, and PXA-B may have a shape that is similar to a diamond shape. Further, according to one or more exemplary embodiments, the organic light emitting devices that emit light having four colors different from each other may be disposed on the four types of light emitting areas that are repeatedly disposed.

As illustrated in FIGS. 8A and 8B, the organic light emitting display panel layer DP includes a base layer SUB, a circuit layer DP-CL, an organic light emitting device layer DP-OLED, and a thin film encapsulation layer TFE. The circuit layer DP-CL may include a plurality of conductive layers and a plurality of insulation layers, and the organic light emitting device layer DP-OLED may include a plurality of conductive layers and a plurality of functional organic layers. The thin film encapsulation layer TFE may include at least one organic layer and at least one inorganic layer.

The base layer SUB may include a plastic substrate, a glass substrate, a metal substrate, or an organic/inorganic composite substrate, which are formed of polyimide, as the flexible substrate. The base layer SUB may provide a first display panel surface BS1-L.

The external protection layer PL may be disposed on the first display panel surface BS1-L to protect the display panel layer DP. The external protection layer PL may prevent external moisture, oxygen, debris, etc., from being permeated into the display panel layer DP and also the display panel layer DP from being damaged by foreign substances and/or external forces. The base layer SUB may have a relatively large thickness so that the external protection layer PL performs the above-described protection function. The base layer SUB may have a multi-layer structure. Also, the external protection layer PL may be omitted according to the structure of the base layer SUB.

A semiconductor pattern AL1 (hereinafter, referred to as a first semiconductor pattern) of the first transistor TR1 and a semiconductor pattern AL2 (hereinafter, referred to as a second semiconductor pattern) of the second transistor TR2 are disposed on the base layer SUB. The first and second semiconductor patterns AL1 and AL2 may be formed of amorphous silicon that is formed at a relatively low temperature. In addition, each of the first and second semiconductor patterns AL1 and AL2 may be formed of a metal oxide semiconductor. Although not separately shown, functional layers may be further disposed on a surface of the base layer SUB. The functional layers may include at least one of a barrier layer and a buffer layer. The first and second semiconductor patterns AL1 and AL2 may be disposed on the barrier layer or the buffer layer.

A first insulation layer 12 covering the first and second semiconductor patterns AL1 and AL2 is disposed on the base layer SUB. The first insulation layer 12 may include an organic layer and/or an inorganic layer. In one or more exemplary embodiments, the first insulation layer 12 may include a plurality of inorganic thin films. The plurality of inorganic thin films may include a silicon nitride layer and a silicon oxide layer.

A control electrode GE1 (hereinafter, referred to as a first control electrode) of the first transistor TR1 and a control electrode GE2 (hereinafter, referred to as a second control electrode) of the second transistor TR2 are disposed on the first insulation layer 12. A first electrode E1 of the capacitor CAP is disposed on the first insulation layer 12. The first control electrode GE1, the second control electrode GE2, and the first electrode E1 may be manufactured by the same photolithographic process as the scan line SLi (see FIG. 4). That is, the first electrode E1 may be formed of the same material as the scan line SLi.

The first control electrode GE1, a second insulation layer 14 covering the first and second control electrodes GE1 and GE2 and the first electrode E1 is disposed on the first insulation layer 12. The second insulation layer 14 includes an organic layer and/or an inorganic layer. In one or more exemplary embodiments, the second insulation layer 14 may include a plurality of inorganic thin films. The plurality of inorganic thin films may include a silicon nitride layer and a silicon oxide layer.

The source line DLj (see FIG. 4) and the power line PWL (see FIG. 4) may be disposed on the second insulation layer 14. An input electrode SE1 (hereinafter, referred to as a first input electrode) and an output electrode DE1 (hereinafter, referred to as a first output electrode) of the first transistor TR1 are disposed on the second insulation layer 14. An input electrode SE2 (hereinafter, referred to as a second input electrode) and an output electrode DE2 (hereinafter, referred to as a second output electrode) of the second transistor TR2 are disposed on the second insulation layer 14. The first input electrode SE1 is branched from the source line DLj. The second input electrode SE2 is branched from the power line PWL.

A second electrode E2 of the capacitor CAP is disposed on the second insulation layer 14. The second electrode E2 may be manufactured by the same photolithographic process as the source line DLj and the power line PWL, and, thereby, formed of the same material as the source line DLj and the power line PWL.

The first input electrode SE1 and the first output electrode DE1 are connected to the first semiconductor pattern AL1 through first and second through holes CH1 and CH2, which pass through the first and second insulation layers 12 and 14, respectively. The first output electrode DE1 may be electrically connected to the first electrode E1. For example, the first output electrode DE1 may be connected to the first electrode E1 through a through hole (not shown) passing through the second insulation layer 14. The second input electrode SE2 and the second output electrode DE2 are connected to the second semiconductor pattern AL2 through third and fourth through holes CH3 and CH4, which pass through the first and second insulation layers 12 and 14, respectively. According to one or more exemplary embodiments, at least one of the first and second transistors TR1 and TR2 may be formed as a bottom gate structure.

A third insulation layer 16 covering the first input electrode SE1, the first output electrode DE1, the second input electrode SE2, and the second output electrode DE2 is disposed on the second insulation layer 14. The third insulation layer 16 includes an organic layer and/or an inorganic layer. In one or more exemplary embodiments, the third insulation layer 16 may be formed of an organic material to provide a flat surface.

A pixel defining layer PXL and an organic light emitting device OLED are disposed on the third insulation layer 16. An opening OP is defined in the pixel defining layer PXL. The pixel defining layer PXL may be another insulation layer. The opening OP of FIGS. 8A and 8B may correspond to openings OP-R, OP-G, and OP-B of FIG. 7.

The anode AE of organic light emitting device OLED is connected to the second output electrode DE2 through a fifth through hole CH5 passing through the third insulation layer 16. The opening OP of the pixel defining layer PXL exposes at least a portion of the anode AE. A hole control layer HCL may be commonly defined in the light emitting areas PXA-R, PXA-G, and PXA-B (see FIG. 7) and the non-light emitting area NPXA (see FIG. 7). An organic light emitting layer EML and an electron control layer ECL are successively formed on the hole control layer HCL. The hole control layer HCL includes at least one hole transfer layer, and the electron control layer ECL includes at least one electron transfer layer. Thereafter, the cathode CE may be commonly formed on the light emitting areas PXA-R, PXA-G, and PXA-B and the non-light emitting area NPXA. The cathode CE may be formed by a deposition or sputtering process according to its layered structure.

The thin film encapsulation layer TFE encapsulating the organic light emitting device layer DP-OLED is disposed on the cathode CE. The thin film encapsulation layer TFE protects the organic light emitting device OLED against moisture and foreign substances. In one or more exemplary embodiments, the thin film encapsulation layer TFE provides a second display panel surface BS1-U. In one or more exemplary embodiments, a buffer layer (not shown) may be disposed on the thin film encapsulation layer TFE, and, as such, may provide the second display panel surface BS1-U.

According to one or more exemplary embodiments, the light emitting area PXA may be defined as an area from which light is emitted. The light emitting area PXA may be defined to correspond to the anode AE or the light emitting layer EML of the organic light emitting device OLED. Although the patterned organic light emitting layer EML is illustrated as an example, the organic light emitting layer EML may be commonly disposed on the non-light emitting area NPXA (see FIG. 5) and the light emitting areas PXA-R, PXA-G, and PXA-B (see FIG. 5). In this manner, the organic light emitting layer EML may emit white light.

Figure 9A:
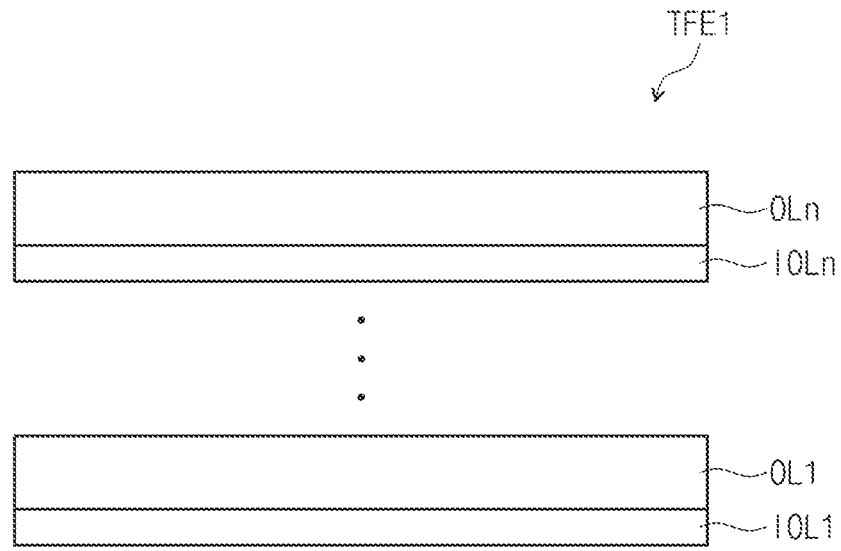
FIGS. 9A, 9B, and 9C are cross-sectional views of thin film encapsulation layers, according to one or more exemplary embodiments.
Figure 9B:
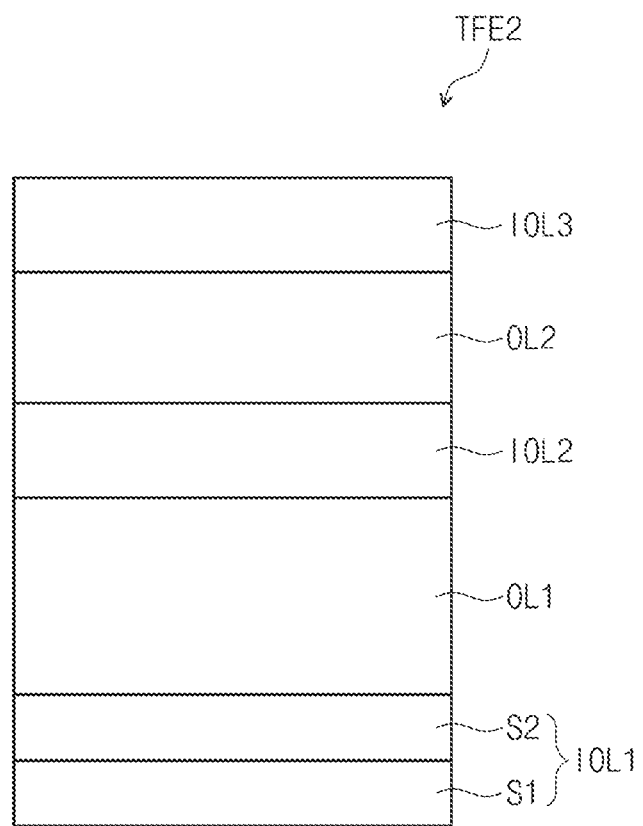
Figure 9C:
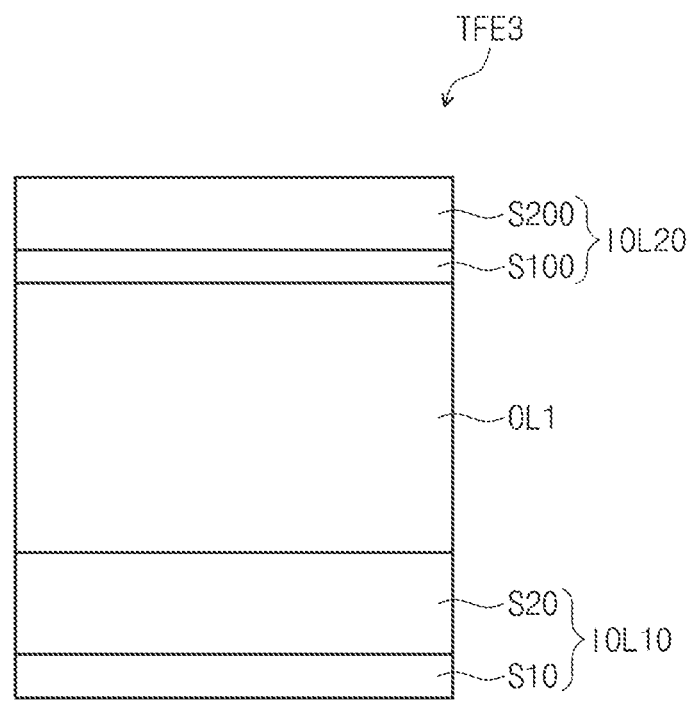

FIGS. 9A to 9C are cross-sectional views of thin film encapsulation layers, according to one or more exemplary embodiments. The thin film encapsulation layers TFE1, TFE2, and TFE3 will be described with reference to FIGS. 9A, 9B, and 9C, respectively.

According to one or more exemplary embodiments, a thin film encapsulation layer may include at least two inorganic thin films and an organic thin film disposed between the at least two inorganic thin films. The inorganic thin films protect the organic light emitting device OLED against moisture, and the organic thin film protects the organic light emitting device OLED against foreign substances, such as dust particles.

As illustrated in FIG. 9A, the thin film encapsulation layer TFE1 may include n (n being a natural number) inorganic thin films IOL1 to IOLn including the first inorganic thin film IOL1 contacting the cathode CE (see FIG. 8B). The first inorganic thin film IOL1 may be defined as a lower inorganic thin film, and the inorganic thin films except for the first inorganic thin film IOL1 of the n inorganic thin films IOL1 to IOLn may be defined as upper inorganic thin films. The thin film encapsulation layer TFE1 includes n organic thin films OL1 to OLn. The n organic thin films OL1 to OLn and the n inorganic thin films IOL1 to IOLn may be alternately disposed with respect to each other. The uppermost layer may be the organic layer or the inorganic layer. Each of the n organic thin films OL1 to OLn may generally have a thickness greater than that of each of the organic thin films IOL1 to IOLn.

In one or more exemplary embodiments, each of the n inorganic thin films IOL1 to IOLn may have a single layer structure formed of one material or a multi-layer structure respectively formed of materials different from each other. Each of the n organic thin films OL1 to OLn may be formed by depositing organic monomers. The organic monomers may be acrylic-based monomers.

As illustrated in FIGS. 9B and 9C, the inorganic thin films of each of the thin film encapsulation layers TFE2 and TFE3 may be formed of the same inorganic material or inorganic materials different from each other and have the same thickness or thicknesses different from each other. The organic thin films of each of the thin film encapsulation layers TFE2 and TFE3 may be formed of the same organic material or organic materials different from each other and have the same thickness or thicknesses different from each other.

Referring to FIG. 9B, the thin film encapsulation layer TFE2 may include a first inorganic thin film IOL1, a first organic thin film OL1, a second inorganic thin film IOL2, a second organic thin film OL2, and a third inorganic thin film IOL3 that are successively stacked on one another. The first inorganic thin film IOL1 may have a two-layer structure. A first sub-layer S1 may be a lithium fluoride layer, and a second sub-layer S2 may be an aluminum oxide layer. The first organic thin film OL1 may be a first organic monomer layer, the second inorganic thin film IOL2 may be a first silicon nitride layer, the second organic thin film OL2 may be a second organic monomer layer, and the third inorganic thin film IOL3 may be a second silicon nitride layer.

As illustrated in FIG. 9C, the thin film encapsulation layer TFE3 may include a first inorganic thin film IOL10, a first organic thin film OL1, and a second inorganic thin film IOL20 that are successively stacked on one another. The first inorganic thin film IOL10 may have a two-layer structure. A first sub-layer S10 may be a lithium fluoride layer, and a second sub-layer S20 may be a silicon oxide layer. The first organic thin film OL1 may be an organic monomer, and the second inorganic thin film IOL20 may have a two-layer structure. The second inorganic thin film IOL20 may include a first sub-layer S100 and a second sub layer S200 that are deposited under different deposition environments than each other. The first sub-layer S100 may be deposited under a lower power condition, and the second sub-layer S200 may be deposited under a high power condition. Each of the first sub-layer S100 and the second sub-layer S200 may be a silicon nitride layer.

Figure 10A:
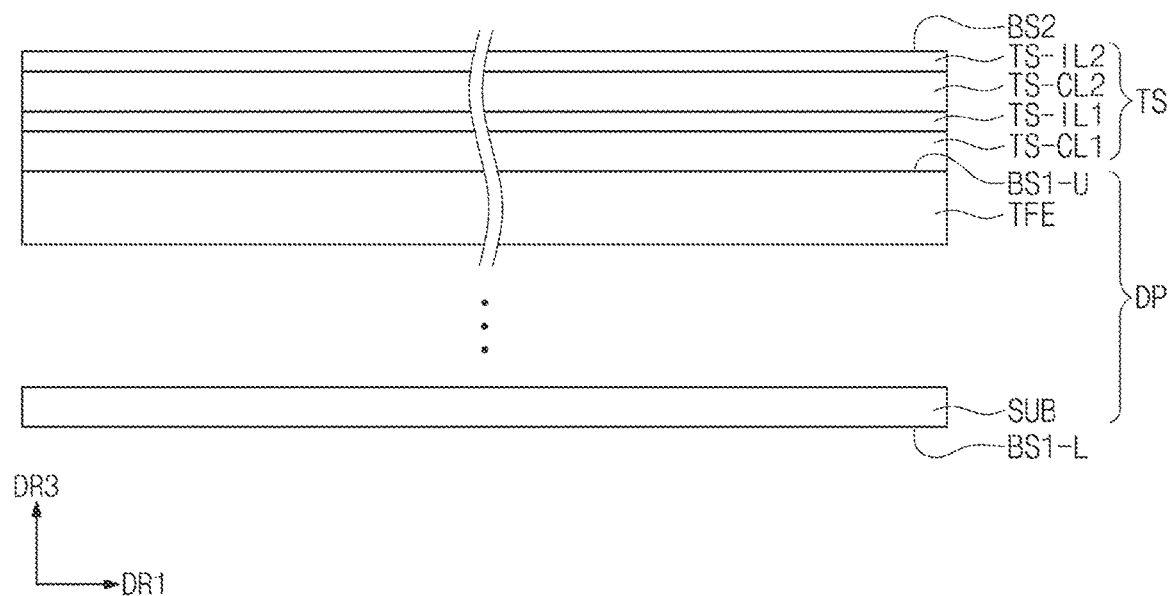
FIGS. 10A, 10B, and 10C are cross-sectional views of display devices, according to one or more exemplary embodiments.
Figure 10B:
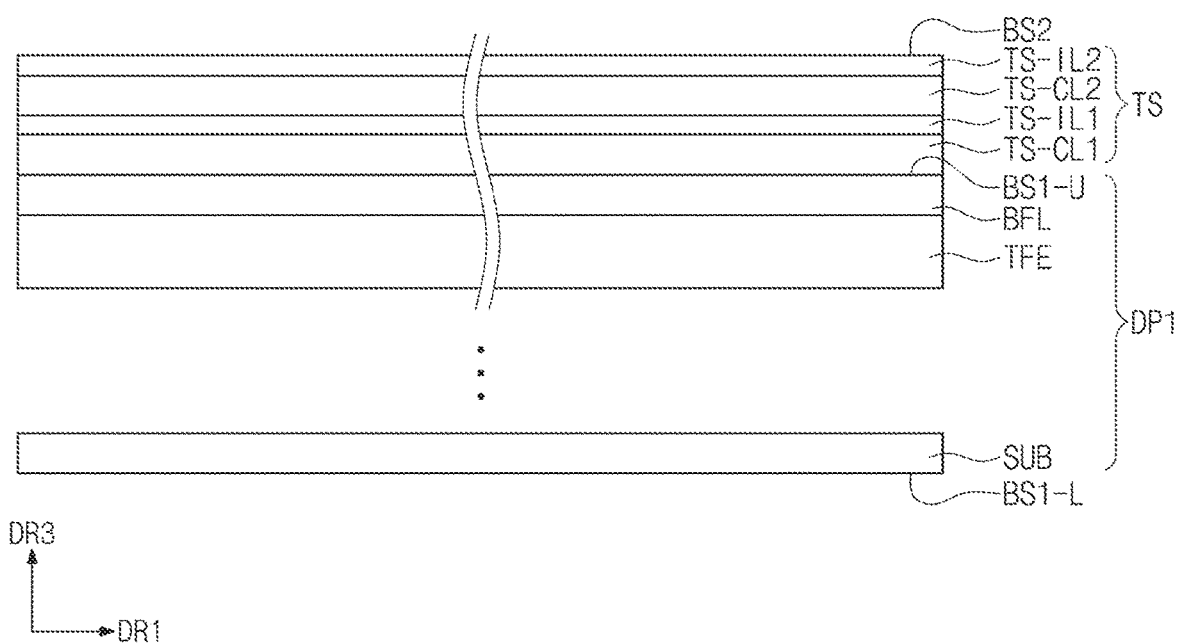
Figure 10C:
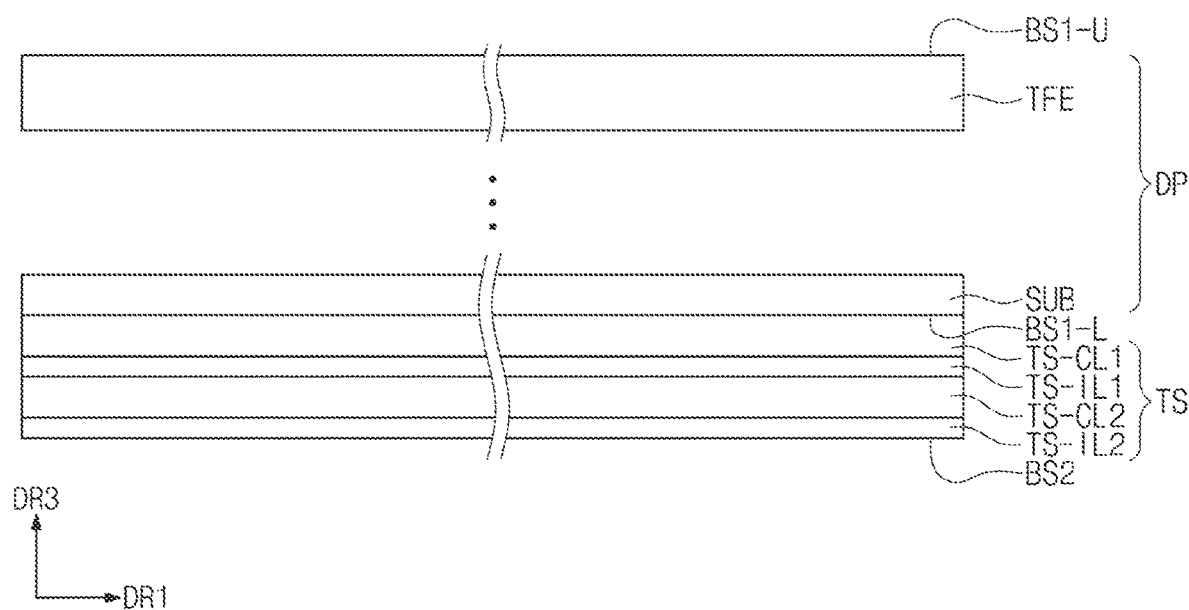

FIGS. 10A to 10C are cross-sectional views of display devices, according to one or more exemplary embodiments. The constituents of the touch sensing layer TS and the display panel layers DP and DP1 of the display devices are illustrated. In this manner, only a portion of the display panel layers DP and DP1 are illustrated. As illustrated in FIGS. 10A to 10C, the touch sensing layer TS may include a first conductive layer TS-CL1, a first touch insulation layer TS-IL1, a second conductive layer TS-CL2, and a second touch insulation layer TS-IL2.

Each of the first conductive layer TS-CL1 and the second conductive layer TS-CL2 may have a single-layer structure or a multi-layer structure in which a plurality of layers are stacked in the third directional axis DR3. A conductive layer having a multi-layer structure may include a transparent conductive layer and at least one metal layer. The conductive layer having the multi-layer structure may include metal layers formed of metals different from each other. The transparent conductive layer may be formed of indium tin oxide (ITO), indium zinc oxide (IZO), zinc oxide (ZnO), indium tin zinc oxide (ITZO), PEDOT, a metal nano wire, and graphene. The metal layer may be formed of at least one of molybdenum, silver, titanium, copper, aluminum, and an alloy thereof.

Each of the first and second conductive layers TS-CL1 and TS-CL2 may include a plurality of patterns. Hereinafter, a structure in which the first conductive layer TS-CL1 includes first conductive patterns, and the second conducive layer TS-CL2 includes second conductive patterns will be described. Each of the first and second conductive patterns may include touch electrodes and touch signal lines.

According to one or more exemplary embodiments, each of the first and second touch insulation layers TS-IL1 and TS-IL2 may be formed of inorganic or organic material. The inorganic material may include silicon oxide or silicon nitride. The organic material may include at least one of an acrylic-based resin, a methacrylic-based resin, a polyisoprene-based resin, a vinyl-based resin, an epoxy-based resin, a urethane-based resin, a cellulose-based resin, or a perylene-based resin. If the first touch insulation layer TS-IL1 insulates the first and second touch insulation layers TS-IL1 and TS-IL2 from each other, exemplary embodiments may not be limited to a shape of the first touch insulation layer TS-IL1 The first touch insulation layer TS-IL1 may be deformed in shape according to shapes of the first and second conductive patterns. The first touch insulation layer TS-IL1 may entirely cover the second display panel surface BS1-U that will be described later in more detail or include a plurality of insulation patterns.

As illustrated in FIG. 10A, the first conductive layer TS-CL1 may be disposed on the thin film encapsulation layer TFE. That is, the thin film encapsulation layer TFE provides the second display panel surface BS1-U on which the touch sensing layer TS is disposed.

The display panel layer DP1 of FIG. 10B may further include a buffer layer BFL disposed on the thin film encapsulation layer TFE when compared to the display panel layer DP of FIG. 10A. As such, the buffer layer BFL provides the second display panel surface BS1-U. In one or more exemplary embodiments, the buffer layer BFL may be an inorganic layer for supplementing the thin film encapsulation layer TFE. The buffer layer BFL may be an organic/inorganic layer that that matches a refraction index of surrounding layers or a color filter layer for reducing reflection of external light.

Referring to FIG. 10C, the first conductive layer TS-CL1 may be disposed on the first display panel surface BS1-L. The first touch insulation layer TS-IL1 is disposed on the first conductive layer TS-CL1, the second conductive layer TS-CL2 is disposed on the first touch insulation layer TS-IL1, and the second touch insulation layer TS-IL2 is disposed on the second conductive layer TS-CL2.

Figure 11A:
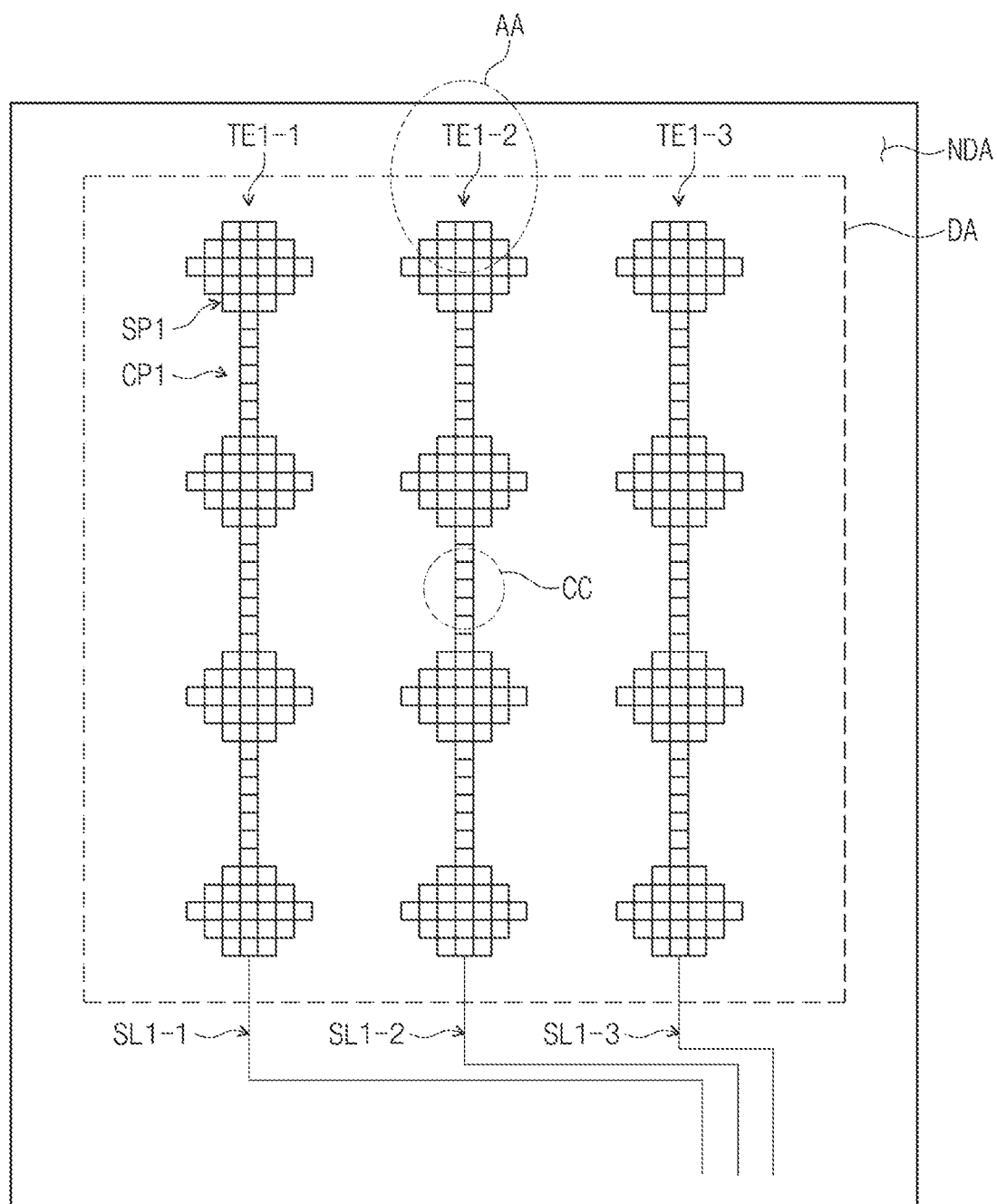
FIGS. 11A and 11B are plan views illustrating conductive layers of a touch detection member, according to one or more exemplary embodiments.
Figure 11B:
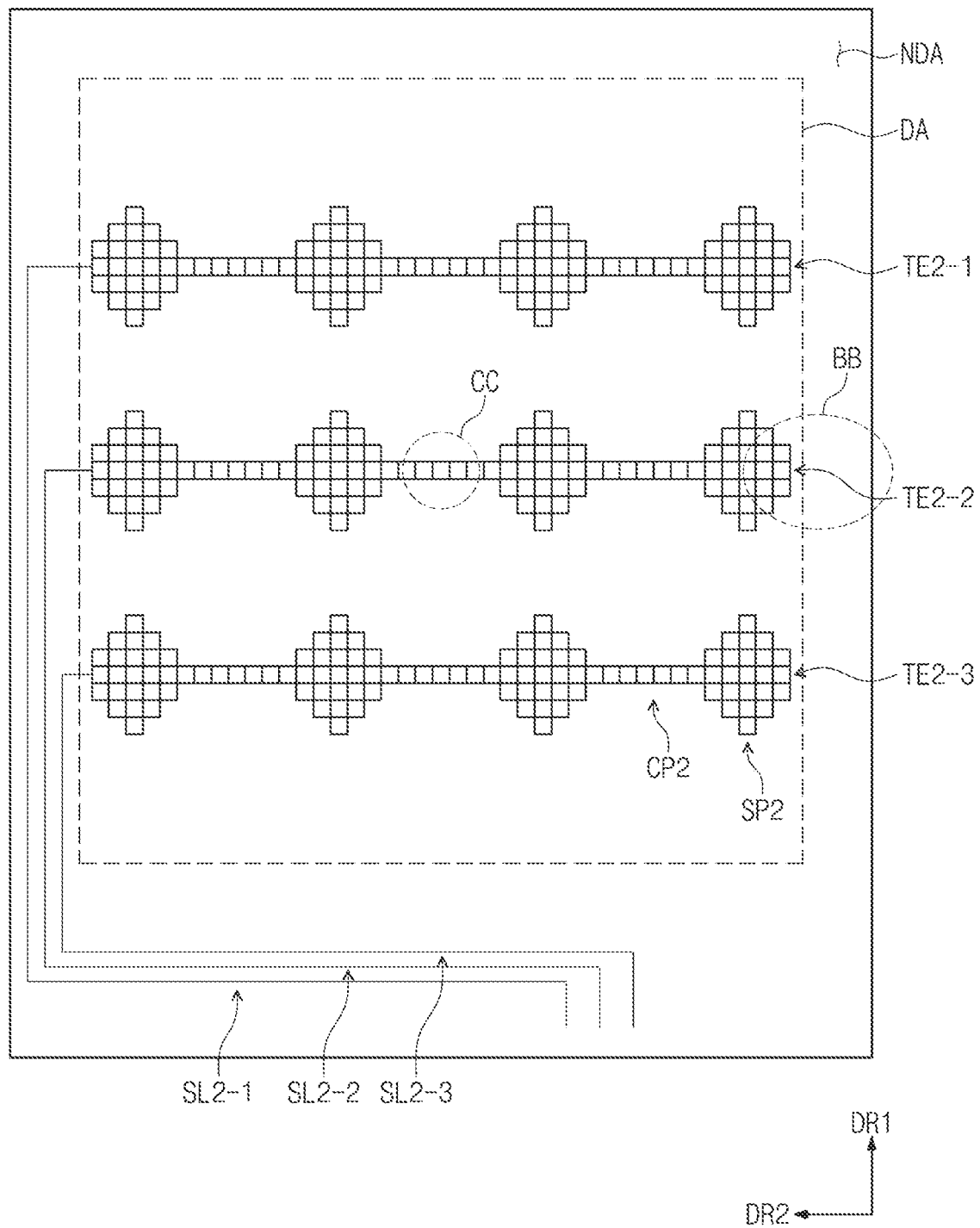
Figure 12A:
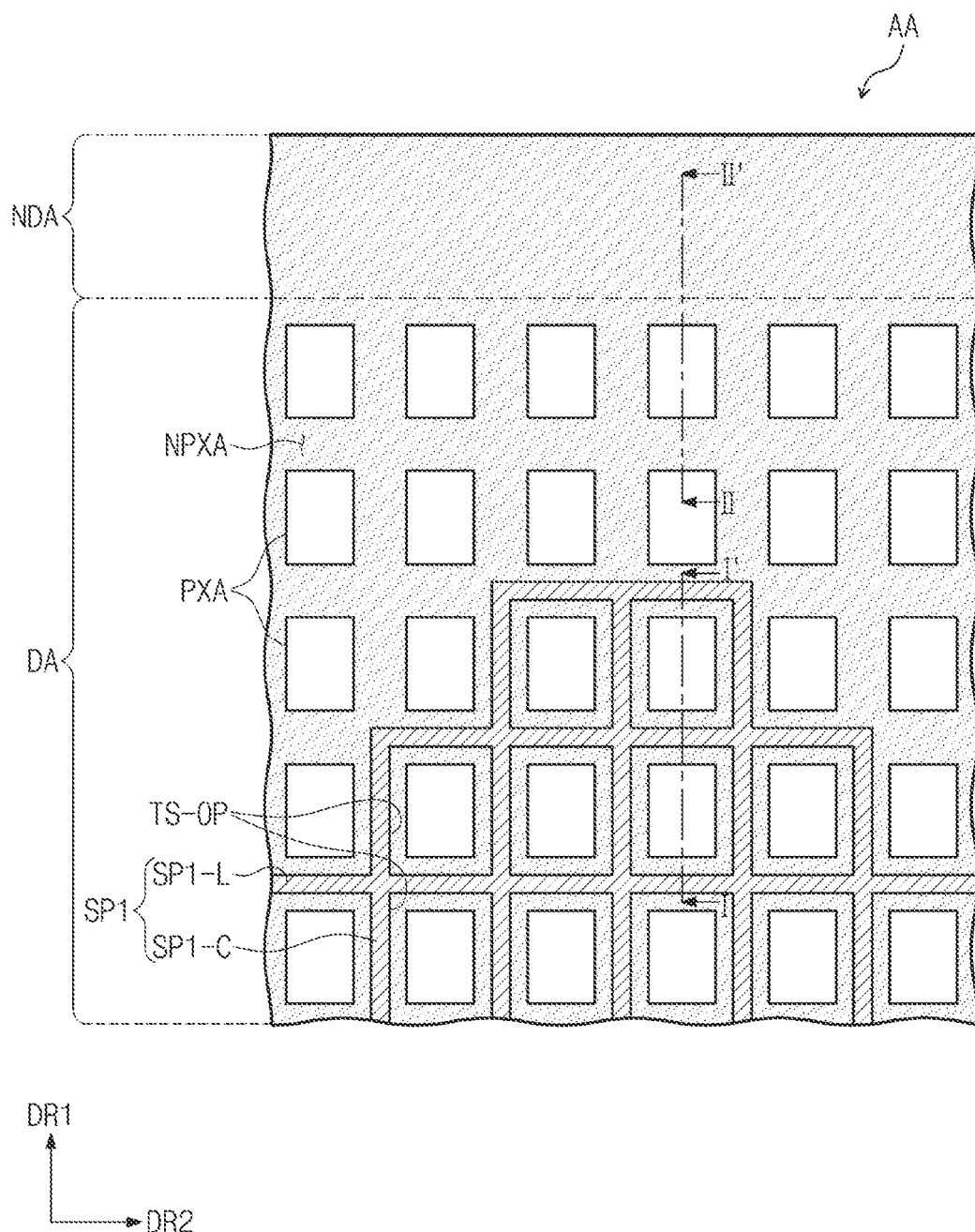
FIG. 12A is a partial enlarged view of area AA in FIG. 11A, according to one or more exemplary embodiments.
Figure 12B:
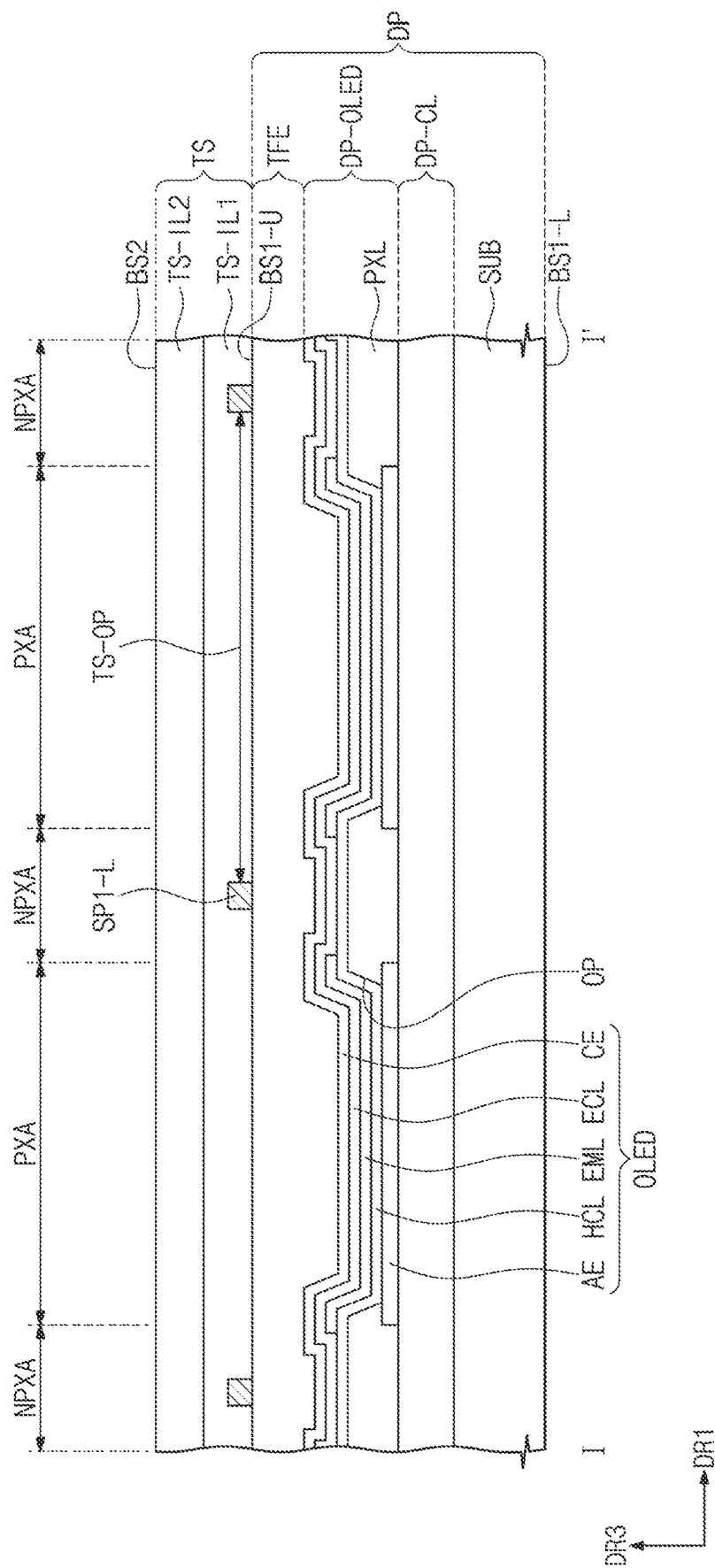
FIGS. 12B and 12C are a partial cross-sectional views of FIG. 12A respectively taken along sectional lines I-I' and according to one or more exemplary embodiments.
Figure 12C:
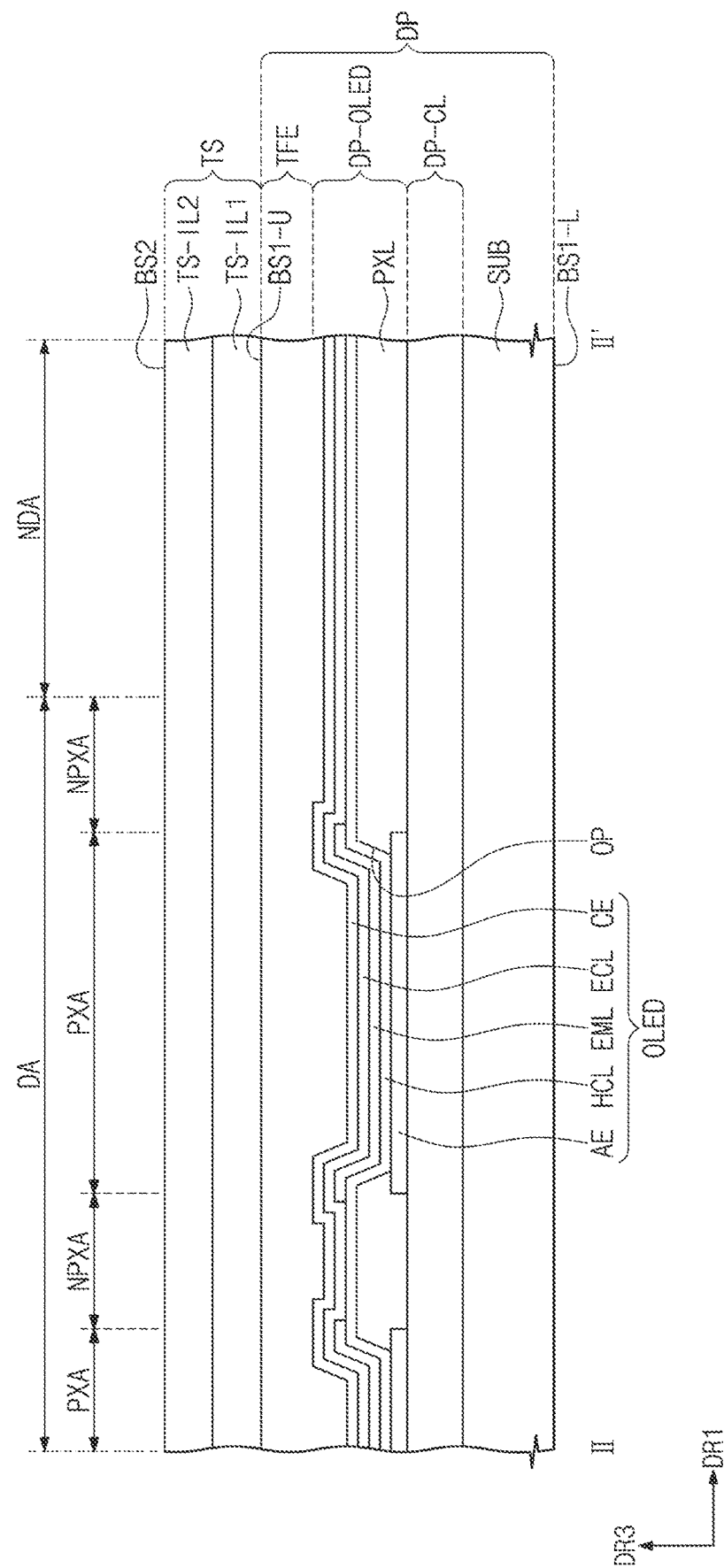
Figure 13A:
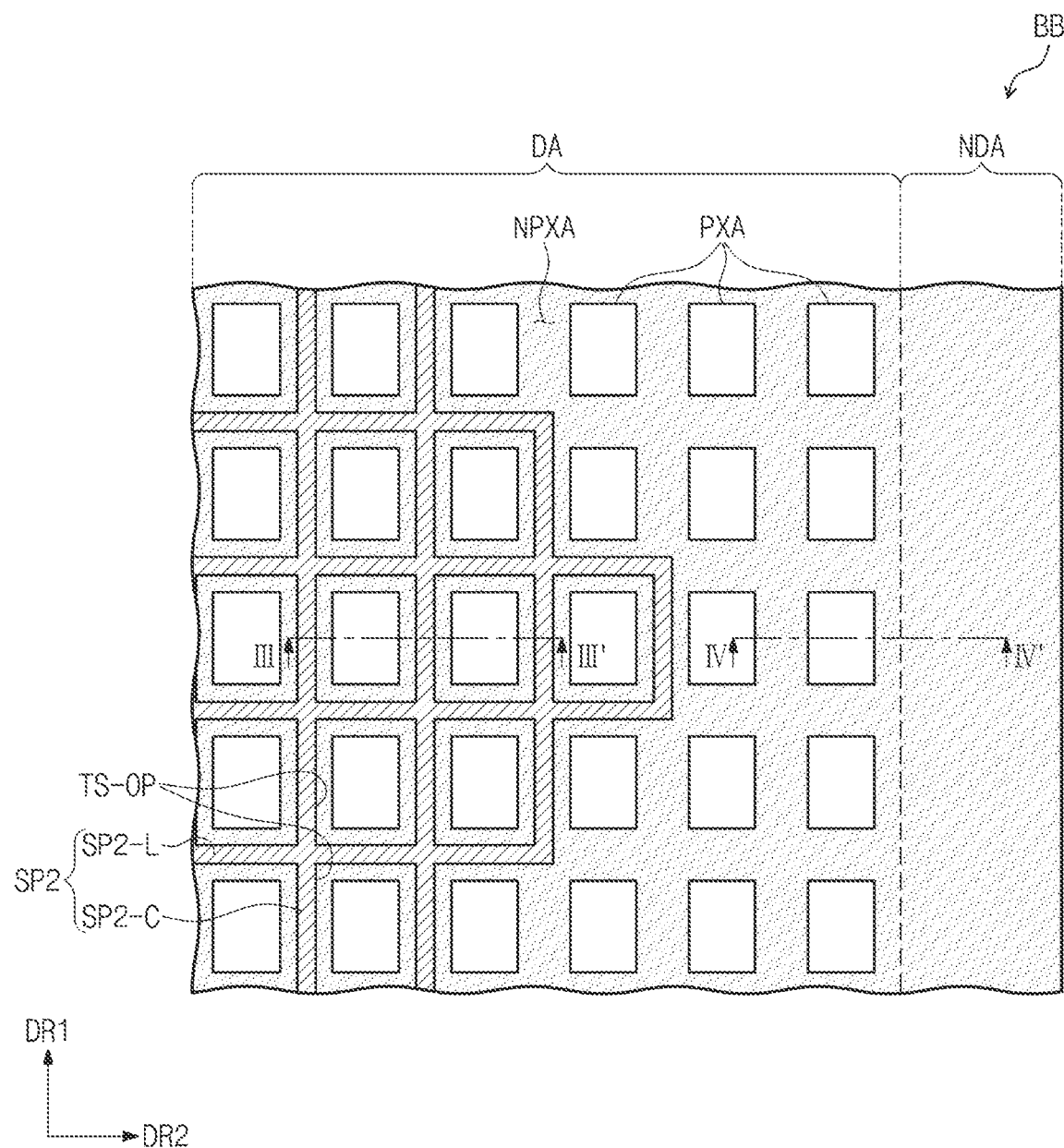
FIG. 13A is a partial enlarged view of area BB in FIG. 11B, according to one or more exemplary embodiments.
Figure 13B:
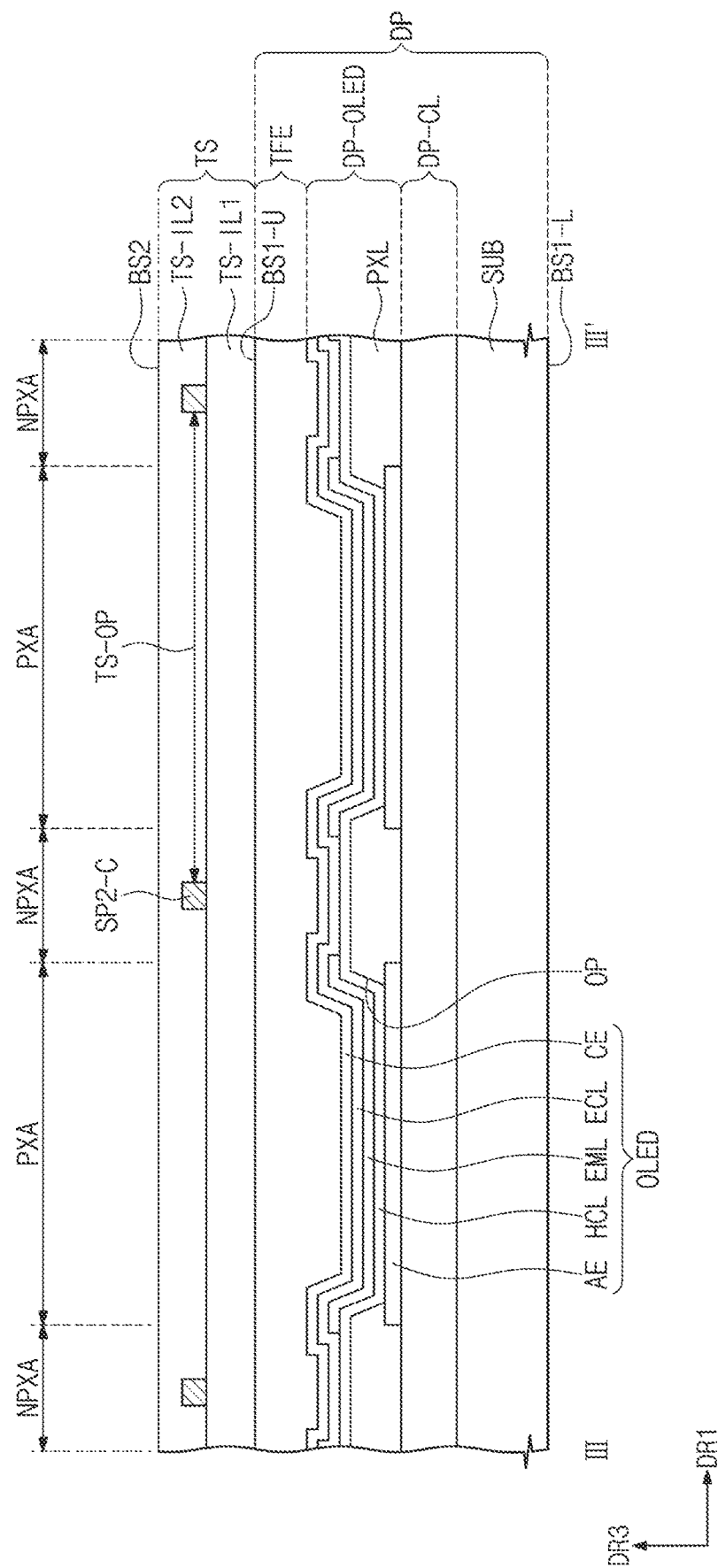
FIGS. 13B and 13C are partial cross-sectional views of FIG. 13A respectively taken along sectional lines and IV-IV', according to one or more exemplary embodiments.
Figure 13C:
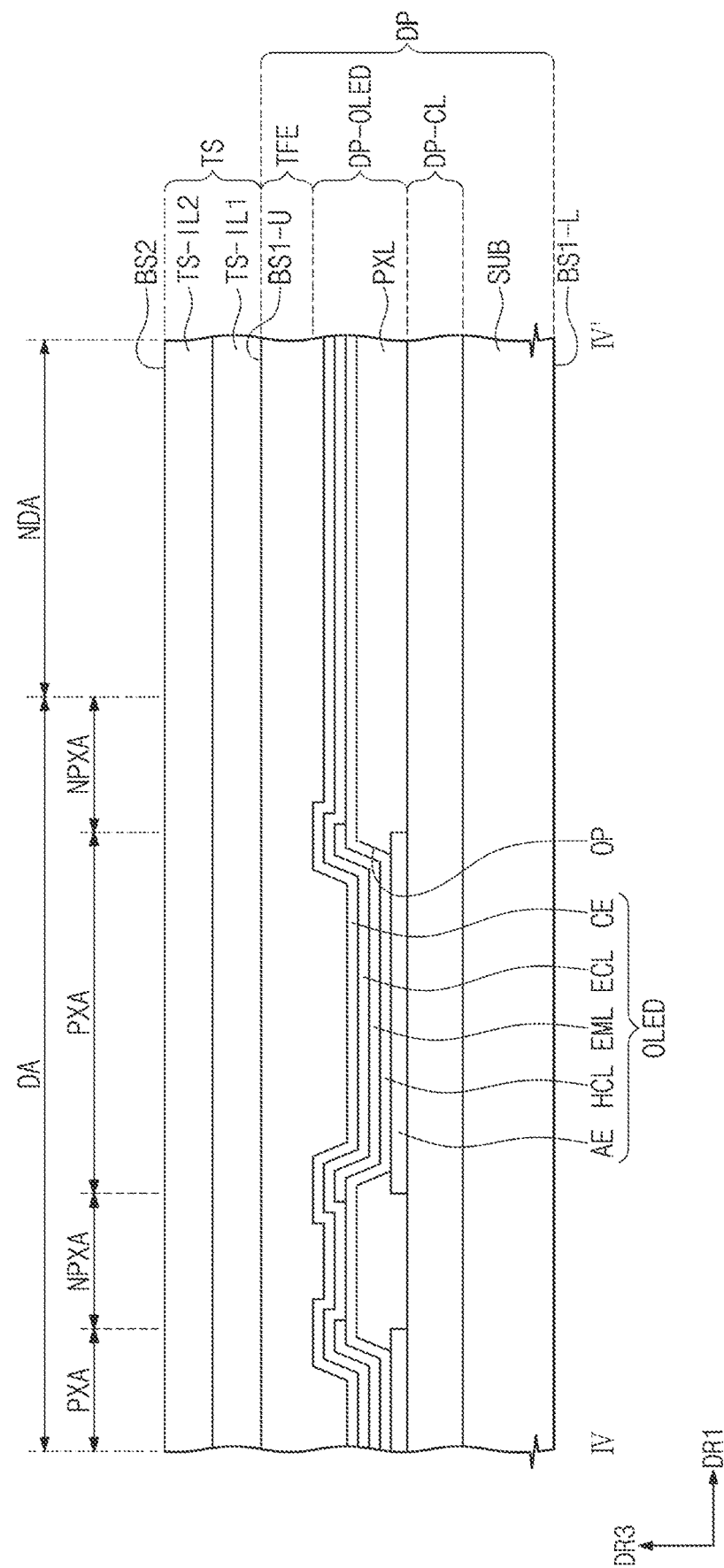
Figure 14A:
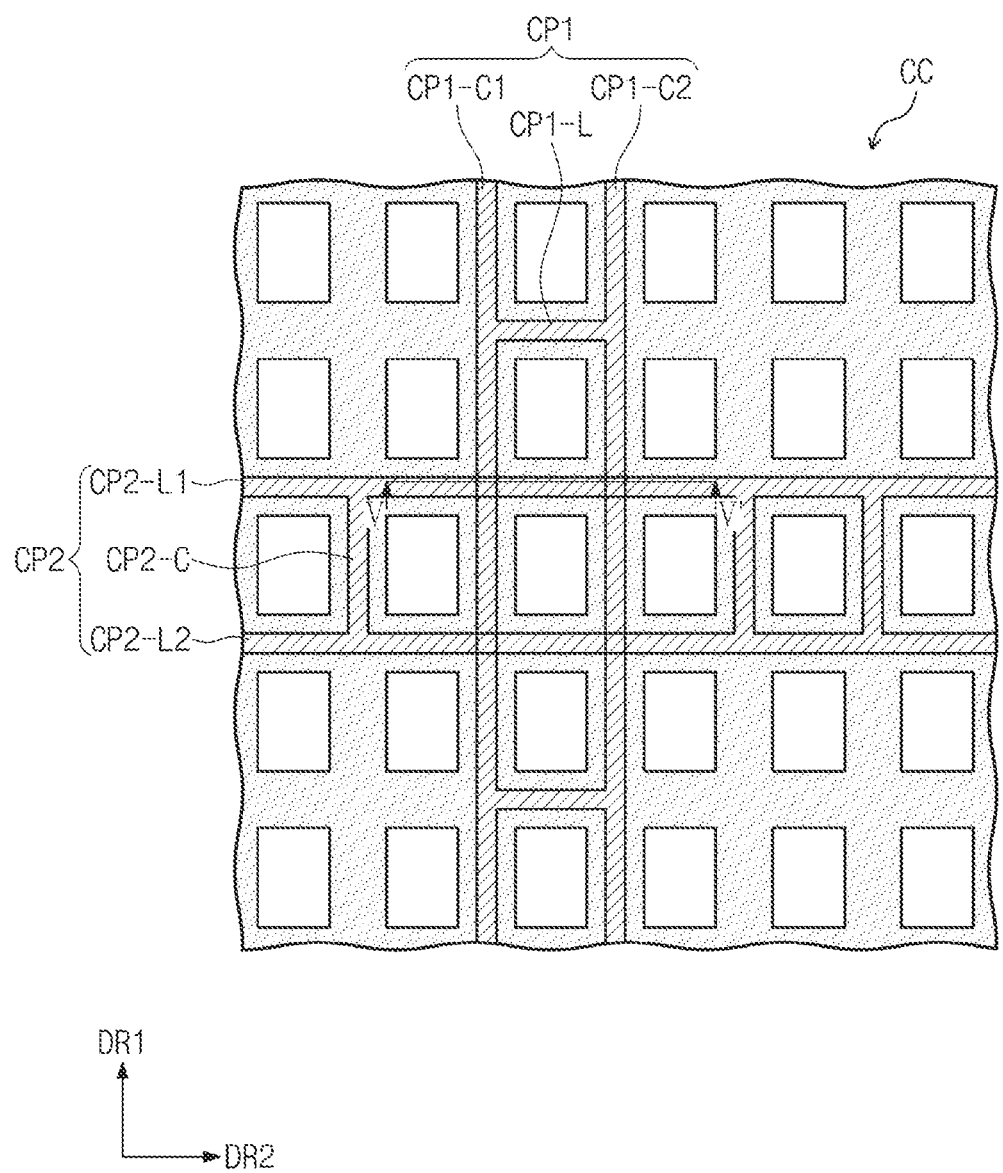
FIG. 14A is a partial enlarged view of area CC in FIG. 11B, according to one or more exemplary embodiments.
Figure 14B:
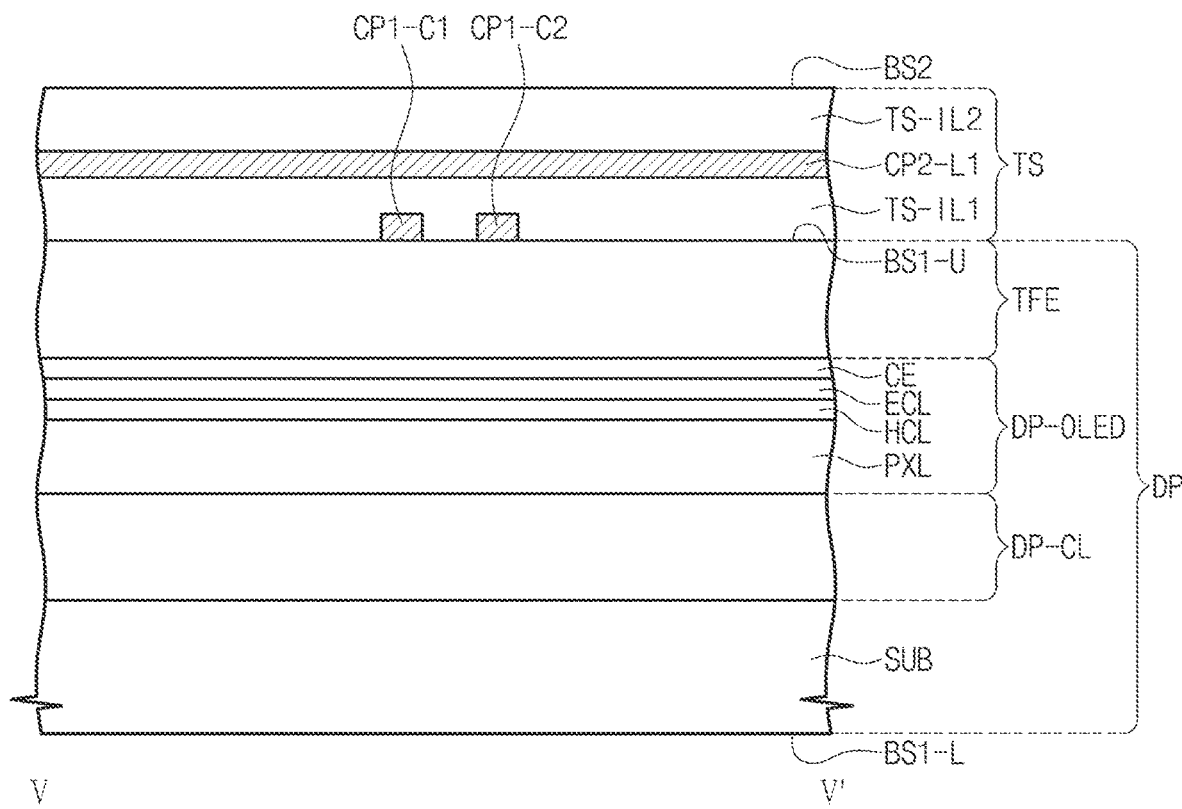
FIG. 14B is a partial cross-sectional view of FIG. 14A taken along sectional line V-V', according to one or more exemplary embodiments.

FIGS. 11A and 11B are plan views illustrating the conductive layers TS-CL1 and TS-CL2 of the touch detection member TS, according to one or more exemplary embodiments. FIG. 12A is a partial enlarged view of area AA of FIG. 11A, according to one or more exemplary embodiments. FIGS. 12B and 12C are partial cross-sectional views of FIG. 12A respectively taken along sectional lines I-I' and II-IF, according to one or more exemplary embodiments. FIG. 13A is a partial enlarged view of area BB of FIG. 11B, according to one or more exemplary embodiments. FIGS. 13B and 13C are partial cross-sectional views of FIG. 13A respectively taken along sectional lines III-III' and IV-IV', according to one or more exemplary embodiments. FIG. 14A is a partial enlarged view of area CC of FIG. 11B, according to one or more exemplary embodiments. FIG. 14B is a partial cross-sectional view of FIG. 14A taken along cross-sectional line V-V', according to one or more exemplary embodiments. It is noted that the touch sensing layer TS and the display panel layer DP of the constituents of the display device DD will be mainly illustrated and described in association with FIGS. 11A, 11B, 12A to 12C, 13A to 13C, 14A, and 14B. To this end, the circuit layer DP-CL is schematically illustrated and will be described in association with FIGS. 12B, 12C, 13B, 13C, and 14B.

According to one or more exemplary embodiments, a two-layer capacitive touch detection member is illustrated as an example. A two-layer capacitive touch sensing layer may acquire coordinate information at a touched point (or a hovering touch interaction) in a self-capacitance manner or a mutual capacitance manner. Exemplary embodiments, however, are not limited to or by the driving manner for acquiring the coordinate information. The first conductive patterns of FIG. 11A may correspond to the first conductive layer TS-CL1 of FIGS. 10A to 10C, and the second conductive patterns of FIG. 11B may correspond to the second conductive layer TS-CL2 of FIGS. 10A to 10C.

As illustrated in FIG. 11A, the first conductive patterns may include first touch electrodes TE1-1 to TE1-3 and first touch signal lines SL1-1 to SL1-3. Three first touch electrodes TE1-1 to TE1-3 and three first touch signal lines SL1-1 to SL1-3 respectively connected to the three first touch electrodes TE1-1 to TE1-3 are illustrated in FIG. 11A. It is contemplated, however, that any suitable number of first touch electrodes and first touch signal lines may be utilized in association with exemplary embodiments described herein.

The first touch electrodes TE1-1 to TE1-3 extend in the first direction DR1 and are arranged in the second direction DR2. Each of the first touch electrodes TE1-1 to TE1-3 may have a mesh shape in which a plurality of touch openings are defined. The mesh shape will be described later in more detail. Each of the first touch electrodes TE1-1 to TE1-3 includes a plurality of first sensing parts SP1 and a plurality of first connection parts CP1. The first sensing parts SP1 are arranged in the first direction DR1. Each of the first connection parts CP1 connects two first sensing parts SP1, which are adjacent to each other, of the first sensing parts SP1. Although not illustrated, each of the first touch signal lines SL1-1 or SL1-3 may also have a mesh shape. The first touch signal lines SL1-1 to SL1-3 may have the same layered structure as the first touch electrodes TE1-1 to TE1-3.

Referring to FIG. 11B, the second conductive patterns may include second touch electrodes TE2-1 to TE2-3 and second touch signal lines SL2-1 to SL2-3. Three second touch electrodes TE2-1 to TE2-3 and three second touch signal lines SL2-1 to SL2-3 respectively connected to the three second touch electrodes TE2-1 to TE2-3 are illustrated in FIG. 11B. It is contemplated, however, that any suitable number of second touch electrodes and second touch signal lines may be utilized in association with exemplary embodiments described herein. The second touch electrodes TE2-1 to TE2-3 are insulated from the first touch electrodes TE1-1 to TE1-3 and cross the first touch electrodes TE1-1 to TE1-3. Each of the second touch electrodes TE2-1 to TE2-3 may have a mesh shape in which a plurality of touch openings are defined.

Each of the second touch electrodes TE2-1 to TE2-3 includes a plurality of second sensing parts SP2 and a plurality of second connection parts CP2. The second sensing parts SP2 are arranged in the second direction DR2. Each of the second connection parts CP2 connects two second sensing parts SP2, which are adjacent to each other, of the second sensing parts SP2. Although not illustrated, each of the second touch signal lines SL2-1 or SL2-3 may also have a mesh shape. The second touch signal lines SL2-1 to SL2-3 may have the same layered structure as the second touch electrodes TE2-1 to TE2-3.

According to one or more exemplary embodiments, the first touch electrodes TE1-1 to TE1-3 and the second touch electrodes TE2-1 and TE2-3 are capacitively coupled to each other. Since touch detection signals are applied to the first touch electrodes TE1-1 to TE1-3, capacitors are formed (or disposed) between the first sensing parts SP1 and the second sensing parts SP2. The shapes of the first touch electrodes TE1-1 to TE1-3 and the second touch electrodes TE2-1 to TE2-3 that include the respective sensing parts and the respective connection parts of FIGS. 11A to 11B are merely examples, and, as such, exemplary embodiments are not limited thereto or thereby. For example, the connection parts may only be defined as portions at which the first touch electrodes TE1-1 to TE1-3 and the second touch electrodes TE2-1 to TE2-3 cross each other, and the sensing parts may only be defined as portions at which the first touch electrodes TE1-1 to TE1-3 and the second touch electrodes TE2-1 to TE2-3 overlap each other. In one or more exemplary embodiments, each of the first touch electrodes TE1-1 to TE1-3 and the second touch electrodes TE2-1 to TE2-3 may have a bar shape having a determined width.

As illustrated in FIG. 12A, the first sensing parts SP1 overlap with the non-light emitting area NPXA. The first sensing parts SP1 include a plurality of first vertical portions SP1-C extending in the first direction DR1 and a plurality of first horizontal portions SP1-L extending in the second direction DR2. The plurality of first vertical portions SP1-C and the plurality of first horizontal portions SP1-L may be defined as mesh lines. Each of the mesh lines may have a line width of several micrometers.

The plurality of first vertical portions SP1-C and the plurality of first horizontal portions SP1-L may be connected to each other to define a plurality of touch openings TS-OP. That is, the first sensing parts SP1 may have a mesh shape having the plurality of touch openings TS-OP. Although the structure in which the touch openings TS-OP are shown as having one-to-one correspondence with the light emitting areas PXA, exemplary embodiments are not limited thereto or thereby. For instance, a touch opening TS-OP may correspond to two or more light emitting areas PXA.

As illustrated in FIGS. 12B and 12C, the first touch insulation layer TS-IL1 overlaps with the display area DA and the non-display area NDA. The first touch insulation layer TS-IL1 is disposed on the second display panel surface BS1-U to cover the first sensing part SP1 (the first horizontal portions SP1-L are shown in FIG. 12B as being covered by the first touch insulation layer TS-IL1). Although not separately shown, the first touch insulation layer TS-IL1 may cover the first connection parts CP1 and the first touch signal lines SL1-1 to SL1-3. In one or more exemplary embodiments, the second display panel surface BS1-U is provided by the thin film encapsulation layer TFE. The second touch insulation layer TS-IL2 is disposed on the first touch insulation layer TS-IL1 to overlap with the display area DA and the non-display area NDA. The second touch insulation layer TS-IL2 provides the first base surface BS2.

Referring to FIGS. 13A to 13C, the second sensing parts SP2 are disposed on the first touch insulation layer TS-IL1 The second sensing parts SP2 overlap the non-light emitting area NPXA. The second sensing parts SP2 include a plurality of second vertical portions SP2-C extending in the first direction DR1 and a plurality of second horizontal portions SP2-L extending in the second direction DR2. The plurality of second vertical portions SP2-C and the plurality of second horizontal portions SP2-L may be connected to each other to define a plurality of touch openings TS-OP. That is, the second sensing parts SP2 have a mesh shape. The second touch insulation layer TS-IL2 is disposed on the first touch insulation layer TS-IL1 to cover the second sensing parts SP2. As seen in FIG. 13B, the second vertical portions SP2-C are shown as being covered by the second touch insulation layer TS-IL2. Although not separately shown, the second touch insulation layer TS-IL2 may cover the second connection parts CP2 and the second touch signal lines SL2-1 to SL2-3.

FIG. 14 illustrates an overlapping portion of the conductive layers of FIGS. 11A and 11B. As illustrated in FIGS. 14A and 14B, the first connection part CP1 may include third vertical portions CP1-C1 and CP1-C2 disposed on the thin film encapsulation layer TFE and third horizontal portions CP1-L connecting the third vertical portions CP1-C1 and CP1-C2 to each other. Although two third vertical portions CP1-C1 and CP1-C2 are illustrated, exemplary embodiments are not limited thereto or thereby. The second connection parts CP2 may include fourth horizontal portions CP2-L1 and CP2-L2 disposed on the first touch insulation layer TS-IL1 and fourth vertical portions CP2-C connecting the fourth horizontal portions CP2-L1 and CP2-L2 to each other. The first connection parts CP1 may have a mesh shape, and the second connection parts CP2 may also have a mesh shape. Although two fourth horizontal portions CP2-L1 and CP2-L2 are illustrated, exemplary embodiments are not limited thereto or thereby.

As described above, since each of the first touch electrodes TE1-1 to TE1-3 and the second touch electrodes TE2-1 to TE2-3 has a mesh shape, and the plurality of touch openings are defined in the first and second insulation layers TS-IL1 and TS-IL2, the flexible display device DD may be improved in flexibility. When the flexible display device DD is bent, tension stress/compression stress applied to the first touch electrodes TE1-1 to TE1-3 and the second touch electrodes TE2-1 to TE2-3 may be reduced, which may prevent (or at least reduce) the potential of the touch electrodes from being cracked.

Figure 15A:
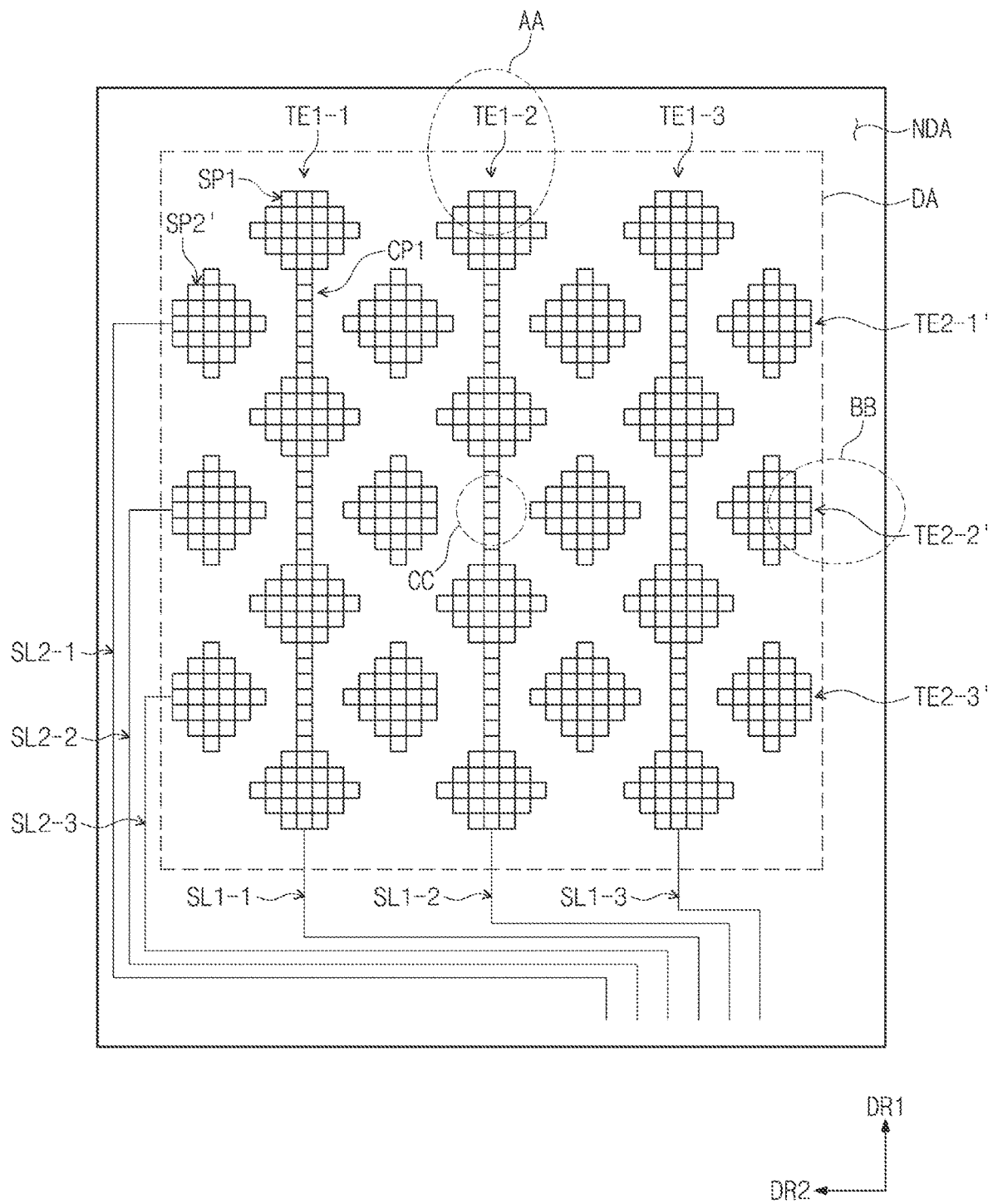
FIGS. 15A and 15B are plan views illustrating conductive layers of a touch detection member, according to one or more exemplary embodiments.
Figure 15B:
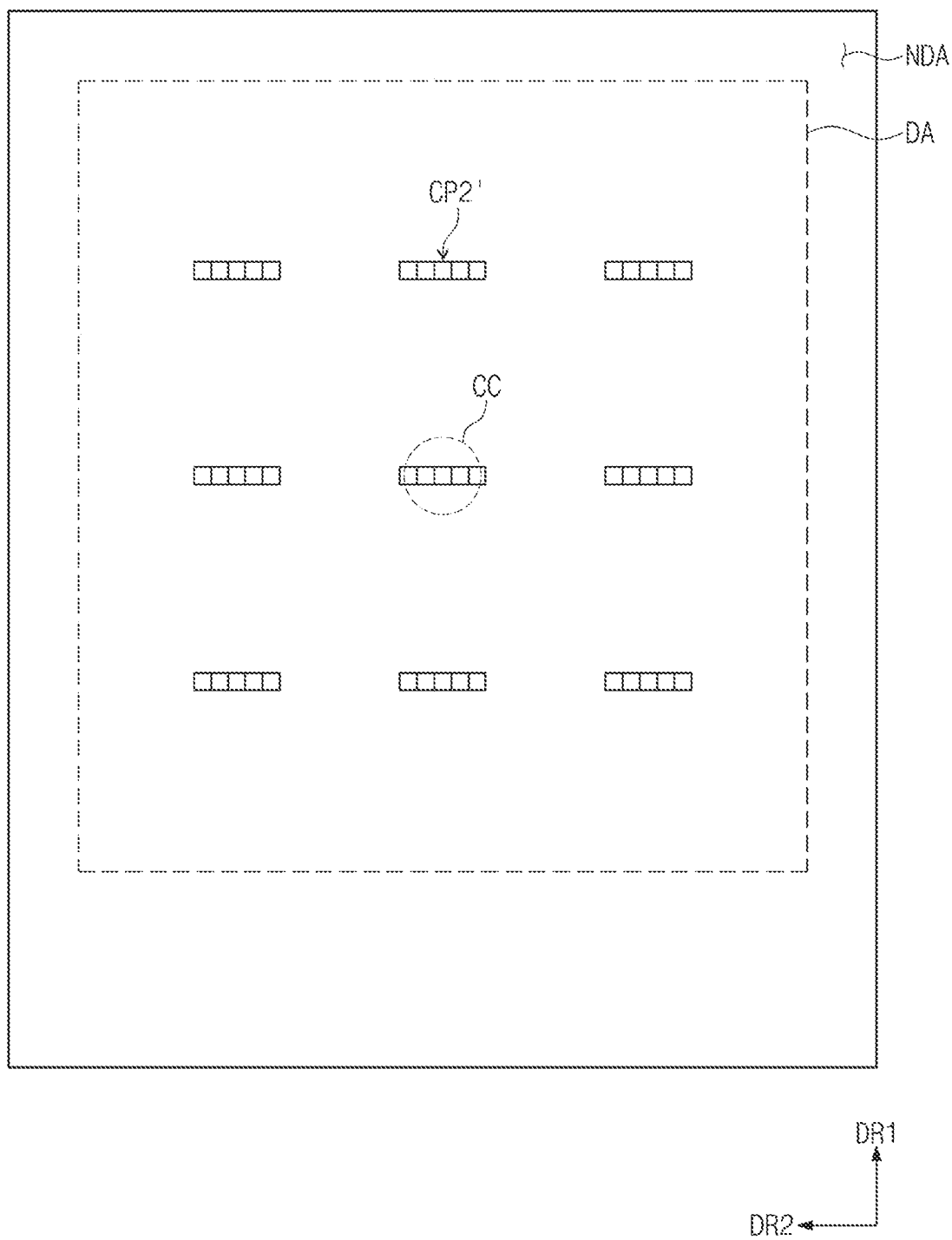
Figure 15C:
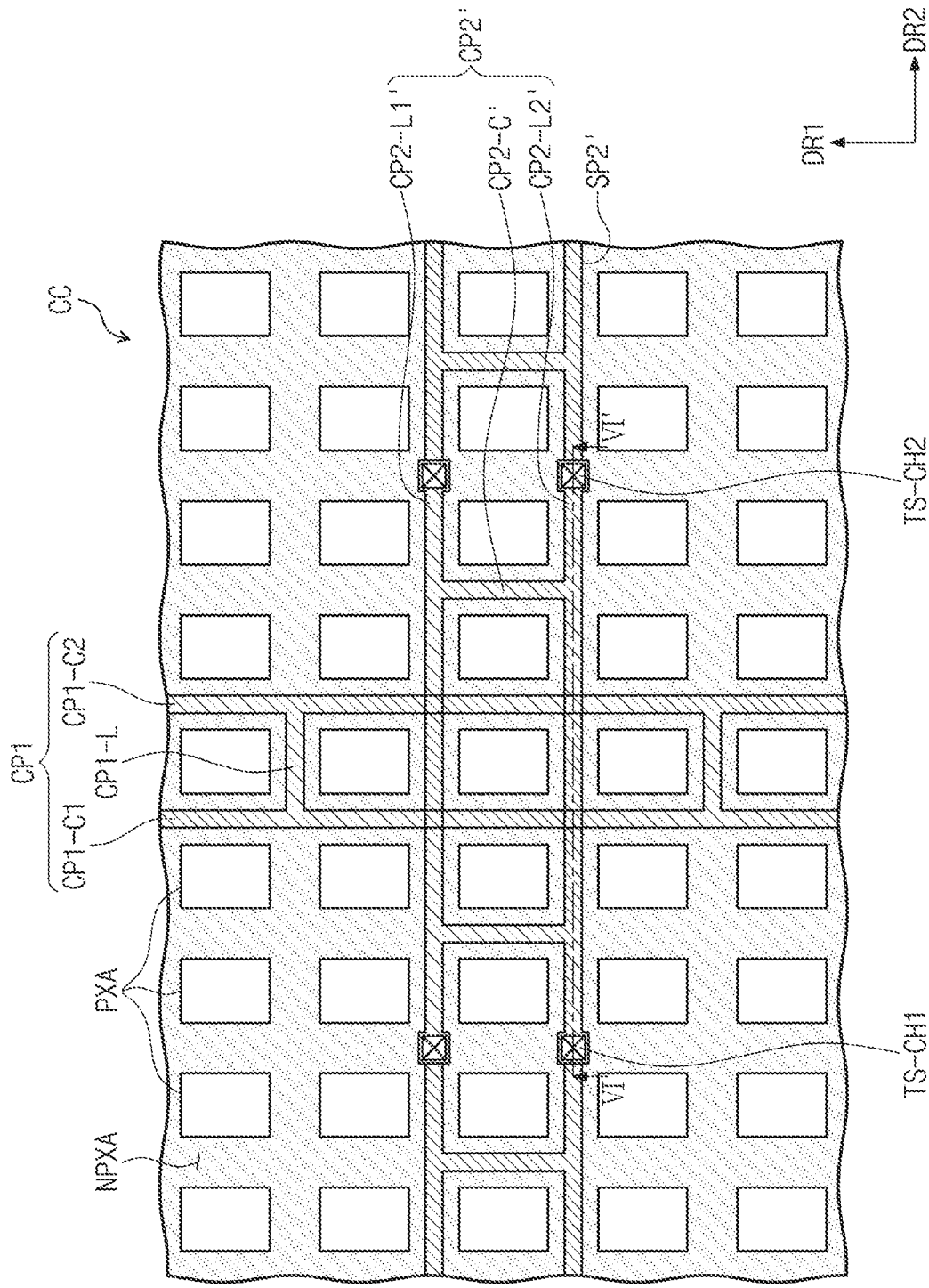
FIG. 15C is a partial enlarged view of area CC in FIG. 15B, according to one or more exemplary embodiments.
Figure 15D:
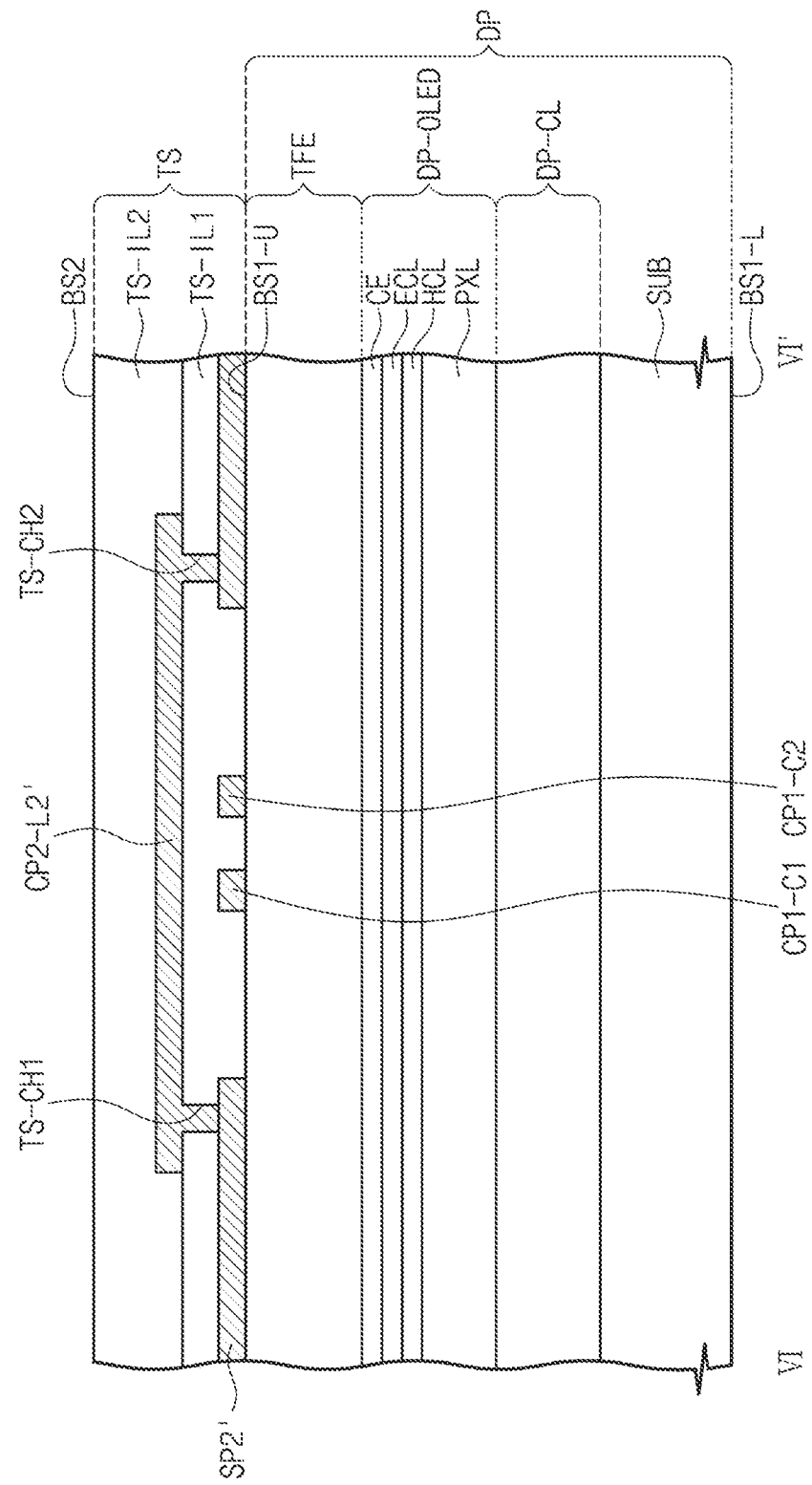
FIG. 15D is a partial cross-sectional view of FIG. 15C taken along sectional line VI-VI', according to one or more exemplary embodiments.

FIGS. 15A and 15B are plan views illustrating conductive layers of a touch detection member, according to one or more exemplary embodiments. FIG. 15C is a partial enlarged view of area CC in FIG. 15B, according to one or more exemplary embodiments. FIG. 15D is a partial cross-sectional view of FIG. 15C taken along sectional line VI-VI', according to one or more exemplary embodiments. The structures illustrated in FIGS. 15A to 15D are similar to the structures of FIGS. 11A, 11B, 14A, and 14B, and, as such, duplicative descriptions have been omitted to avoid obscuring exemplary embodiments described herein. In this manner, differences are primarily described below.

According to one or more exemplary embodiments, a single layer capacitive touch detection member is illustrated. The single layer capacitive touch detection member may be driven in a self-capacitance manner. It is contemplated, however, that exemplary embodiments are not limited to or by the driving manner to acquire the coordinate information associated with touch event detection. In one or more exemplary embodiments, the first conductive patterns of FIG. 15A may correspond to the first conductive layer TS-CL1 of FIGS. 10A to 10C, and the second conductive patterns of FIG. 15B may correspond to the second conductive layer TS-CL2 of FIGS. 10A to 10C. In one or more exemplary embodiments, the first conductive patterns of FIG. 15A may correspond to the second conductive layer TS-CL2 of FIGS. 10A to 10C, and the second conductive patterns of FIG. 15B may correspond to the first conductive layer TS-CL1 of FIGS. 10A to 10C.

As illustrated in FIG. 15A, the first conductive patterns may include first touch electrodes TE1-1 to TE1-3, first touch signal lines SL1-1 to SL1-3, second sensing parts SP2' of second touch electrodes TE2-1' to TE2-3', and second touch signal lines SL2-1 to SL2-3. Each of the first touch electrodes TE1-1 to TE1-3 includes a plurality of first sensing parts SP1 and a plurality of first connection parts CP1. As illustrated in FIG. 15B, the second conductive patterns may include a plurality of second connection parts CP2' of the second touch electrodes TE2-1' to TE2-3'. Each of the second connection parts CP2' may have a bridge function.

Referring to FIGS. 15C and 15D, the second connection parts CP2' electrically connect two second sensing parts SP2', which are adjacent to each other in the second direction DR2, of the second sensing parts SP2' through first and second through holes TS-CH1 and TS-CH2 passing through the first touch insulation layer TS-IL1 In one or more exemplary embodiments, the plane of the first touch insulation layer TS-IL1 may be changed in shape. The first touch insulation layer TS-IL1 may not cover the entire display area DA. For instance, the first touch insulation layer TS-IL1 may only overlap the plurality of second connection parts CP2' of FIG. 15B. Also, the first touch insulation layer TS-IL1 may include a plurality of insulation patterns disposed to correspond to the plurality of second connection parts CP2'.

The conductive patterns of the touch detection member TS, according to one or more exemplary embodiments, are illustrated in FIGS. 11A to 15D. The exemplary embodiments of the touch detection member TS are not limited to or by the constituents of the touch detection member TS illustrated in FIGS. 11A to 15D. For instance, the touch detection member TS may further include a noise shield pattern for reducing noise and dummy patterns for improving optical balance.

Figure 16A:
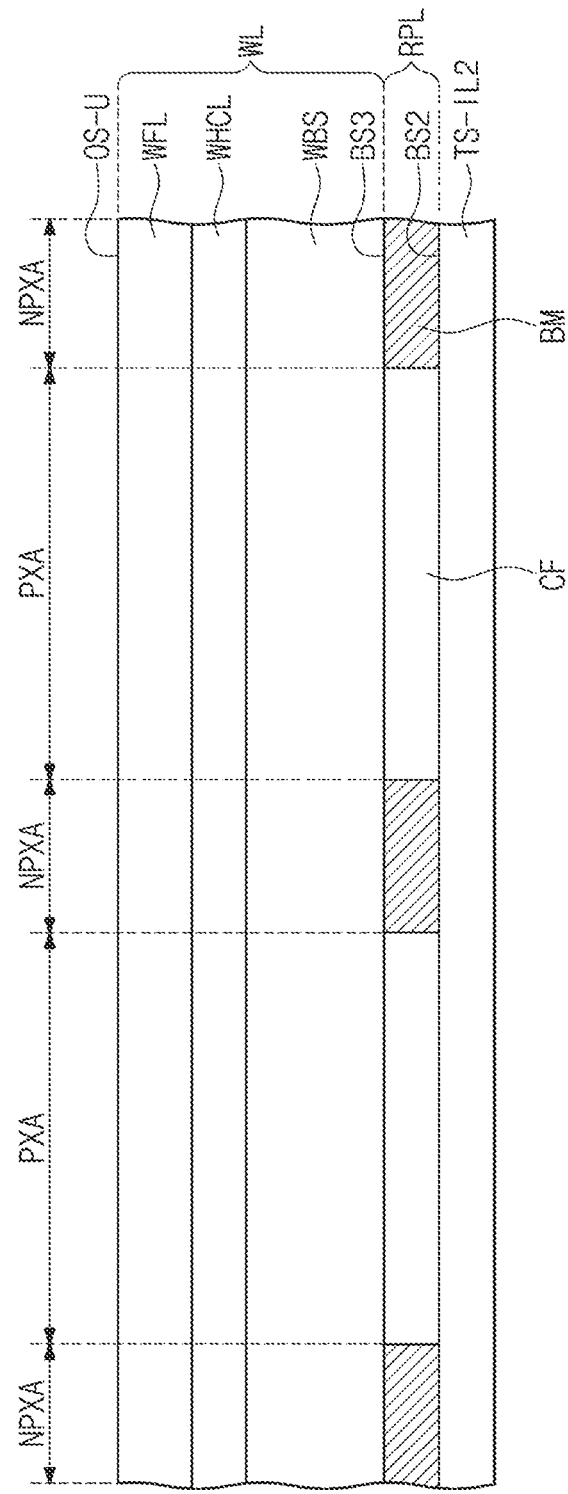
FIGS. 16A, 16B, and 16C are partial cross-sectional views of display devices, according to one or more exemplary embodiments.
Figure 16B:
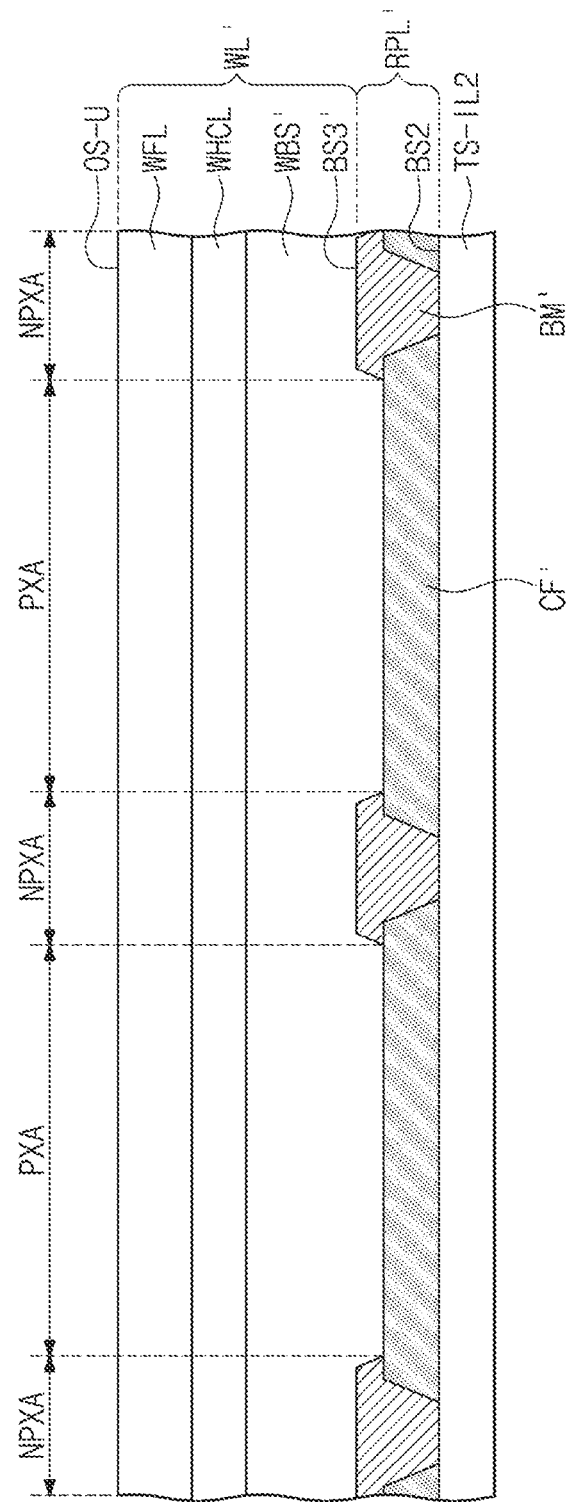
Figure 16C:
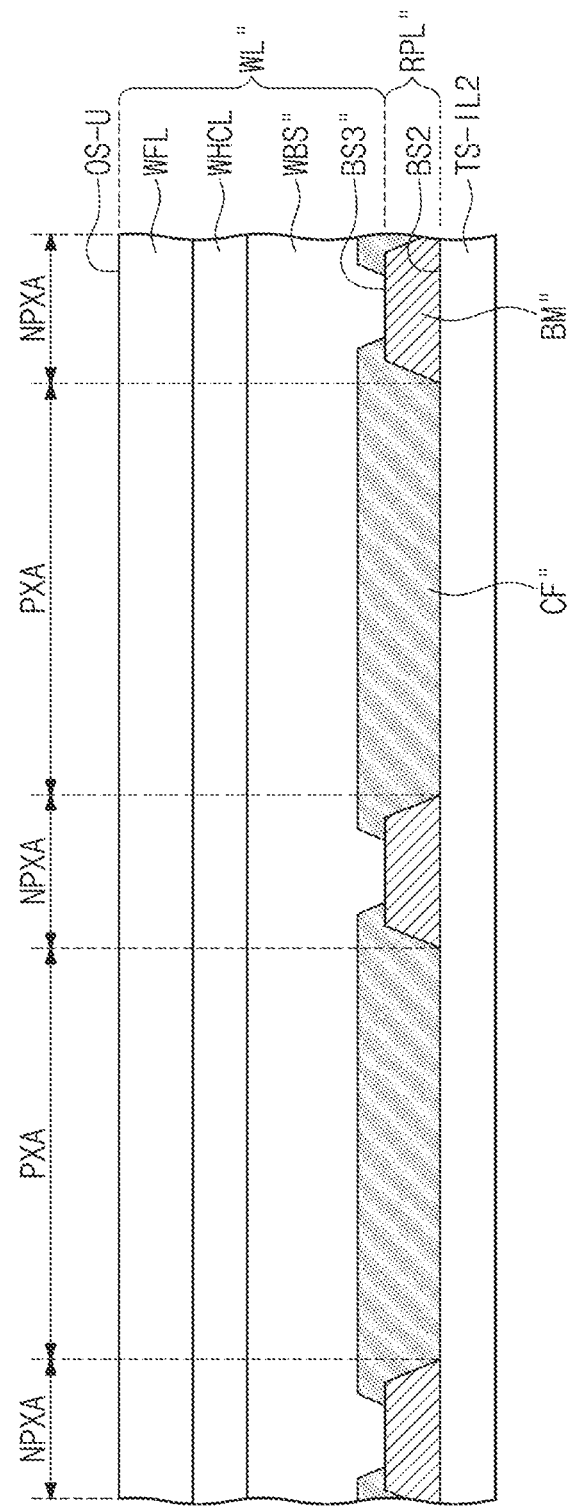

FIGS. 16A to 16C are partial cross-sectional views of a display device, according to one or more exemplary embodiments. The touch sensing layer TS, the reflection prevention layer RPL, and the window layer WL of the various constituents of a display device are illustrated in FIGS. 16A to 16C. The second touch insulation layer TS-IL2 is illustrated as a portion of the touch sensing layer TS.

As illustrated in FIG. 16A, the reflection prevention layer RPL is disposed on the first base surface BS2. The reflection prevention layer RPL includes a black matrix BM disposed on the first base surface BS2 and a plurality of color filters CF. The black matrix BM overlaps with the non-light emitting area NPXA, and the color filters CF respectively overlap with the light emitting areas PXA. The color filters CF may include plural groups of color filters. For example, the color filters CF may include red color filters, green color filters, and blue color filters. The color filters CF may include a gray filter. It is contemplated, however, that any suitable colors for the color filters CF may be utilized in association with exemplary embodiments described herein. Although not separately shown, the black matrix BM may also overlap with the non-display area NDA (see FIG. 5).

The black matrix BM may be formed of a material that is capable of blocking light. For example, the black matrix BM may be formed of an organic material having relatively high light absorption. The black matrix BM may include a black pigment or a black dye. The black matrix BM may include a photosensitive organic material, e.g., a coloring, such as a pigment or a dye. The black matrix BM may have a single or multi-layer structure.

In one or more exemplary embodiments, the black matrix BM and the color filters CF may have the same thickness as one another and form a single layer. The black matrix BM and the color filters CF may provide the second base surface BS3. Exemplary embodiments, however, are not limited thereto or thereby. For example, the black matrix BM and the color filters CF may provide the second base surface BS3 including stepped areas.

The color filters CF may allow light emitted from the organic light emitting devices OLED to be transmitted and reduce reflectance of light (hereinafter, referred to as external light) incident from the outside. The external light passes through the color filters CF, and, as such, may be reduced in intensity by about ⅓. A portion of light passing through the color filters CF may be dissipated, and a portion of the light may be reflected by the constituents disposed under the color filters CF, e.g., the organic light emitting device layer DP-OLED and the thin film encapsulation layer TFE. The reflected light may be incident again into the color filters CF. The reflected light is reduced in brightness while passing through the color filters CF. As a result, only a portion of the external light may be reflected from the display device. That is, the external light is reduced in reflectance.

The window layer WL is disposed on the second base surface BS3. The window layer WL includes a window protection layer WBS, a hard coating layer WHCL, and a functional coating layer WFL. The window protection layer WBS may serve as a layer having a planarization function and may be formed of an organic material. The window protection layer WBS may be formed of at least one of a polyimide-based resin, an acrylic-based resin, a methacrylic-based resin, a polyisoprene-based resin, a vinyl-based resin, an epoxy-based resin, a urethane-based resin, a cellulose-based resin, and a perylene-based resin. However, exemplary embodiments are not limited thereto or thereby. For example, the window protection layer WBS may be formed of an organic/inorganic composite material.

The hard coating layer WHCL increases hardness of the window layer WL. The hard coating layer WHCL may be formed of a silicon-based polymer. Exemplary embodiments are not limited to or by the material for the hard coating layer WHCL, and, as such, the hard coating layer WHCL may be formed of any suitable hard coating materials. Although not illustrated, the function coating layer WFL may include a fingerprint layer, a reflection prevention layer, and a self-restoring layer.

According to one or more exemplary embodiments, one of the window protection layer WBS, the hard coating layer WHCL, and the functional coating layer WFL may be omitted or provided in plurality. It is also contemplated that the window protection layer WBS, the hard coating layer WHCL, and the functional coating layer WFL may be changed in stacking order.

In one or more exemplary embodiments, each of the window protection layer WBS, the hard coating layer WHCL, and the functional coating layer WFL may be directly disposed on a layer, which is disposed under the corresponding layer, through the continuous process. Each of the window protection layer WBS, the hard coating layer WHCL, and the functional coating layer WFL may be formed in a coating or printing manner. It is also contemplated that each of the window protection layer WBS, the hard coating layer WHCL, and the functional coating layer WFL may be formed through roll coating, silkscreen coating, spray coating, and/or slit coating.

The display devices of FIGS. 16B and 16C are similar to the display device of FIG. 16A, and, as such, duplicative descriptions have been omitted to avoid obscuring exemplary embodiments described herein. In this manner, differences are primarily described below.

As illustrated in FIG. 16B, a black matrix BM' overlaps with a non-light emitting area NPXA, and color filters CF' respectively overlap with light emitting areas PXA. The color filters CF' may partially overlap with a non-light emitting area NPXA. The color filters CF' may be formed on the first base surface BS2, and, then, the black matrix BM' may be formed overlapping with portions of the color filters CF'. The color filters CF' and the black matrix BM' may be formed through exposure and developing processes. The black matrix BM' may have a greater height than that of each of the color filters CF'. The window protection layer WBS' may planarize a stepped portion defined as a result of the height differences between the black matrix BM' and the color filters CF'.

Referring to FIG. 16C, the black matrix BM" overlaps the non-light emitting area NPXA, and the color filters CF''' respectively overlap the light emitting areas PXA. The color filters CF''' may partially overlap the non-light emitting area NPXA. The black matrix BM" may be formed on a first base surface BS2, and, then, the color filters CF''' may be formed overlapping with portions of the black matrix BM". Each of the color filters CF''' may have a greater height than that of the black matrix BM". The window protection layer WBS" may planarize a stepped portion defined as a result of the height differences between the black matrix BM" and the color filters CF'''.

FIGS. 17A to 17E are cross-sectional views of display devices, according to one or more exemplary embodiments. The display devices of FIGS. 17A to 17E are similar to the display devices of FIGS. 1A to 16C, and, as such, duplicative descriptions will be omitted to avoid obscuring exemplary embodiments described herein. In this manner, primarily differences will be described below.

Figure 17A:
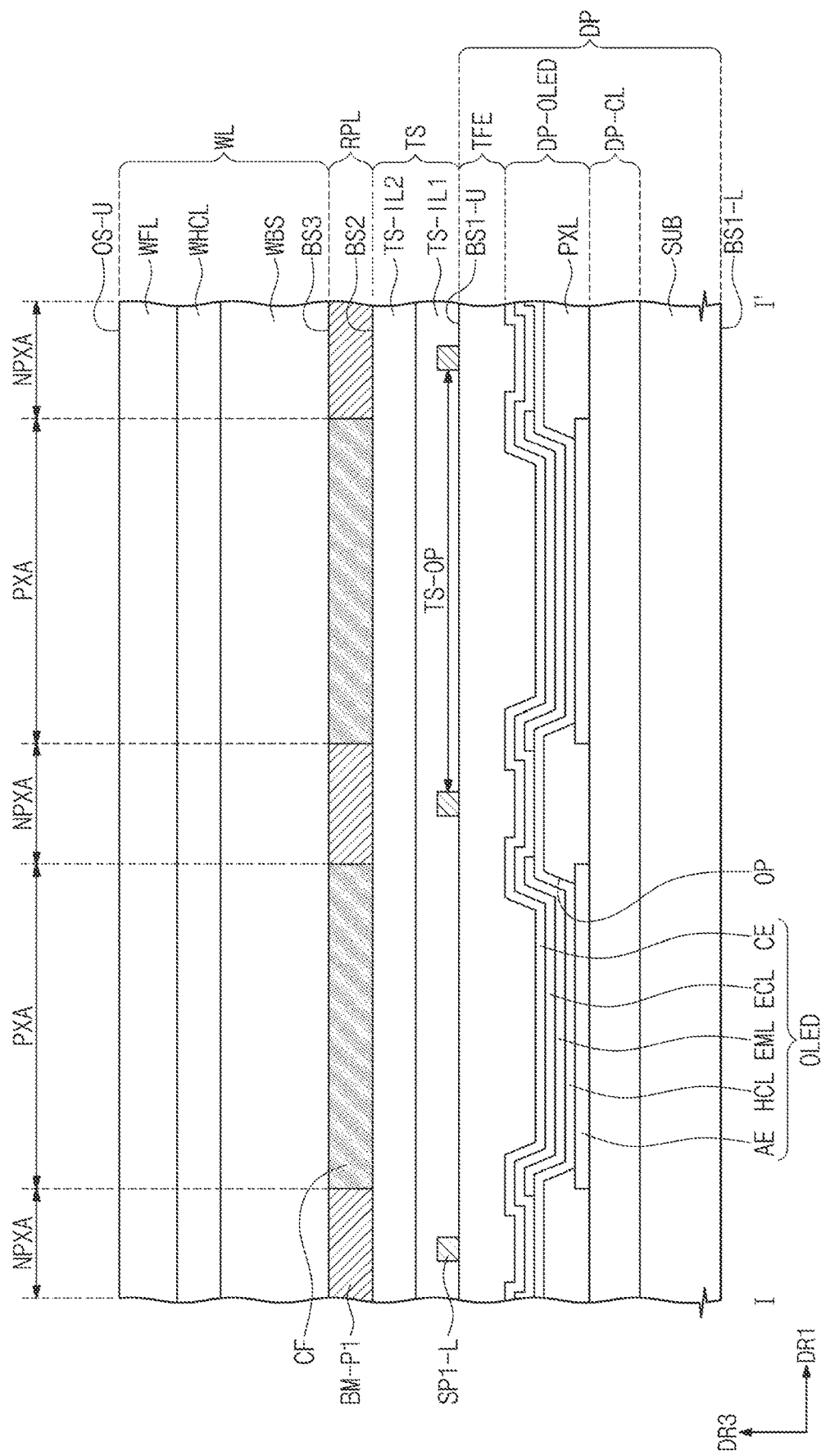

FIGS. 17A and 17B are cross-sectional views respectively taken along sectional line I-I' of FIG. 12A and sectional line II-II' of FIG. 12A. Black matrixes BM-P1 and BM-P2 and the color filters CF are disposed on the first base surface BS2. The black matrixes BM-P1 and BM-P2 overlap the non-light emitting area NPXA and the non-display area NDA, and the color filters CF respectively overlap the light emitting areas PXA.

The black matrixes BM-P1 and BM-P2 include a light shield portion BM-P1 overlapping the non-light emitting area NPXA and a bezel portion BM-P2 overlapping the non-display area NDA. The light shield portion BM-P1 has a first thickness TH1, and the bezel portion BM-P2 has a second thickness TH2 greater than the first thickness TH1. The bezel portion BM-P2 has light shield efficiency greater than that of the light shield portion BM-P1. The light shield portion BM-P1 may only have a thickness that is enough to prevent colors of light generated from the light emitting areas PXA from being mixed with each other. The bezel portion BM-P2, however, may have a higher light shield ratio so that the first touch signal lines SL1-1 to SL1-3 (see FIG. 11A) and the second touch signal lines SL2-1 to SL2-3 (see FIG. 11B) are not recognized by a user viewing the display device. In this manner, the bezel portion BM-P2 may have a thickness greater than that of the light shield portion BM-P1.

The light shield portion BM-P1 and the bezel portion BM-P2 may be integrated with each other. A pre-black matrix layer may be formed on the first base surface BS2 in areas disposed outside the areas where color filters CF will be formed, and, then, the pre-black matrix may be partially removed in areas in which the light shield portion BM-P1 will be formed. The pre-black matrix layer may be gradually reduced in thickness according to the areas to form an integrated black matrix having thicknesses different from each other according to the areas.

Figure 17C:
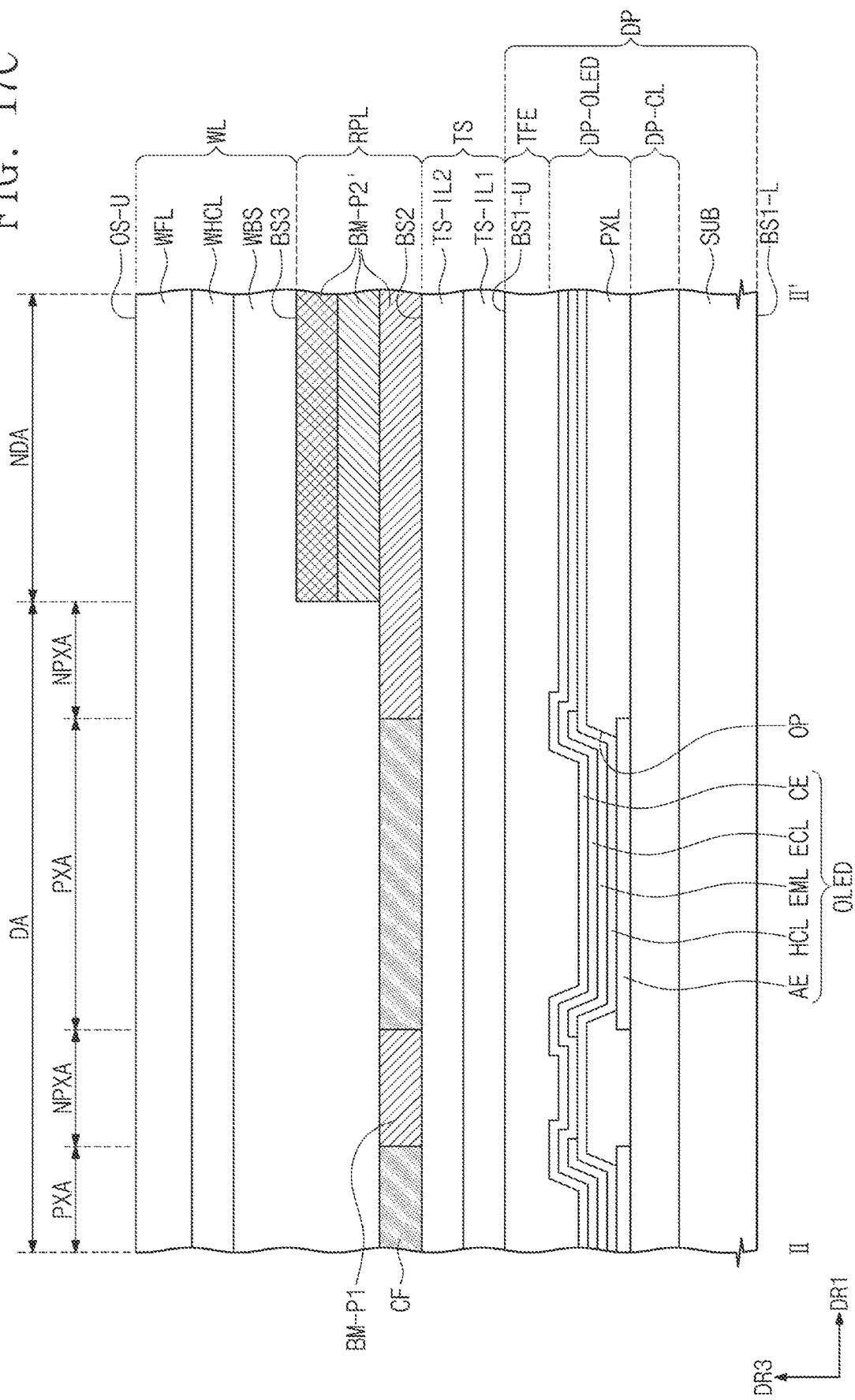
Figure 17D:
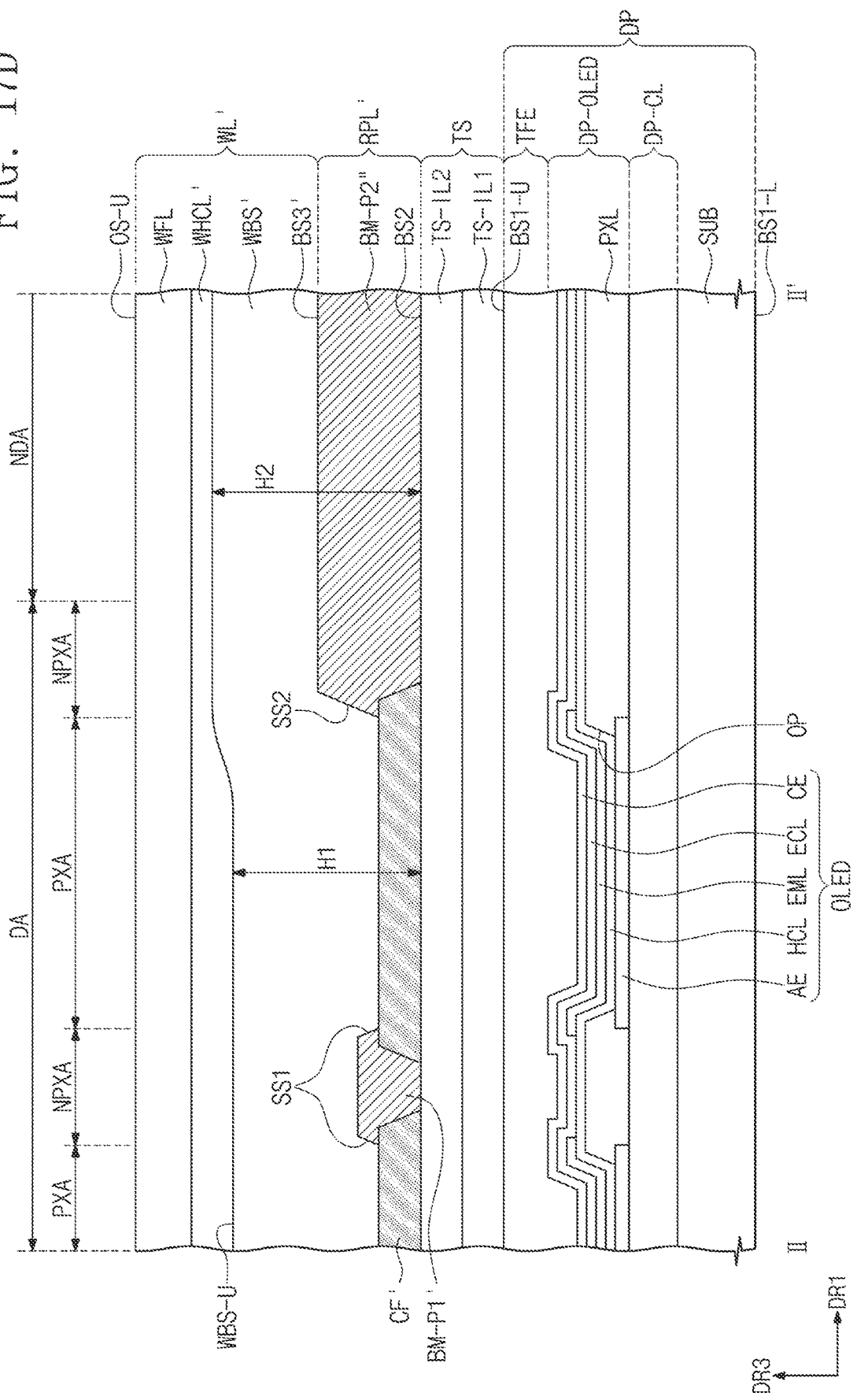
Figure 17E:
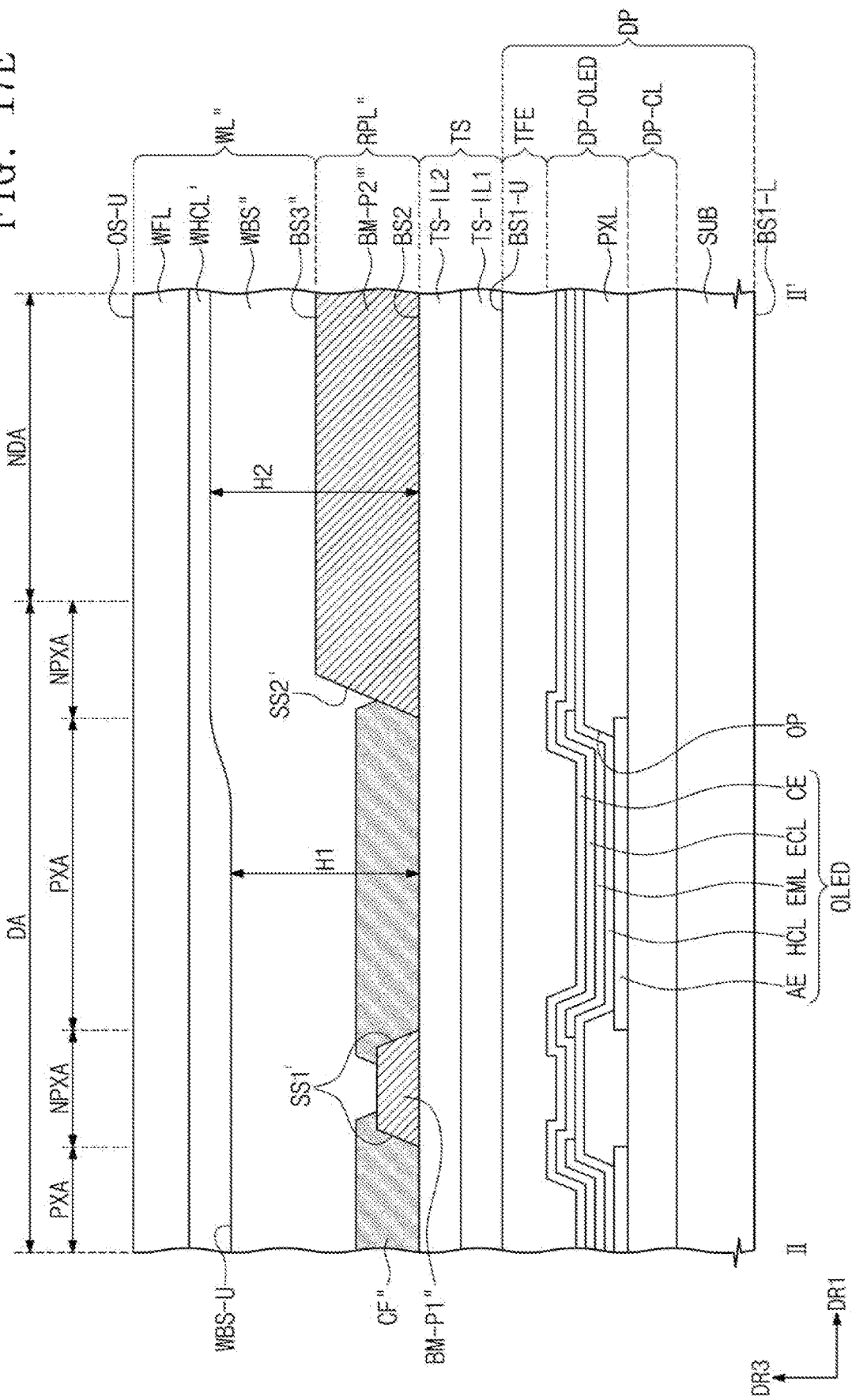

FIGS. 17C to 17E are cross-sectional views taken along sectional line II-II' of FIG. 12A. The display devices of FIGS. 17C to 17E are similar to the display devices of FIGS. 1A to 17B, and, as such, duplicative descriptions will be omitted to avoid obscuring exemplary embodiments described herein. In this manner, primarily differences will be described below. For instance, differences between the reflection prevention layers of FIGS. 17C to 17E and the reflection prevention layer of FIGS. 17A and 17B will be mainly described.

As illustrated in FIG. 17C, the bezel portion BM-P2' may include a plurality of layers. FIG. 17C illustrates an example of the bezel portion BM-P2' having a three-layer structure. The lowermost layer of the plurality of layers may have a shape that is integrated with the light shield portion BM-P1. The first preliminary layer may be formed and then patterned to form a first layer (the lowermost layer). A second preliminary layer and a third preliminary layer may be formed and then patterned to successively form a second layer and a third layer. The first to third preliminary layers may be successively formed and then differently patterned according to the areas to form the bezel portion BM-P2' having the three-layer structure and the light shield portion BM-P1 having the single-layer structure.

According to one or more exemplary embodiments, the first to third layers may be formed of the same material or materials different from each other. The first layer may include a black pigment or black dye, and each of the second and third layers may include a colored pigment or dye having a color different from the black color. The second and third layer may include a pigment or dye having the same color as one another. The second layer may be a decoration layer that provides a geometric pattern, such as a hair line or a weaving pattern. The decoration layer may increase the aesthetic appeal of the display device. The third layer may be an optical layer capable of adjusting reflectance or a reflection wavelength of the external light.

As illustrated in FIGS. 17D and 17E, each of the light shield portions BM-P1' and BM-P1" and the bezel portions BM-P2" and BM-P2''' may have an inclined side surface. The light shield portions BM-P1' and BM-P1" include first side surfaces SS1 and SS1' facing each other in the first direction DR1. The bezel portions BM-P2" and BM-P2''' include inclined second side surfaces SS2 and SS2'. Since the black matrix BM is directly formed on the second base surface BS2 through photolithographic processes, the side surfaces SS1, SS1', SS2, and SS2" may be inclined. The side surfaces SS1, SSI', SS2, and SS2' may be changed in shape according to the manufacturing order of the black matrixes BM-P1', BM-P1", BM-P2", and BM-P2''' and the color filters CF' and CF'''.

As illustrated in FIG. 17D, portions of the side surfaces SS1 and SS2, which are exposed from the color filters CF', may be inclined. Unlike the drawings, the inclinations of the exposed portions of the side surfaces SS1 and SS2 may be different from each other. Referring to FIG. 17E, the side surfaces SS1' and SS2' may have the same inclination as a whole. It is noted, however, that although the side surfaces SS1' and SS2' are shown with a uniform inclination, this is a merely an example. In one or more exemplary embodiments, the inclinations of the side surfaces SS1' and SS2' may be different from each other.

As illustrated in FIGS. 17D and 17E, a bottom surface (a surface contacting the second touch insulation layer TS-IL2) of each of the light shield portions BM-P1' and BM-P1" and the bezel portions BM-P2" and BM-P2''' may have a width greater than that of a top surface (the other surface opposing the surface contacting the second touch insulation layer TS-IL2) thereof. The width is measured in the first direction DR1.

In FIGS. 17D and 17E, only one second side surface SS2 and SS2' is illustrated, and the other inclined second side surface facing the one second side surface SS2 and SS2' in the first direction DR1 is not illustrated. The reflection prevention layer RPL' of FIG. 17D may be manufactured through the same method as that for manufacturing the reflection prevention layer RPL described with reference to FIG. 16B, and the reflection prevention layer RPL" of FIG. 17E may be manufactured through the same method as that for manufacturing the reflection prevention layer RPL" described with reference to FIG. 16C.

According to one or more exemplary embodiments, the bezel portions BM-P2" and BM-P2''' may extend toward the non-light emitting area NPXA. The bezel portions BM-P2" and BM-P2''' may be further disposed on the non-light emitting area NPXA that is adjacent to the non-display area NDA. The bezel portions BM-P2" and BM-P2''' may be changed in surface area and shape according to the patterned shape of the pre-black matrix layer.

A top surface WBS-U of the window protection layers WBS' and WBS" may have heights different from each other according to the areas. The first base surface BS2 and the top surface WBS-U of the window protection layers WBS' and WBS" within the display area DA may have a first height H1 therebetween, and the first base surface BS2 and the top surface WBS-U of the window protection layers WBS' and WBS" within the non-display area NDA may have a second height H2 greater than the first height H1 therebetween.

When a window protection layer WBS' and WBS" is formed in the slit coating manner, since movement of a slit coater (or a coating unit) is started and ended at the non-display area NDA, a relatively large amount of base material (a light shield material that will constitute the black matrix) may be provided to the non-display area NDA when compared to that of the display area DA. Also, since the bezel portions BM-P2" and BM-P2''' have a height greater than that of the light shield portions BM-P1' and BM-P1", the stepped portion may be reflected to increase a difference in height between the bezel portions BM-P2" and BM-P2''' and the light shield portions BM-P1' and BM-P1". As a result, the window protection layers WBS' and WBS" may have heights different from each other according to the areas through the continuous process.

Figure 18A:
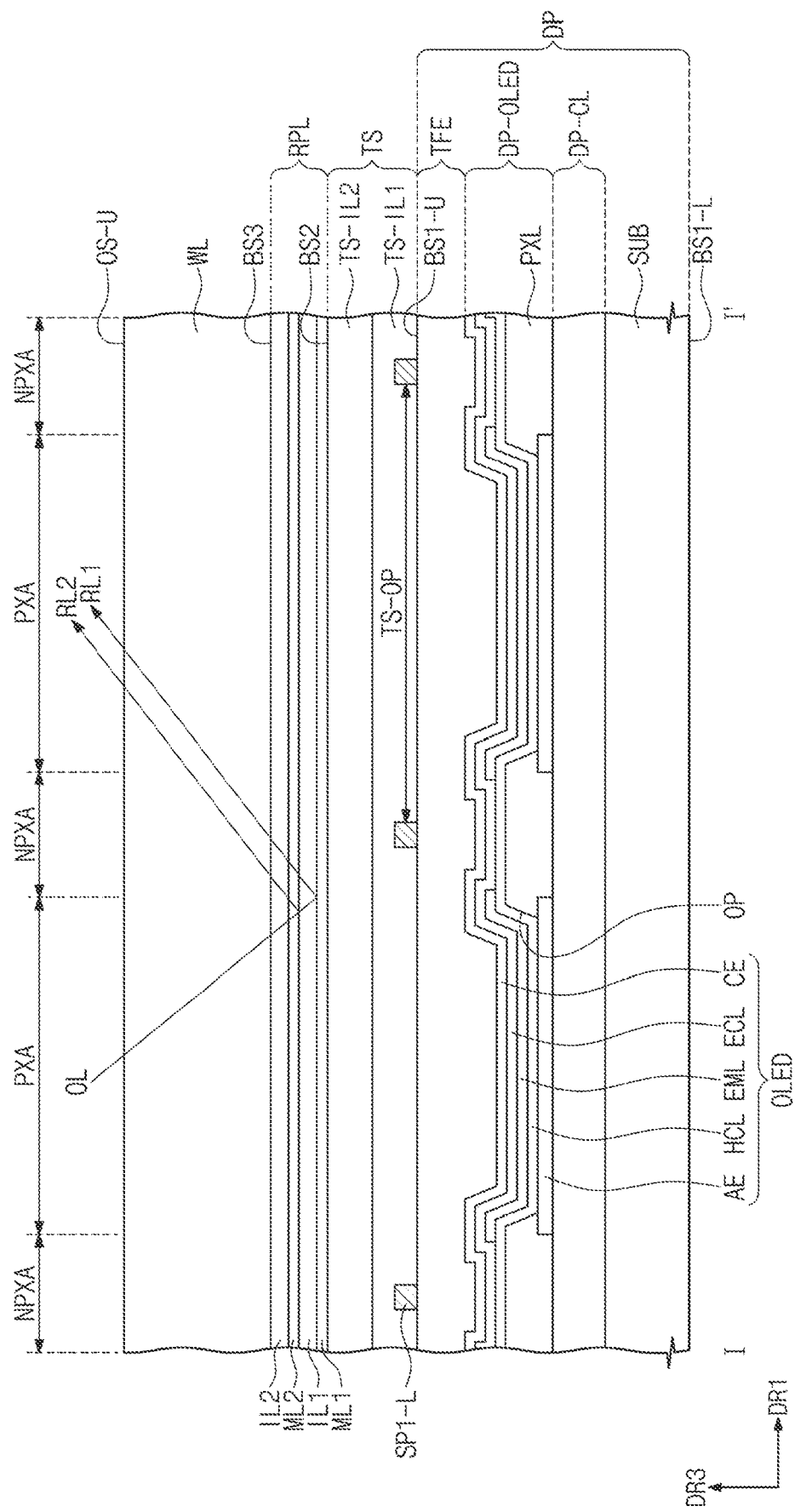
Figure 18B:
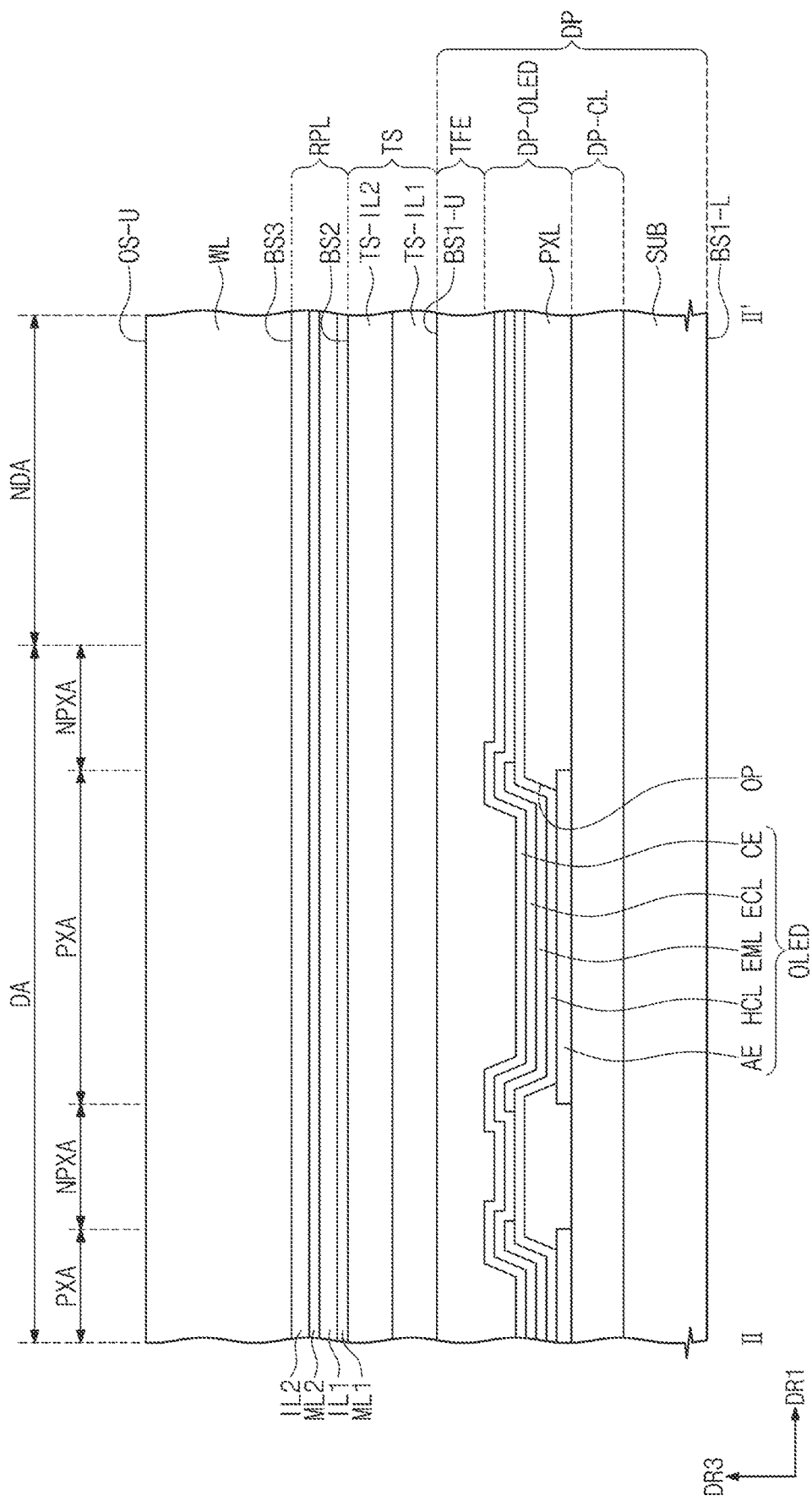
Figure 18D:
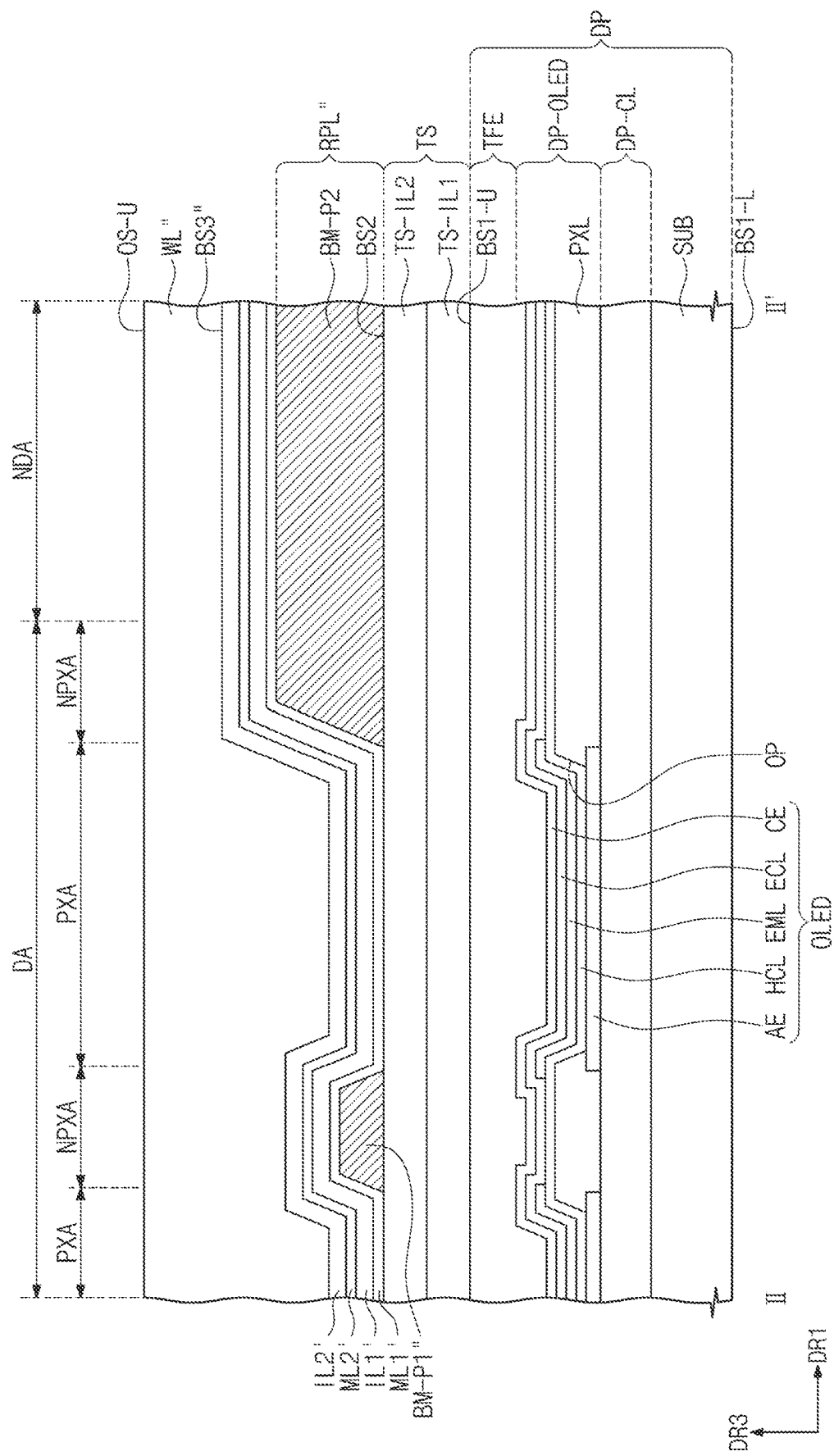

FIGS. 18A to 18D are cross-sectional views of display devices, according to one or more exemplary embodiments. The display devices of FIGS. 18A to 18D are similar to the display devices of FIGS. 1A to 17E, and, as such, duplicative descriptions will be omitted to avoid obscuring exemplary embodiments described herein. In this manner, primarily differences will be described below. It is noted that FIGS. 18A and 18C are cross-sectional views taken along sectional line I-I' of FIG. 12A, and FIGS. 18B and 18D are cross-sectional views taken along sectional line II-II' of FIG. 12A. The display panel layer DP, the touch sensing layer TS, the window layer WL, and the reflection prevention layer RPL of the various constituents of the display devices are illustrated. The window layer WL is schematically illustrated as a single layer for illustrative convenience.

As illustrated in FIGS. 18A and 18B, the reflection prevention layer RPL may include first and second metal-containing layers ML1 and ML2, each of which respectively overlaps the display area DA and the non-display area NDA, and first and second dielectric layers IL1 and IL2, each of which respectively overlaps the display area DA and the non-display area NDA. The reflection prevention layer RPL including first and second metal-containing layers ML1 and ML2 and first and second dielectric layers IL1 and IL2 are illustrated as merely an example. It is contemplated that any suitable number of metal-containing layers and any suitable number of dielectric layers may be utilized in association with exemplary embodiments described herein.

According to one or more exemplary embodiments, the first and second metal-containing layers ML1 and ML2 and the first and second dielectric layers IL1 and IL2 are alternately stacked with respect to each other. Exemplary embodiments, however, are not limited to the illustrated stacking order. The first metal-containing layer ML1 may include a metal having an absorption rate of about 30% or more. The first metal-containing layer ML1 may be formed of a material having a refractive index of about 1.5 to about 7, and an absorption coefficient k of about 1.5 to about 7. The first metal-containing layer ML1 may be formed of at least one of chrome (Cr), molybdenum (Mo), tungsten (W), titanium (Ti), nickel (Ni), cobalt (Co), copper oxide (CuO), nitrided titanium (TiNx), and nickel sulfide (NiS). The first metal-containing layer ML1 may be a metal layer formed of one or more of the aforementioned materials, as may the second metal-containing layer ML2.

In one or more exemplary embodiments, each of the first dielectric layer IL1 and the second dielectric layer IL2 may be formed of one selected from the group consisting of silicon dioxide ($SiO_2$), titanium dioxide ($TiO_2$), lithium fluoride (LiF), calcium fluoride ($CaF_2$), magnesium fluoride ($MaF_2$), silicon nitride ($SiN_x$), tantalum oxide ($Ta_2O_5$), niobium oxide ($Nb_2O_5$), silicon carbon nitride (SiCN), molybdenum oxide (MoOx), iron oxide ($FeO_x$), and chromium oxide ($CrO_x$). Light OL incident from the outside is partially reflected by the first metal-containing layer ML1 (hereinafter, referred to as first reflected light RL1) and the second metal-containing layer ML2 (hereinafter, referred to as second reflected light RL2).

The first dielectric layer IL1 may adjust a phase of light passing through the first dielectric layer IL1 so that the first reflected layer RL1 and the second reflected light RL2 have a phase difference of about 180° therebetween. In this manner, the first reflected light RL1 and the second reflected light RL2 may be destructively combined. As such, the first metal-containing layer ML1, the second metal-containing layer ML2, the first dielectric layer IL1, and the second dielectric layer IL2 may be selected in thickness and material to satisfy conditions for destructive interference between the first reflected light RL1 and the second reflected light RL2. Exemplary embodiments, however, are not limited thereto or thereby.

As illustrated in FIGS. 18C and 18D, the reflection prevention layer RPL" may further include a black matrix BM. Although the black matrix BM having the same shape as each of the black matrixes BM-P1" and BM-P2''' described with reference to FIG. 17E is illustrated, exemplary embodiments are not limited to shape, thickness, and/or stacked structure of each of the black matrixes BM-P1" and BM-P2'''. It is noted, however, that the shape and configuration of the first and second metal layers ML1' and ML2' and the shape and configuration of the first and second dielectric layer IL1' and IL2' may be configured based on the configuration of the black matrixes BM-P1" and BM-P2'''.

FIGS. 19A to 19G are cross-sectional views of display devices, according to one or more exemplary embodiments. The display devices of FIGS. 19A to 19G are similar to the display devices of FIGS. 1A to 18D, and, as such, duplicative descriptions will be omitted to avoid obscuring exemplary embodiments described herein. In this manner, primarily differences will be described below. It is noted that FIGS. 19A to 19G are cross-sectional views taken along sectional line I-I' of FIG. 12A. The display panel layer DP, the touch sensing layer TS-R, and the window layer WL of the various constituents of the display devices are illustrated. For illustrative convenience, the window layer WL is schematically illustrated as a single layer.

According to one or more exemplary embodiments, the display devices illustrated in FIGS. 19A to 19G may be examples of the display device of FIG. 4C. The touch sensing layer TS-R may detect an external input and reduce the reflection of the external light. As described below, these features are achieved, at least in part, by the touch sensing layer TS-R including the color filters CF. The color filters CF may be replaced with an optical film for preventing external light from being reflected, e.g., a polarizing film and a λ/4 wavelength film.

Figure 19A:
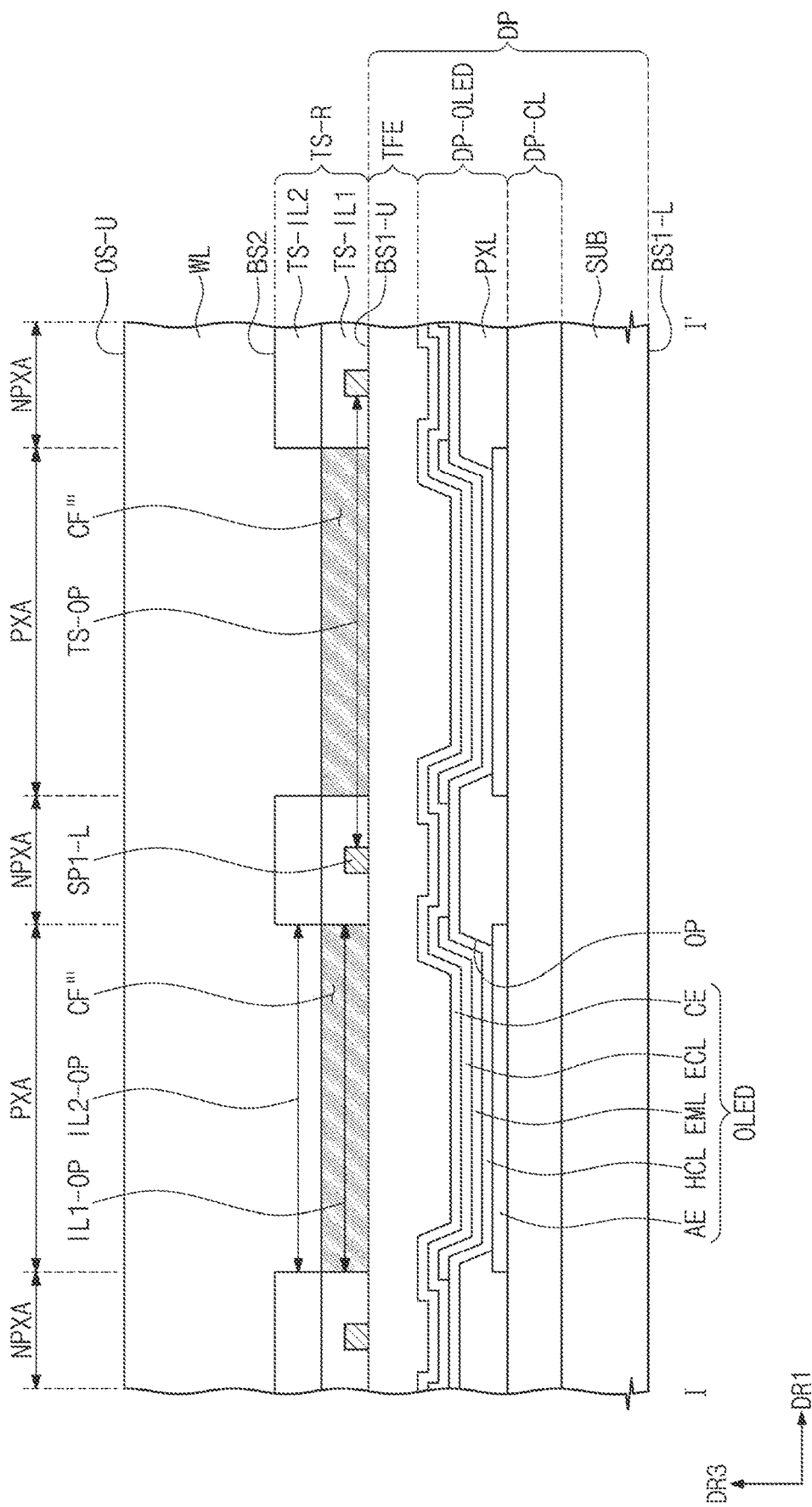
FIGS. 19A, 19B, 19C, 19D, 19E, and 19F are cross-sectional views of display devices, according to one or more exemplary embodiments.

As illustrated in FIG. 19A, the first touch insulation layer TS-IL1 is disposed on the second display panel surface BS1-U. A plurality of first insulation openings IL1-OP corresponding to the plurality of light emitting areas PXA are defined in the first touch insulation layer TS-IL1, respectively. The color filters CF''' may be disposed in the plurality of first insulation openings IL1-OP. Colors of the color filters CF''' may be differently selected for the first insulation openings IL1-OP in consideration of colors of light emitted from the organic light emitting devices OLED. For example, red color filters may be disposed to overlap the organic light emitting devices OLED that emit red light, green color filters may be disposed to overlap the organic light emitting devices OLED that emit green light, and blue color filters may be disposed to overlap the organic light emitting devices OLED that emit blue light. It is noted, however, that any suitable color for a color filter may be utilized in association with exemplary embodiments described herein.

The color filters CF''' may transmit light emitted from the organic light emitting devices OLED and reduce a reflective index of external light. Also, the external light may pass through the color filters CF''', and, as such, be reduced in intensity by about ⅓. A portion of the light passing through the color filters CF''' may be dissipated, and a portion of the light may be reflected by the organic light emitting device layer DP-OLED and the thin film encapsulation layer TFE. The reflected light may be incident to the color filters CF'''. The reflected light is reduced in intensity (e.g., brightness) while passing through the color filters CF'''. As a result, only a portion of the external light may be reflected from the display device.

In one or more exemplary embodiments, the first touch insulation layer TS-IL1 and the color filters CF''' may be provided as one layer. Further, in one or more exemplary embodiments, the first touch insulation layer TS-IL1 may correspond to the black matrix BM that is described with reference to FIGS. 16B and 16C.

The second touch insulation layer TS-IL2 is disposed on the first touch insulation layer TS-IL1 A plurality of second insulation openings IL2-OP corresponding to the plurality of light emitting areas PXA are defined in the second touch insulation layer TS-IL2. The second touch insulation layer TS-IL2 and the color filters CF''' may provide a first base surface BS2 having a stepped shape.

According to one or more exemplary embodiments, the first touch insulation layer TS-IL1 and the second touch insulation layer TS-IL2 may be successively stacked, and, then, the first insulation openings IL1-OP and the second insulation openings IL2-OP, which correspond to each other, may be formed at the same time through one process. Once the first insulation openings IL1-OP and the second insulation openings IL2-OP are formed, the color filters CF''' may be formed. The color filters CF''' may be formed using a printing manner, such as an inkjet printing or a photolithographic manner.

Although a cross-section of the display device taken along sectional line II-II of FIG. 12A is not illustrated, the display device may be the same as that of FIG. 12C or further include the black matrix BM disposed on the non-display area NDA. Further, although a cross-section taken along sectional line III-III' of FIG. 13A is not illustrated, the display device may be the same as that of FIG. 19A except for a position of the sensing part.

Figure 19B:
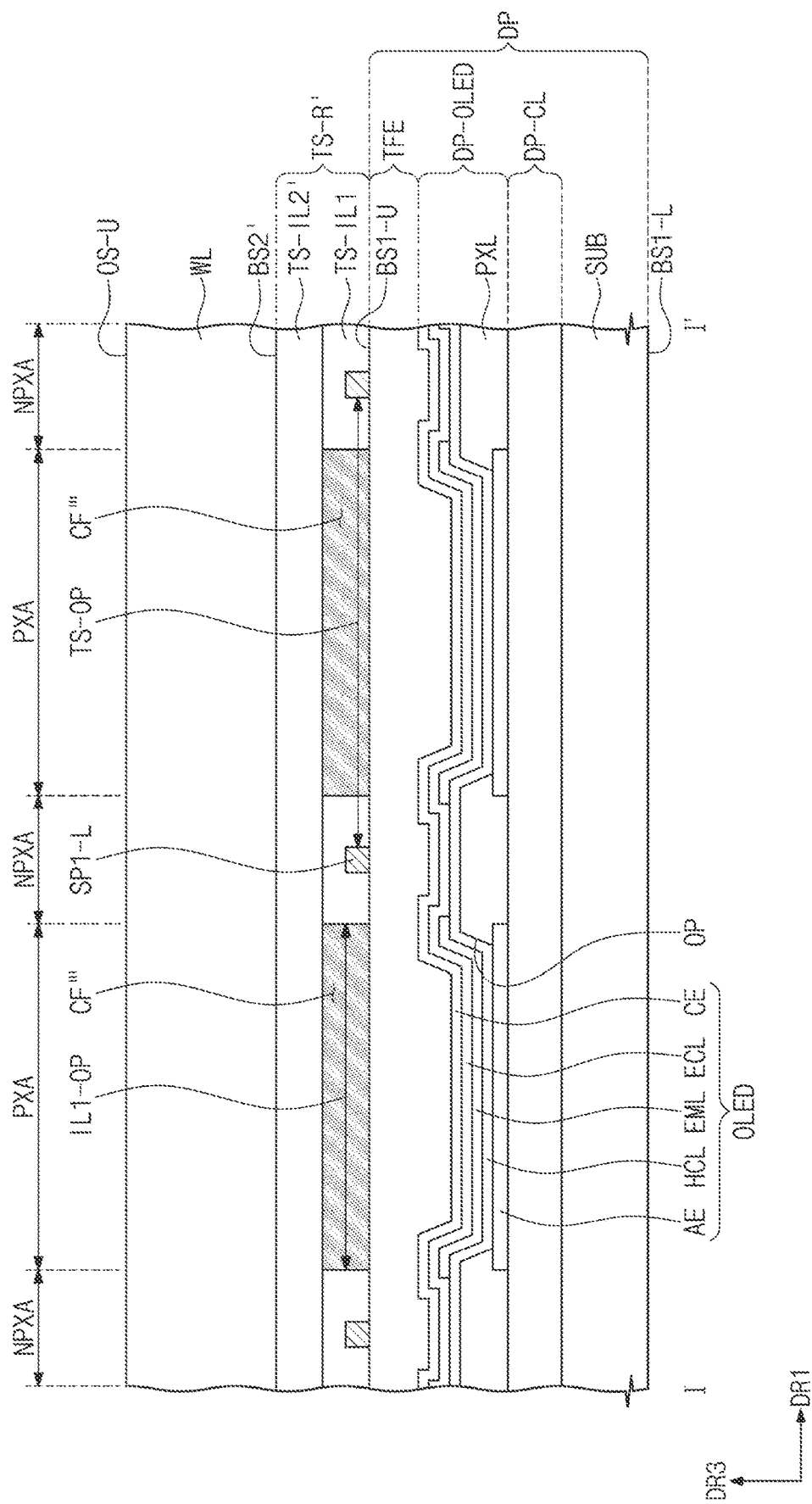

As illustrated in FIG. 19B, the second touch insulation layer TS-IL2' is disposed on the first touch insulation layer TS-IL1 Unlike in FIG. 19A, the plurality of second insulation openings IL2-OP are not provided in the second touch insulation layer TS-IL2'. The second touch insulation layer TS-IL2' provides the first base surface BS2.

Figure 19C:
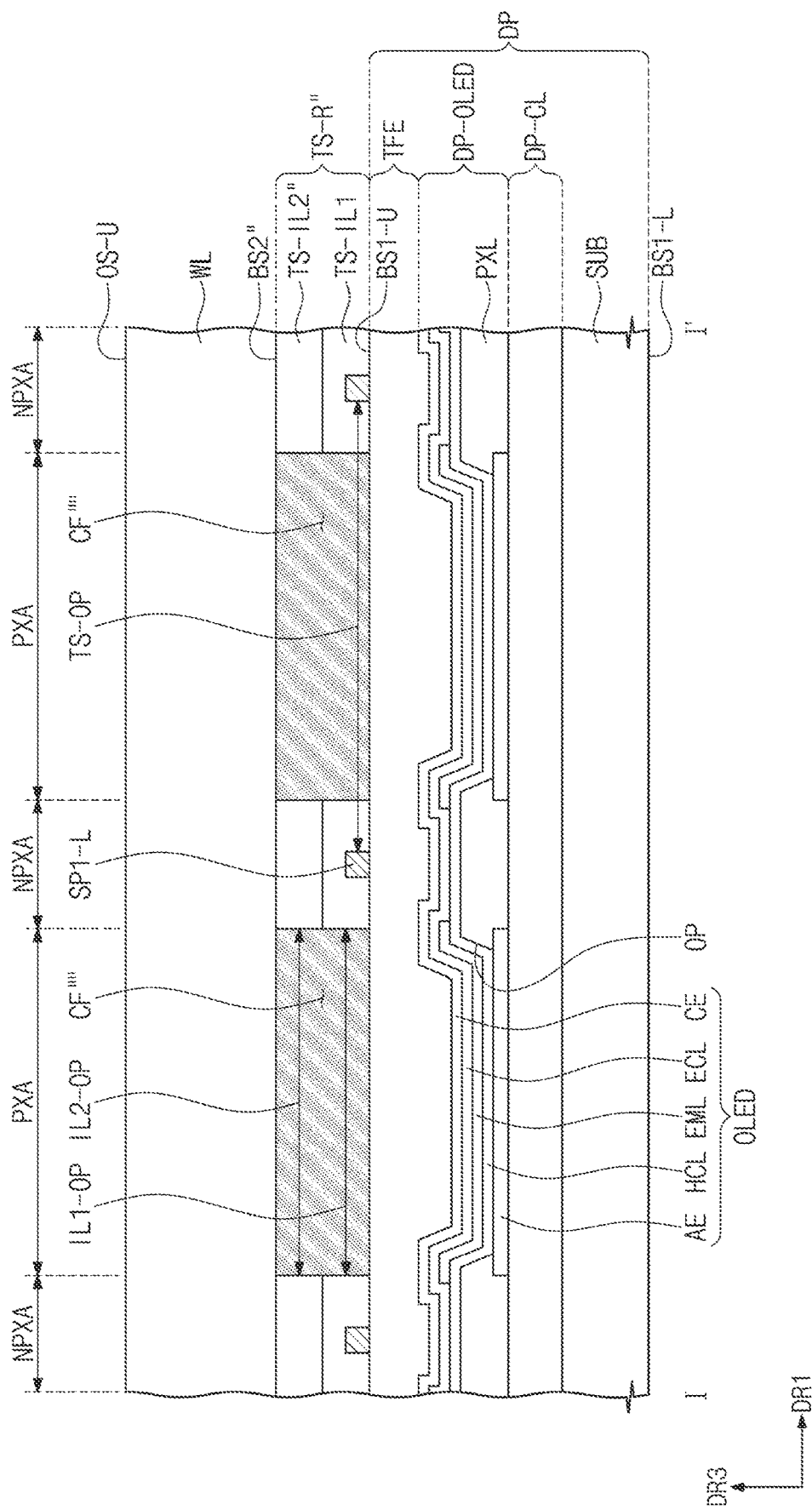

Referring to FIG. 19C, the color filters CF'''' may be disposed at the same time in the first and second insulation openings IL1-OP and IL2-OP. Since the first and second insulation openings IL1-OP and IL2-OP are formed at the same time, the first insulation opening IL1-OP and the second insulation opening IL2-OP may be aligned with each other. The color filters CF'''' may extend from the inside of the first insulation opening IL1-OP to the inside of the second insulation opening IL2-OP. The color filters CF'''' may have a thickness that is substantially the same as the sum of thicknesses of the first touch insulation layer TS-IL1 and the second touch insulation layer TS-IL2" in the third direction DR3. The second touch insulation layer TS-IL2" and the color filters CF'''' may provide a flat first base surface BS2" upon which the window layer WL is disposed.

Figure 19D:
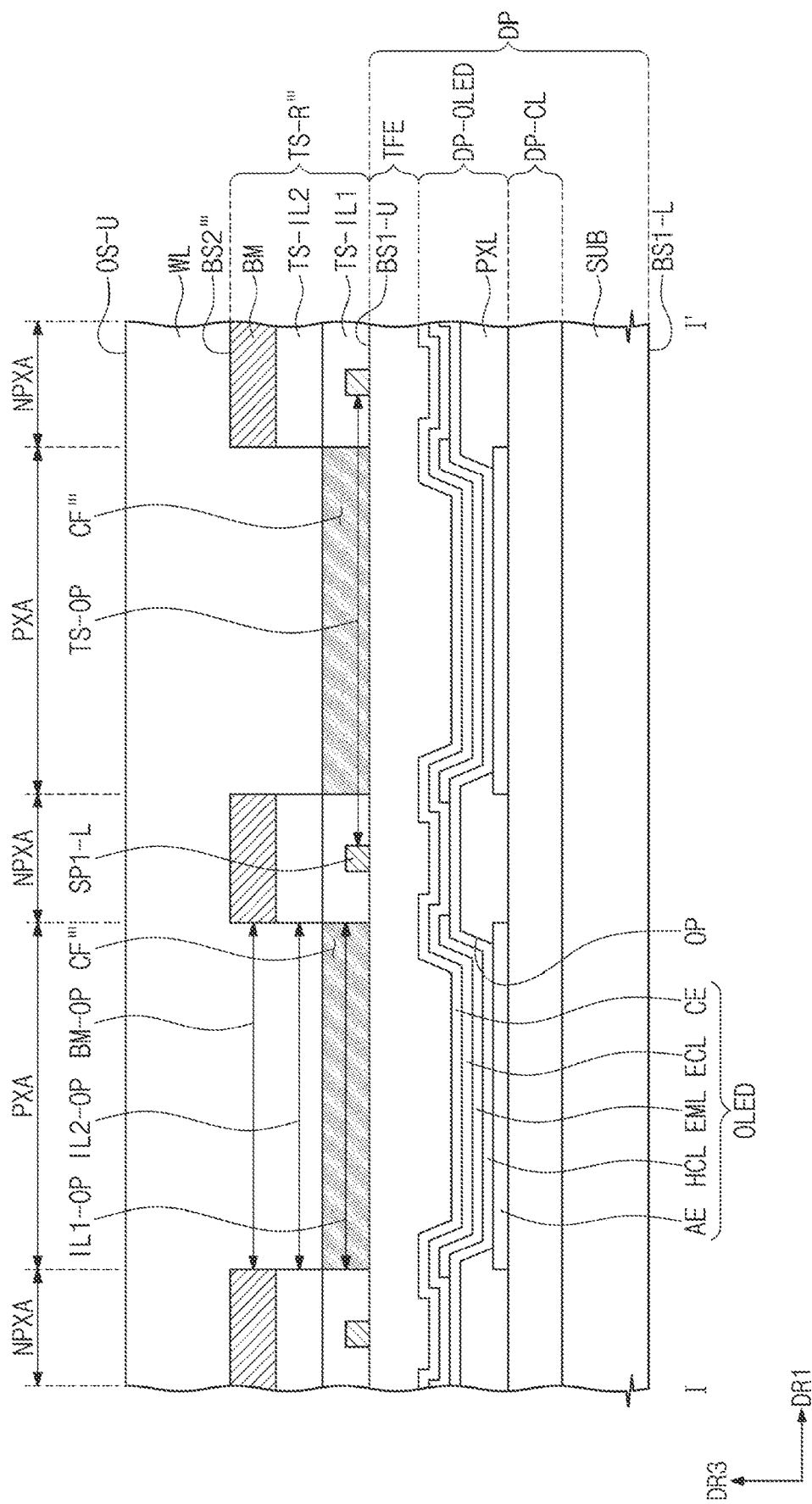

Adverting to FIG. 19D, the black matrix BM may be disposed on the second touch insulation layer TS-IL2. A plurality of transmission openings BM-OP corresponding to the light emitting areas PXA are defined in the black matrix BM. The black matrix BM and the color filters CF''' may provide a first base surface BST''' having a stepped shape. Although not illustrated, the black matrix BM may further cover an inner wall of each of the first and second insulation openings IL1-OP and IL2-OP.

Although not shown, according to one or more exemplary embodiments, at least one of the first and second touch insulation layers TS-IL1 and TS-IL2/TS-IL2'/TS-IL2" of FIGS. 19A and 19C may be replaced with the black matrix BM. The first touch insulation layer TS-IL1 of FIG. 19B may be replaced with the black matrix BM.

Figure 19E:
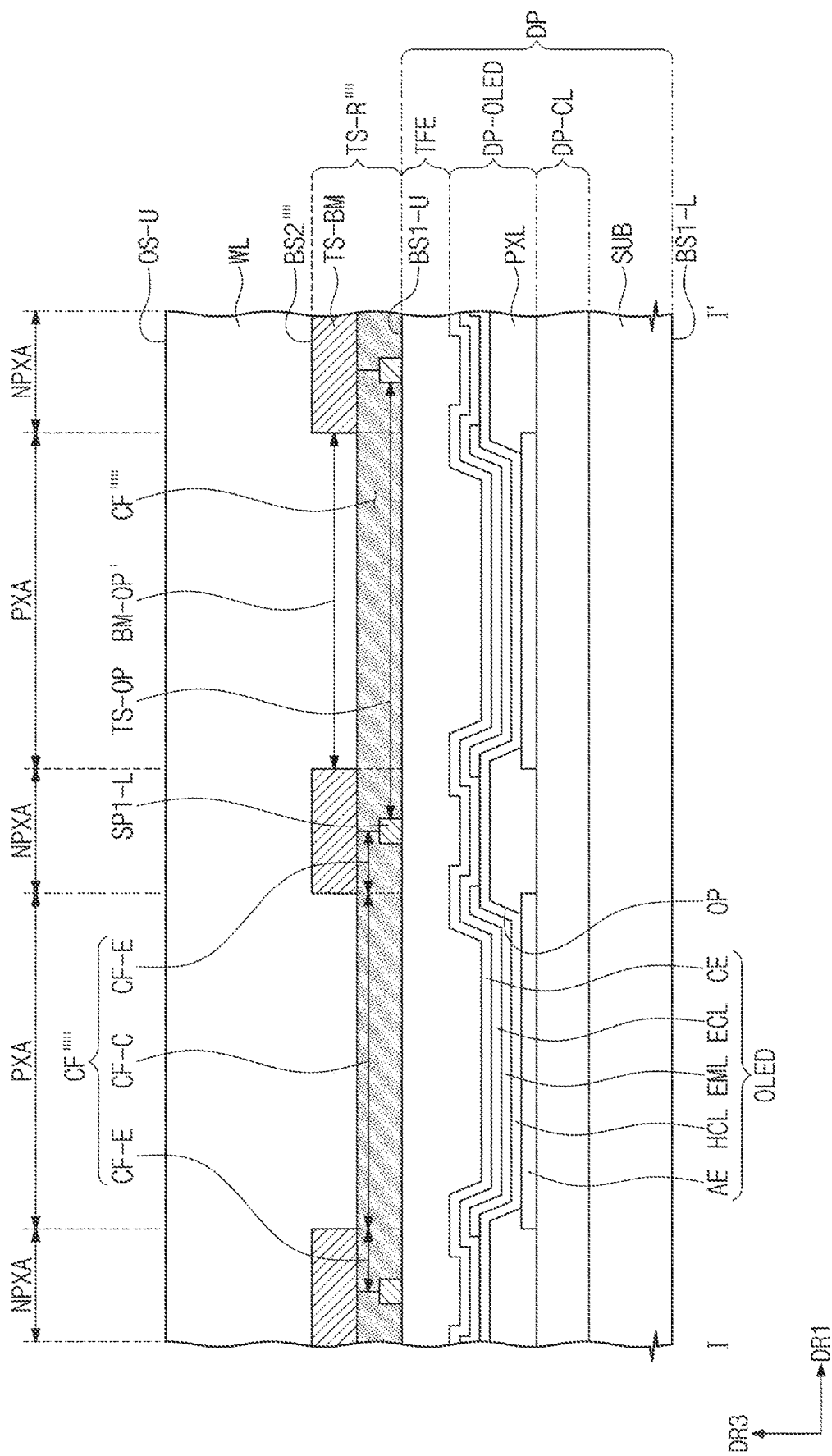

As illustrated in FIG. 19E, the thin film encapsulation layer TFE provides a second display panel surface BS1-U. The color filters CF'''' are disposed on the second display panel surface BS1-U. Each of the color filters CF'''' may include a central portion CF-C and edge portions CF-E. The central portion CF-C overlaps with the corresponding light emitting area of the plurality of light emitting areas PXA. The edge portions CF-E extend from the central portion CF-C and overlap with the non-light emitting areas NPXA. For instance, the edge portion CF-E may overlap with the first conductive pattern, e.g., the first horizontal portion SP1-L of the first sensing part SP1. Although not separately shown, the color filters CF'''' may also overlap the first connection part CP1. When each of the color filters CF'''' is disposed on a plane, the edge portion CF-E may surround the central portion CF-C.

According to one or more exemplary embodiments, the edge portion CF-E of each of the color filters CF'''' adjacent to each other may contact and cover the first horizontal portion SP1-L of the first sensing part SP1. The edge portions CF-E of the color filters CF'''' adjacent to each other may contact each other. The edge portions CF-E of the color filters CF'''' adjacent to each other may partially cover the first horizontal portion SP1-L to completely cover the first conductive pattern.

A black matrix TS-BM is disposed on the color filters CF''''. As illustrated in FIG. 19E, the black matrix TS-BM may be directly disposed on the color filters CF''''. A plurality of transmission openings BM-OP' corresponding to the light emitting areas PXA are defined in the black matrix TS-BM. The black matrix TS-BM and the color filters CF'''' may provide a first base surface BS2''''.

In one or more exemplary embodiments, the black matrix TS-BM may be disposed to correspond to the non-light emitting areas NPXA. The plurality of light emitting areas PXA and the plurality of transmission openings BM-OP' may have the same shape on the plane. That is, the black matrix TS-BM has substantially the same shape as the non-light emitting areas NPXA (for example, the black matrix TS-BM has the same width as the non-light emitting area NPXA in the first and second directions DR1 and DR2). It is contemplated, however, that exemplary embodiments are not limited thereto or thereby. For example, the plurality of light emitting areas PXA and the plurality of transmission openings BM-OP' may have shapes different from each other.

Figure 19F:
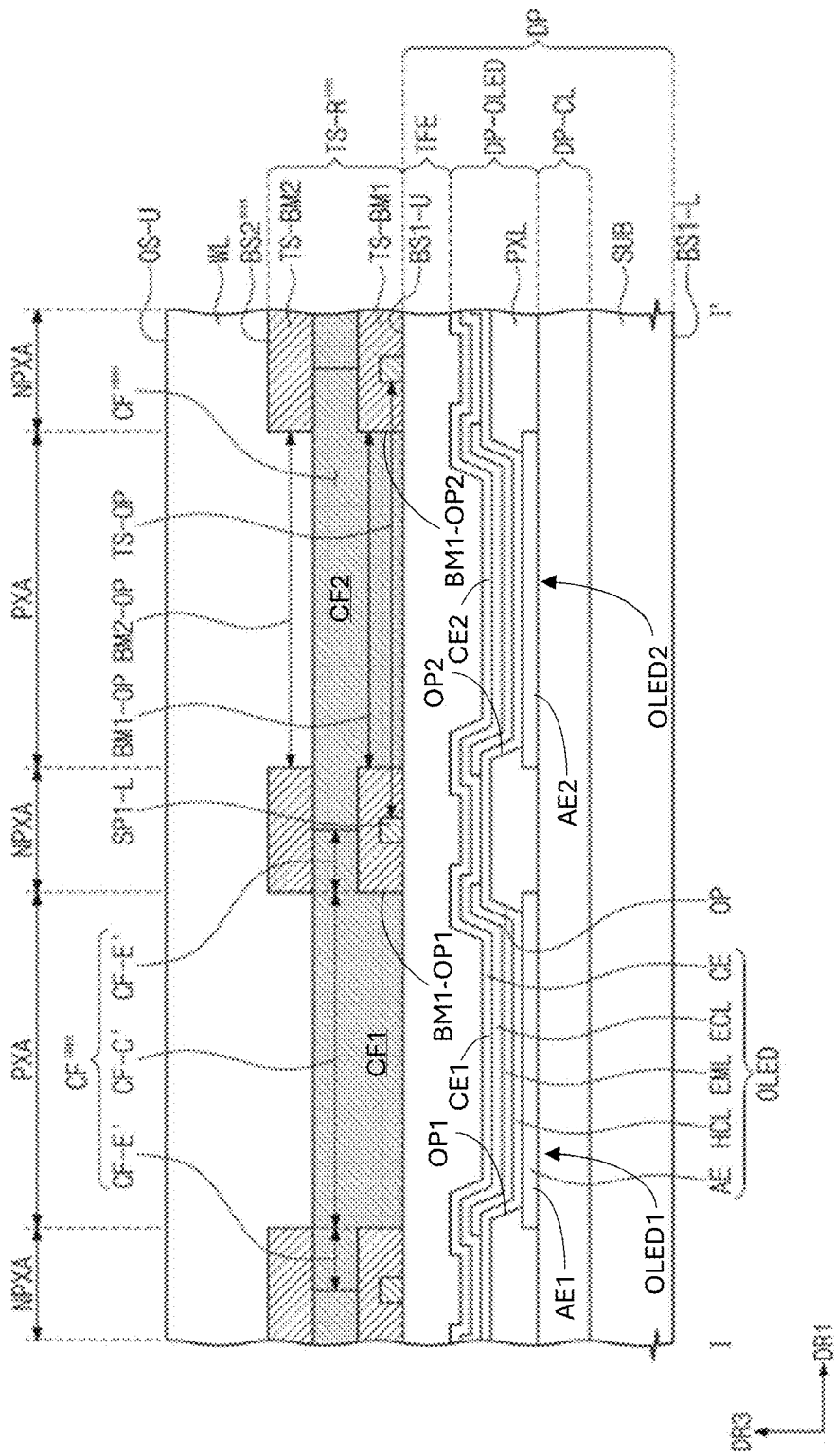

Referring to FIG. 19F, the touch sensing layer TS-R'''' includes a first black matrix TS-BM1 and a second black matrix TS-BM2. The first black matrix TS-BM1 is disposed on the second display panel surface BS1-U to cover the first conductive pattern, e.g., the first horizontal portion SP1-L of the first sensing part SP1. A plurality of first transmission openings BM1-OP corresponding to the light emitting areas PXA are defined in the first black matrix TS-BM1. The edge portions CF-E' of the color filters CF''' adjacent to each other may contact and cover the first black matrix TS-BM1. The color filters CF'''' adjacent to each other may completely cover the first black matrix TS-BM1.

The second black matrix TS-BM2 is disposed on the color filters CF''''. A plurality of second transmission openings BM2-OP corresponding to the light emitting areas PXA are defined in the second black matrix TS-BM2. The second black matrix TS-BM2 and the color filters CF'''' may provide a first base surface BS2''''. Referring to FIG. 19F as a non-limiting example, a display device may include a base layer SUB, a first organic light emitting element OLED1 on the base layer SUB, a second organic light emitting element OLED2 on the base layer SUB, a first black matrix TS-BM1 on the first and second organic light emitting elements OLED1, OLED2 and having a first transmission opening BM1-OP1 corresponding to the first organic light emitting element OLED1 and a second transmission opening BM1-OP2 corresponding to the second organic light emitting element OLED2, a first color filter CF1 on the first organic light emitting element OLED1 and in the first transmission opening BM1-OP1, a second color filter CF2 on the second organic light emitting element OLED2 and in the second transmission opening BM1-OP2, and a second black matrix TS-BM2 on the first and second color filters CF1, CF2 and overlapping with the first black matrix TS-BM1. Each of the first and second organic light emitting elements OLED1, OLED2 may comprise a first electrode AE1, AE2, an organic light emitting layer EML on the first electrode AE1, AE2, and a second electrode CE1, CE2 on the organic light emitting layer EML. The display device may further include a pixel defining layer PXL having a first opening OP1 exposing the first electrode AE2 of the first organic light emitting element OLED1 and a second opening OP2 exposing the first electrode AE1 of the second organic light emitting element OLED2.

Figure 20A:
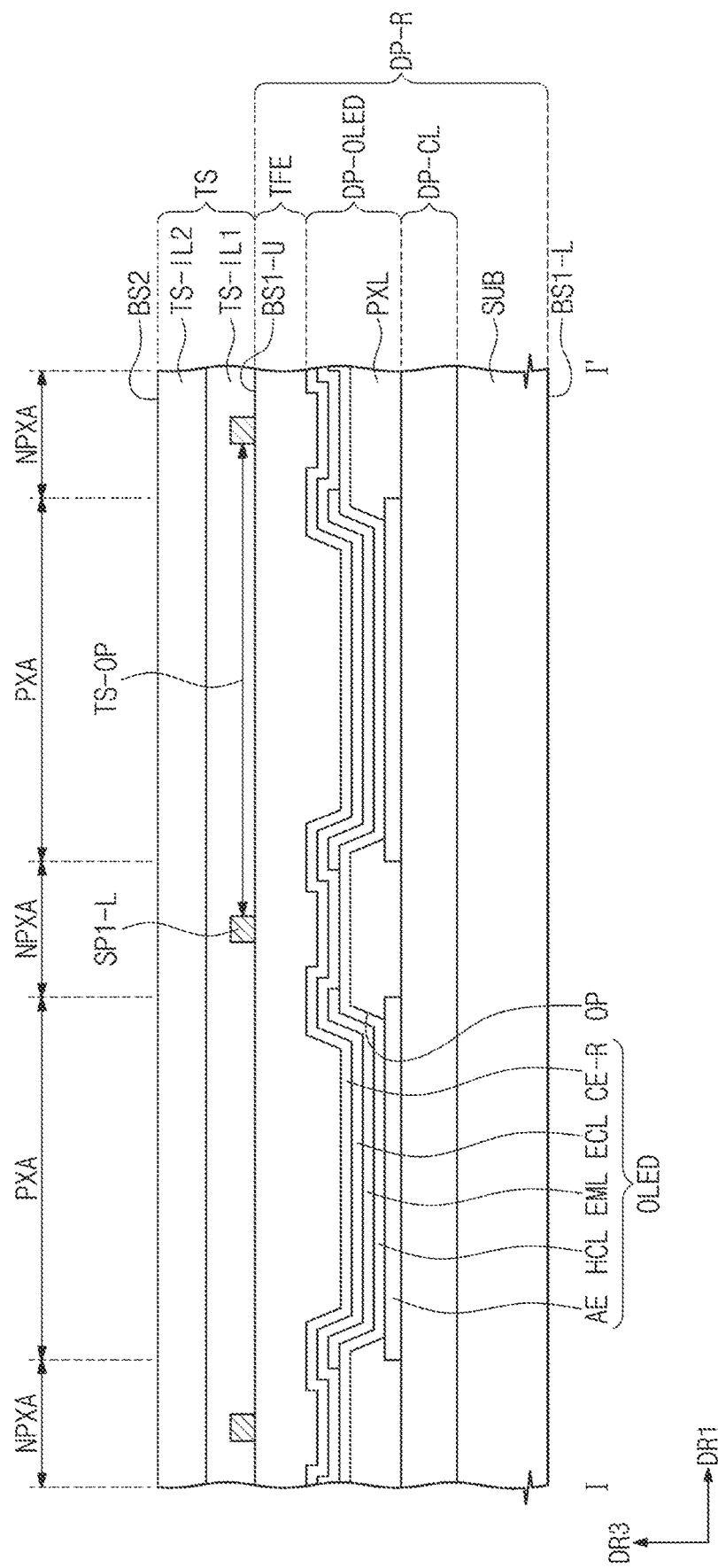
FIGS. 20A and 20B are cross-sectional views of a display device, according to one or more exemplary embodiments.
Figure 20B:
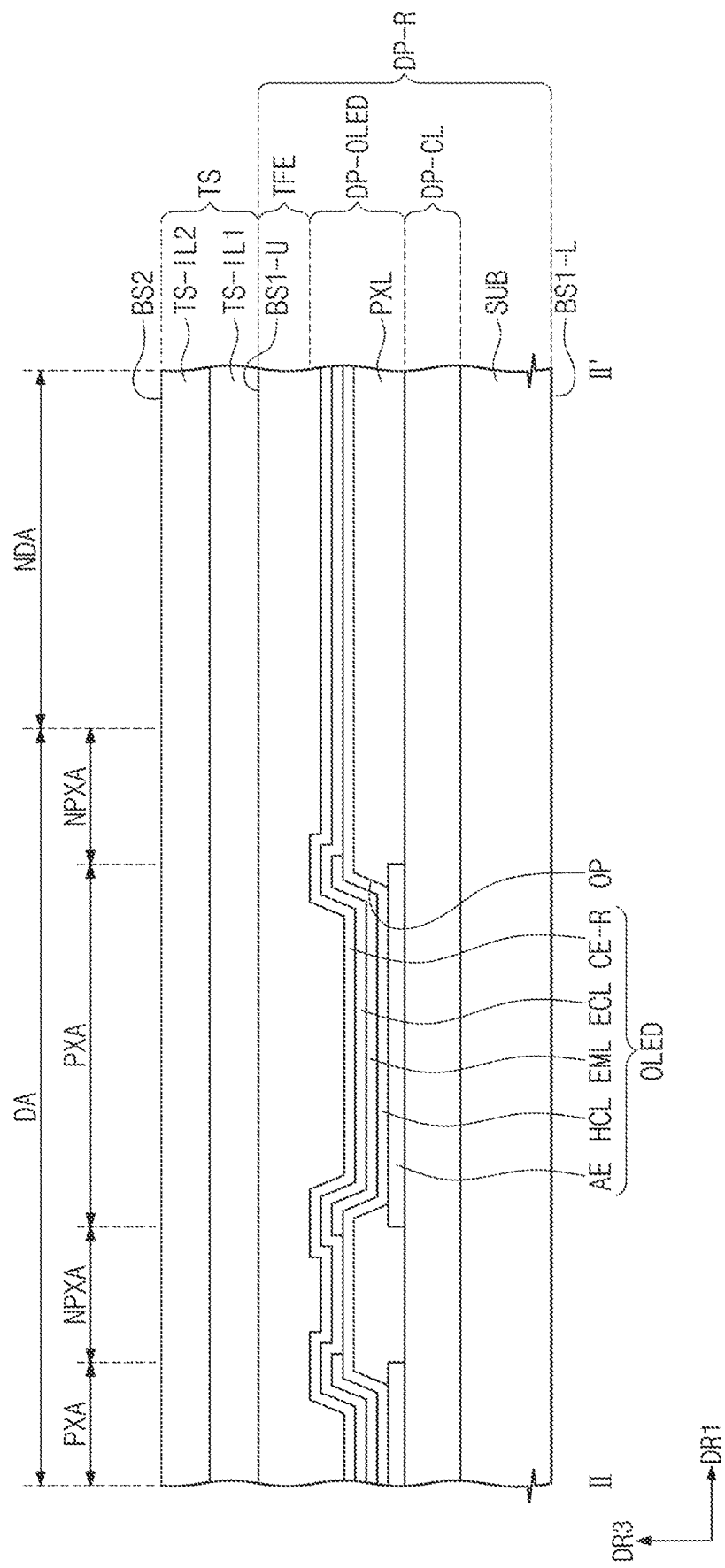
Figure 21A:
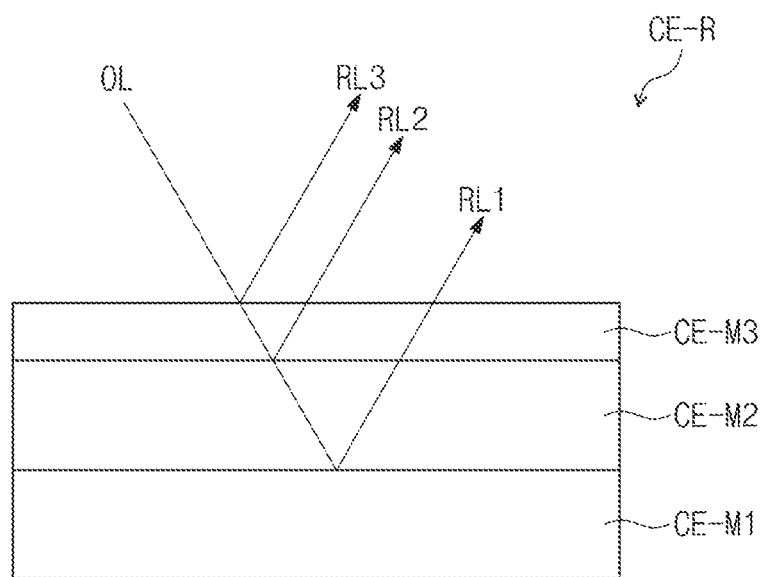
FIGS. 21A and 21B are cross-sectional views of cathodes of organic light emitting diodes of display devices, according to one or more exemplary embodiments.
Figure 21B:
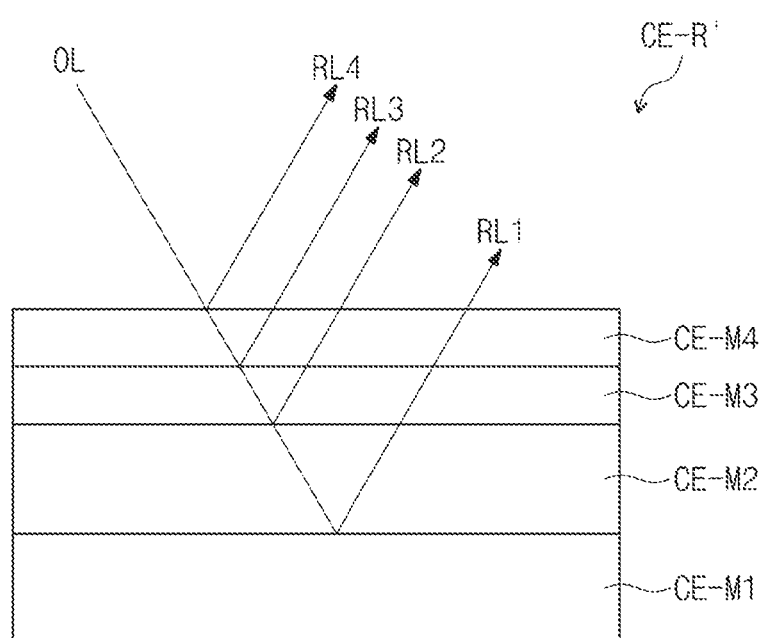

FIGS. 20A and 20B are cross-sectional views of a display device respectively taken along sectional lines I-I' and II-II' of FIG. 12A, according to one or more exemplary embodiments. FIGS. 21A and 21B are cross-sectional views of cathodes of organic light emitting diodes of display devices, according to one or more exemplary embodiments. The display devices of FIGS. 20A, 20B, 21A, and 21B are similar to the display devices of FIGS. 1A to 19F, and, as such, duplicative descriptions will be omitted to avoid obscuring exemplary embodiments described herein. In this manner, primarily differences will be described below.

It is noted that the display panel layer DP-R and the touch sensing layer TS of the various constituents of the display device are illustrated. Further, the display devices illustrated in FIGS. 20A, 20B, 21A, and 21B may be examples of the display device of FIG. 4D. The display panel layer DP-R may generate an image and reduce reflection of external light. As described below, these features are achieved, at least in part, by a cathode CE-R of the display panel layer DP-R that has a function of a reflection prevention layer. The touch sensing layer TS of FIGS. 20A and 20B may be substantially the same as the touch sensing layer TS of FIGS. 12B and 12C. Although not shown, the first touch insulation layer TS-IL1 and the second touch insulation layer TS-IL2 may be formed as described with reference to FIGS. 19A to 19F.

As illustrated in FIG. 21A, the cathode CE-R may include a first metal layer CE-M1, a transparent conductive layer CE-M2 disposed on the first metal layer CE-M1, and a second metal layer CE-M3 disposed on the transparent conductive layer CE-M2. The cathode CE-R having the aforementioned structure may receive a power voltage and reduce reflectance of external light.

According to one or more exemplary embodiments, light OL incident from the outside is reflected by the first metal layer CE-M1, the transparent conductive layer CE-M2, and the second metal layer CE-M3. The light reflected by the first metal layer CE-M1, the transparent conductive layer CE-M2, and the second metal layer CE-M3 may be defined as a first reflected light RL1, a second reflected light RL2, and a third reflected light RL3, respectively. In one or more exemplary embodiments, the second reflected light RL2 and the third reflected light RL3 may destructively interfere with each other to reduce the reflectance of the external light OL. If the mixed light of the second reflected light RL2 and the third reflected light RL3 has the same intensity as that of the first reflected light RL1 and a phase opposite to the first reflected light RL1 (e.g., a phase difference of about 180 degrees), destructive interference may occur.

The first metal layer CE-M1 may be formed of one selected form the group consisting of aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdenum (Mo), tungsten (W), platinum (Pt), ytterbium (Yb), barium (Ba), and an alloy thereof. Since each of the metals has relatively low resistance, the metals may be adequate for the first metal layer CE-M1 so as to efficiently transmit the power voltage. Also, since each of the metals is relatively easy to deposit and relatively low reactivity with oxygen and moisture, the metals may be adequate for the first metal layer CE-M1. The first metal layer CE-M1 may have a thickness of about 50 nm to about 500 nm.

The transparent conductive layer CE-M2 may be formed of one selected from the group consisting of indium tin oxide (ITO), aluminum zinc oxide (AZO), indium gallium oxide (IGO), gallium indium zinc oxide (GIZO), indium zinc oxide (IZO), zinc oxide (ZnO), and a mixture thereof. The transparent conductive layer CE-M2 may be formed of at least one of a metal and a dielectric material. The transparent conductive layer CE-M2 generates a phase difference between the first reflected light RL1 and the rest of the reflected light. The transparent conductive layer CE-M2 may have a thickness that is selected so that destructive interference occurs. Exemplary embodiments, however, are not limited thereto or thereby.

In one or more exemplary embodiments, destructive interference between the third reflected light RL3 and the first reflected light RL1 occurs. To generate the destructive interference, the third reflected light RL3 and the first reflected light RL1 may have phases opposite to each other and the same size (or intensity) as each other. To generate effective destructive interference, the third reflected light RL3 and the first reflected light RL1 may have sizes that are similar to each other.

The second metal layer CE-M3 may be a metal having relatively high light absorption. A metal having relatively high light absorption absorbs light that is not completely dissipated due to the destructive interference. The light absorption of the metal is proportional to a multiplication of a refractive index and an absorption coefficient. In this manner, if a metal has a large value of the multiplication of a refractive index and an absorption coefficient, the metal may be suitable for the material of the second metal layer CE-M3.

According to one or more exemplary embodiments, the second metal layer CE-M3 may be formed of chromium (Cr), titanium (Ti), magnesium (Mg), molybdenum (Mo), cobalt (Co), nickel (Ni), tungsten (W), aluminum (Al), silver (Ag), gold (Au), copper (Cu), iron (Fe), calcium (Ca), platinum (Pt), ytterbium (Yb), or an alloy thereof. The second metal layer CE-M3 may have a thickness of about 1 nm to about 25 nm.

Adverting to FIG. 21B, the cathode CE-R' may further include a third metal layer CE-M4 disposed on the second metal layer CE-M3. Also, the cathode CE-R' may be designed so that fourth reflected light RL4 that is reflected from the third metal layer CE-M4 destructively interferes with the first reflected light RL1.

According to one or more exemplary embodiments, the third metal layer CE-M4 may have a work function so that electric charges (electrons) are easily injected. When the third metal layer CE-M4 constitutes the uppermost layer of the cathode CE-R', the third metal layer CE-M4 may have a relatively low reactivity with oxygen and moisture. The third metal layer CE-M4 may be formed of a metal having a work function of about 4.6 eV or less or an alloy thereof. Alternatively, the third metal layer CE-M4 may be formed of a metal having a work function of about 3.7 eV or less or an ally thereof. The third metal layer CE-M4 may be formed of one selected from the group consisting of ytterbium (Yb), calcium (Ca), aluminum (Al), silver (Ag), chromium (Cr), titanium (Ti), magnesium (Mg), lithium (Li), cesium (Cs), barium (Ba), potassium (K), and an alloy thereof. The third metal layer CE-M4 may have a thickness of about 1 nm to about 15 nm.

Although the first metal layer CE-M1, the transparent conductive layer CE-M2, the second metal layer CE-M3, and the third metal layer CE-M4 constitute the cathode CE-R', exemplary embodiments are not limited thereto or thereby. For example, the cathode CE-R' may be provided in the display panel layer DP to perform only the reflection prevention function, unlike the cathode CE.

According to one or more exemplary embodiments, the touch detection member, the reflection prevention member, the window member, and the protection member may be integrated with the display panel as the touch sensing layer, the reflection prevention layer, the window layer, and the external protection layer. Since the touch sensing layer, the reflection prevention layer, the window layer, and the external protection layer are formed through a continuous process, one or more adhesion members, such as one or more OCA layers, or one or more adhesion layers, such as one or more OCR layers may be omitted. Since the adhesive member(s) are omitted, the display device may be reduced in thickness, which may also improve the flexibility and aesthetic appeal of the display device.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a base layer;
a first organic light emitting element on the base layer;
a second organic light emitting element on the base layer;
a first black matrix on the first and second organic light emitting elements and having a first transmission opening corresponding to the first organic light emitting element and a second transmission opening corresponding to the second organic light emitting element;
a first color filter on the first organic light emitting element and in the first transmission opening;
a second color filter on the second organic light emitting element and in the second transmission opening; and
a second black matrix on the first and second first color filters and overlapping with the first black matrix,
wherein:
a portion of the first color filter is disposed on the first black matrix;
a portion of the second color filter is disposed on the first black matrix;
a first portion of the second black matrix is disposed on the portion of the first color filter and a second portion of the second black matrix is disposed on the portion of the second color filter;
the portion of the first color filter is disposed between the first black matrix and the first portion of the second black matrix; and
the portion of the second color filter is disposed between the first black matrix and the second portion of the second black matrix.

2. The display device of claim 1, further comprising a pixel defining layer, wherein:
each of the first and second organic light emitting elements comprises a first electrode, an organic light emitting layer on the first electrode, and a second electrode on the organic light emitting layer; and
the pixel defining layer has a first opening exposing the first electrode of the first organic light emitting element and a second opening exposing the first electrode of the second organic light emitting element.

3. The display device of claim 2, wherein:
the first opening overlaps with the first transmission opening; and
the first opening is disposed inside the first transmission opening on a plane.

4. The display device of claim 1, further comprising a thin film encapsulation layer encapsulating the first and second organic light emitting elements.

5. The display device of claim 4, wherein the first black matrix contacts the thin film encapsulation layer.

6. The display device of claim 4, further comprising a plurality of conductive patterns overlapping with the first black matrix and disposed on the thin film encapsulation layer.

7. The display device of claim 6, wherein the plurality of conductive patterns contacts the first black matrix or the second black matrix.

8. The display device of claim 1, wherein the first color filter has a thickness greater than a thickness of the first black matrix.

9. The display device of claim 1, wherein a boundary between the first color filter and the second color filter overlaps the first black matrix.

10. The display device of claim 1, further comprising a protection layer including an organic material.

11. The display device of claim 1, wherein each of the first and second color filters contacts the first black matrix.

12. The display device of claim 11, wherein the second black matrix contacts each of the first and second color filters.

13. An electronic device, comprising:
a display device, wherein the display device comprises:
a base layer;
a first organic light emitting element on the base layer;
a second organic light emitting element on the base layer;
a first black matrix on the first and second organic light emitting elements and having a first transmission opening corresponding to the first organic light emitting element and a second transmission opening corresponding to the second organic light emitting element;
a first color filter on the first organic light emitting element and in the first transmission opening;
a second color filter on the second organic light emitting element and in the second transmission opening; and
a second black matrix on the first and second color filters and overlapping with the first black matrix,
wherein:
a portion of the first color filter is disposed on the first black matrix;
a portion of the second color filter is disposed on the first black matrix;
a first portion of the second black matrix is disposed on the portion of the first color filter and a second portion of the second black matrix is disposed on the portion of the second color filter;
the portion of the first color filter is disposed between the first black matrix and the first portion of the second black matrix; and
the portion of the second color filter is disposed between the first black matrix and the second portion of the second black matrix.

14. The electronic device of claim 13, wherein the display device further comprises:
each of the first and second organic light emitting elements comprises a first electrode, an organic light emitting layer on the first electrode, and a second electrode on the organic light emitting layer; and
the pixel defining layer has a first opening exposing the first electrode of the first organic light emitting element and a second opening exposing the first electrode of the second organic light emitting element.

15. The electronic device of claim 14, wherein:
the first opening overlaps with the first transmission opening; and
the first opening is disposed inside the first transmission opening on a plane.

16. The electronic device of claim 13, wherein the display device further comprises a thin film encapsulation layer encapsulating the first and second organic light emitting elements.

17. The electronic device of claim 16, wherein the first black matrix contacts the thin film encapsulation layer.

18. The electronic device of claim 16, wherein the display device further comprises a plurality of conductive patterns overlapping with the first black matrix and disposed on the thin film encapsulation layer.

19. The electronic device of claim 18, wherein the plurality of conductive patterns contacts the first black matrix or the second black matrix.

20. The electronic device of claim 13, wherein the first color filter has a thickness greater than a thickness of the first black matrix.

21. The electronic device of claim 13, wherein a boundary between the first color filter and the second color filter overlaps the first black matrix.

22. The electronic device of claim 13, wherein the display device further comprises a protection layer including an organic material.

23. The electronic device of claim 13, wherein each of the first and second color filters contacts the first black matrix.

24. The electronic device of claim 23, wherein the second black matrix contacts each of the first and second color filters.

25. The electronic device of claim 13, wherein the electronic device is one of a television, a monitor, a mobile phone, a tablet, a notebook, a personal computer, a navigation unit for vehicle, a game console, and a smart watch.

* * * * *